United States Patent
Suganuma et al.

(10) Patent No.: US 11,133,470 B2
(45) Date of Patent: Sep. 28, 2021

(54) ORGANIC ELECTROLUMINESCENT DEVICE

(71) Applicant: Samsung Display Co., Ltd., Yongin-si (KR)

(72) Inventors: Naotoshi Suganuma, Yokohama (JP); Hiroaki Itoi, Yokohama (JP); Masatsugu Ueno, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 981 days.

(21) Appl. No.: 15/048,488

(22) Filed: Feb. 19, 2016

(65) Prior Publication Data

US 2016/0365515 A1 Dec. 15, 2016

(30) Foreign Application Priority Data

Jun. 15, 2015 (JP) .............................. JP2015-120441
Jun. 15, 2015 (JP) .............................. JP2015-120442

(51) Int. Cl.
*H01L 51/00* (2006.01)
*H01L 51/50* (2006.01)

(52) U.S. Cl.
CPC ........ *H01L 51/006* (2013.01); *H01L 51/0059* (2013.01); *H01L 51/0061* (2013.01);
(Continued)

(58) Field of Classification Search
CPC ............... H01L 51/006; H01L 51/0059; H01L 51/0073; H01L 51/0072; H01L 51/0061; H01L 51/0081; H01L 51/5064
See application file for complete search history.

(56) References Cited

U.S. PATENT DOCUMENTS

| 2011/0215308 A1* | 9/2011 | Im | H01L 51/006 257/40 |
| 2015/0270506 A1* | 9/2015 | Voges | H01L 51/5072 257/40 |
| 2016/0155943 A1* | 6/2016 | Sasaki | C07D 401/14 257/40 |

FOREIGN PATENT DOCUMENTS

| JP | 2002-241352 A | 8/2002 |
| JP | 2011-187959 A | 9/2011 |

(Continued)

*Primary Examiner* — Alexander C Kollias
(74) *Attorney, Agent, or Firm* — Lewis Roca Rothgerber Christie LLP

(57) ABSTRACT

An organic electroluminescent (EL) device having improved emission efficiency and emission lifetime. An embodiment of the organic EL device of the present disclosure includes a plurality of hole transport layers between an anode and an emission layer. The plurality of the hole transport layers may include an anode-side hole transport layer, a middle hole transport layer, and an emission layer-side hole transport layer. The emission layer-side hole transport layer may include an emission layer-side hole transport material represented by the following Formula 1:

(Continued)

[Formula 1]

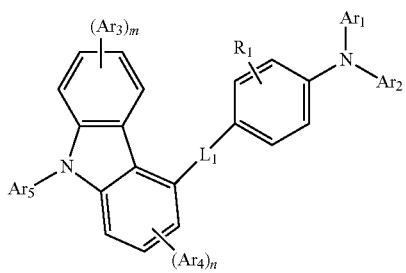

(1)

5 Claims, 1 Drawing Sheet

(52) U.S. Cl.
CPC ...... *H01L 51/0072* (2013.01); *H01L 51/0073* (2013.01); *H01L 51/0081* (2013.01); *H01L 51/5064* (2013.01)

(56) References Cited

FOREIGN PATENT DOCUMENTS

| | | |
|---|---|---|
| JP | 2013-177386 A | 9/2013 |
| JP | 2013-234169 A | 11/2013 |
| KR | 10-2013-0007159 A | 1/2013 |
| KR | 10-2013-0106255 A | 9/2013 |
| WO | WO 2007/105906 A1 | 9/2007 |

\* cited by examiner

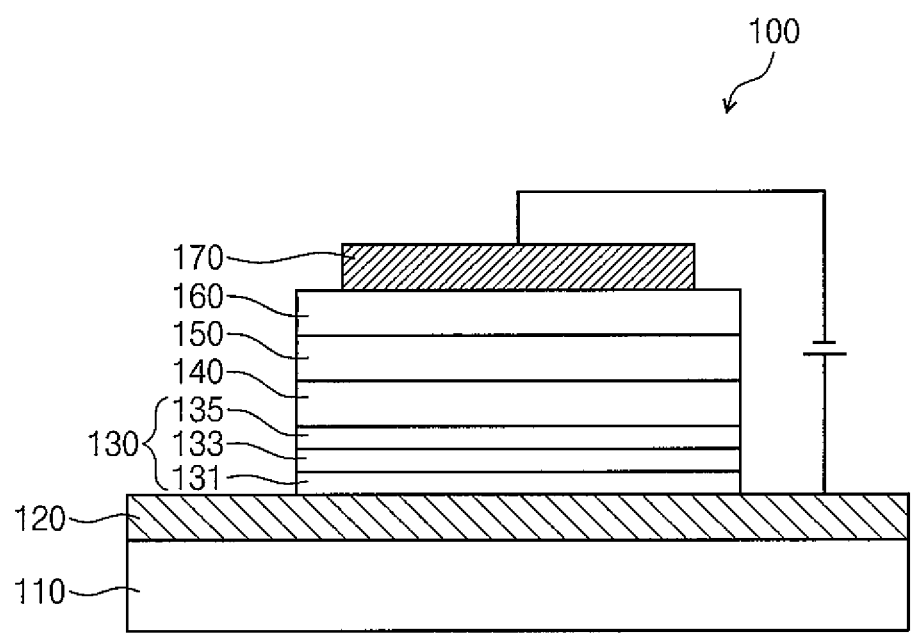

ORGANIC ELECTROLUMINESCENT DEVICE

CROSS-REFERENCE TO RELATED APPLICATIONS

This application claims priority to and the benefit of Japanese Patent Application No. 2015-120441, filed on Jun. 15, 2015, and Japanese Patent Application No. 2015-120442, filed on Jun. 15, 2015, the entire content of each of which is incorporated herein by reference.

BACKGROUND

One or more aspects of embodiments of the present disclosure are related to an organic electroluminescent device.

Recently, research and development on organic electroluminescent displays and self-emitting organic electroluminescent devices used in organic electroluminescent displays is being actively conducted.

An example organic electroluminescent device may have a laminated structure including an anode, a hole transport layer, an emission layer, an electron transport layer, and a cathode (stacked in the stated order).

In an example organic electroluminescent device, holes and electrons are respectively injected from an anode and an cathode, and may recombine in an emission layer to generate excitons. Light is emitted when excitons transition (e.g., radiatively decay) from an excited state to the ground state.

Various organic electroluminescent devices in the related art have included a hole transport material including a carbazolyl group in a hole transport layer, an electron accepting material in a hole transport layer, and/or a hole transport layer formed as a laminated structure of a plurality of layers. However, these organic electroluminescent devices did not achieve satisfactory emission efficiencies and/or emission lifetimes.

The above information disclosed in this Background section is included only to enhance understanding of the background of the present disclosure, and may therefore contain information that does not form the prior art that is already known in this country to a person of ordinary skill in the art.

SUMMARY

One or more aspects of embodiments of the present disclosure are directed toward an organic electroluminescent device having an improved emission efficiency and an improved emission lifetime.

One or more aspects of embodiments of the present disclosure provide an organic electroluminescent device including an anode, an emission layer, an anode-side hole transport layer between the anode and the emission layer and including an anode-side hole transport material and an electron accepting material doped in the anode-side hole transport material, a middle hole transport layer between the anode-side hole transport layer and the emission layer and including a middle hole transport material, and an emission layer-side hole transport layer between the middle hole transport layer and the emission layer and adjacent to the emission layer. The emission layer-side hole transport layer may include an emission layer-side hole transport material represented by the following Formula 1:

[Formula 1]

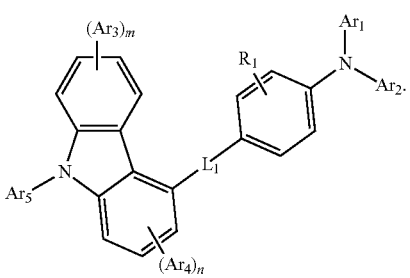

(1)

In Formula 1, $Ar_1$ to $Ar_5$ may each independently be selected from a substituted or unsubstituted aryl group having 6 to 50 carbon atoms for forming a ring and a substituted or unsubstituted heteroaryl group having 5 to 50 carbon atoms for forming a ring, m may be an integer selected from 0 to 4, and n may be an integer selected from 0 to 3.

$R_1$ may be selected from hydrogen, deuterium, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms.

$L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

In one or more embodiments of the present disclosure, an organic electroluminescent device includes an anode, an emission layer, an anode-side hole transport layer between the anode and the emission layer and including an electron accepting material, a middle hole transport layer between the anode-side hole transport layer and the emission layer and including a middle hole transport material, and an emission layer-side hole transport layer between the middle hole transport layer and the emission layer and adjacent to the emission layer. The emission layer-side hole transport layer may include an emission layer-side hole transport material represented by the following Formula 1:

[Formula 1]

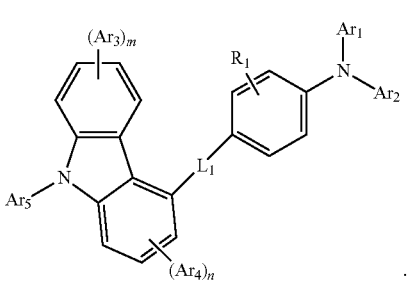

(1)

In Formula 1, $Ar_1$ to $Ar_5$ may each independently be selected from a substituted or unsubstituted aryl group having 6 to 50 carbon atoms for forming a ring and a substituted or unsubstituted heteroaryl group having 5 to 50 carbon atoms for forming a ring, m may be an integer selected from 0 to 4, n may be an integer selected from 0 to 3, $R_1$ may be selected from hydrogen, deuterium, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms, and $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

In one embodiment, at least one selected from the middle hole transport material and the anode-side hole transport material may be a compound represented by the following Formula 2:

[Formula 2]

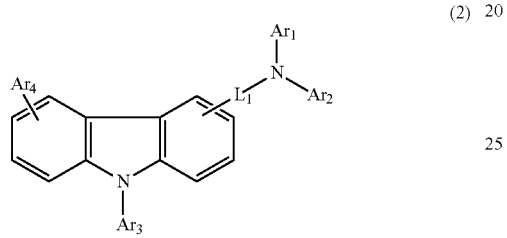

(2)

In Formula 2, $Ar_1$ to $Ar_3$ may each independently be selected from a substituted or unsubstituted aryl group having 6 to 50 carbon atoms for forming a ring and a substituted or unsubstituted heteroaryl group having 5 to 50 carbon atoms for forming a ring, $Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms, and $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

In one embodiment, an electron accepting material may have a lowest unoccupied molecular orbital (LUMO) energy level at about −9.0 eV to about −4.0 eV.

In one embodiment, the anode-side hole transport layer may be adjacent to the anode.

In one embodiment, the electron accepting material may be at least one selected from the following Compounds 4-1 to 4-14:

(4-1)

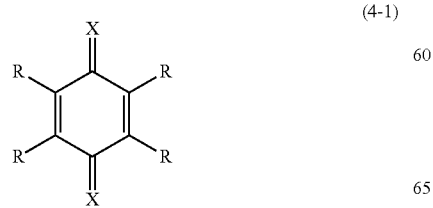

(4-2)

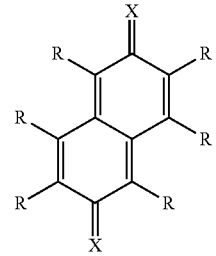

(4-3)

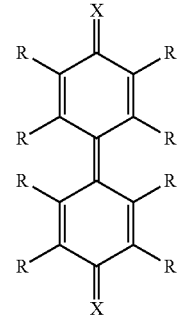

(4-4)

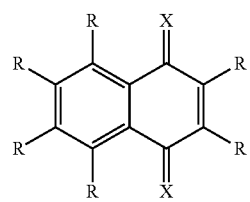

(4-5)

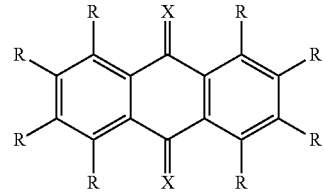

(4-6)

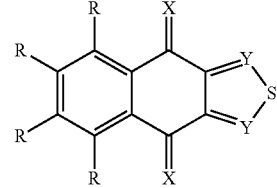

(4-7)

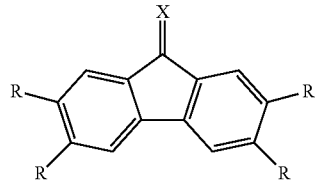

(4-8)

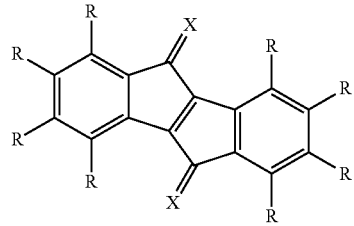

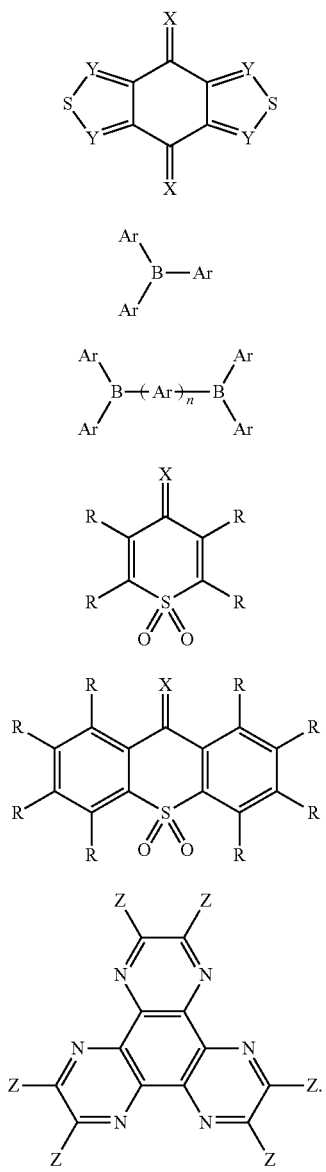
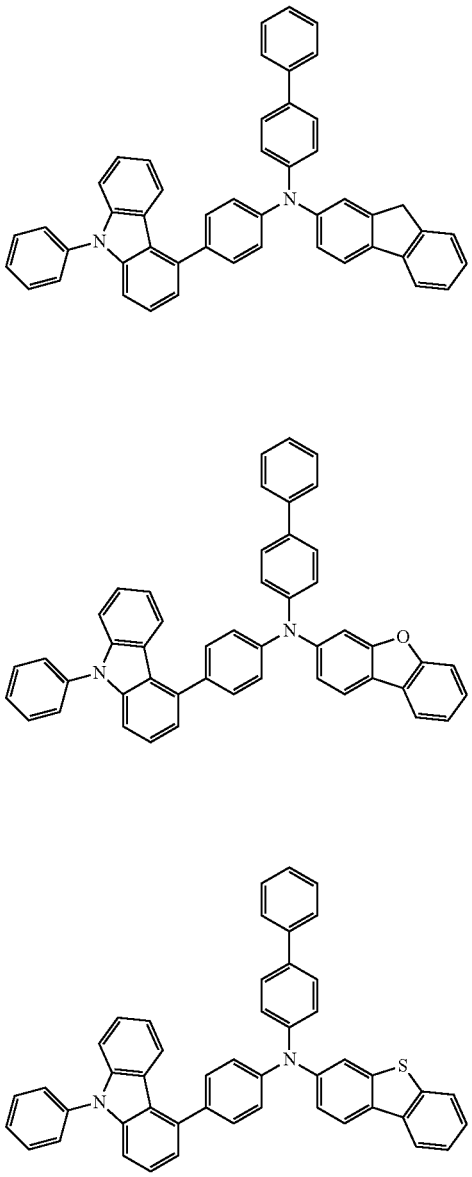
In one embodiment, the emission layer-side hole transport material may be at least one selected from the following Compounds 1-1 to 1-28:
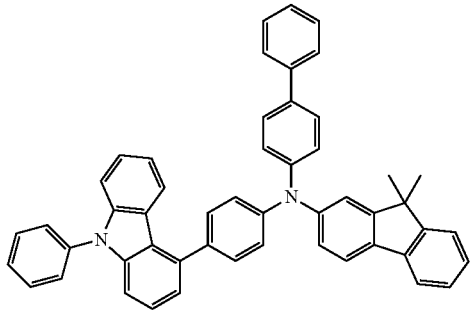
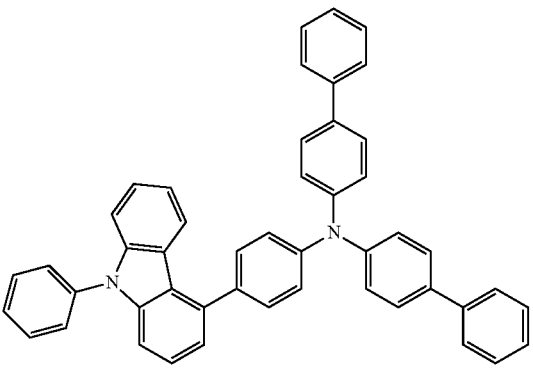

1-6
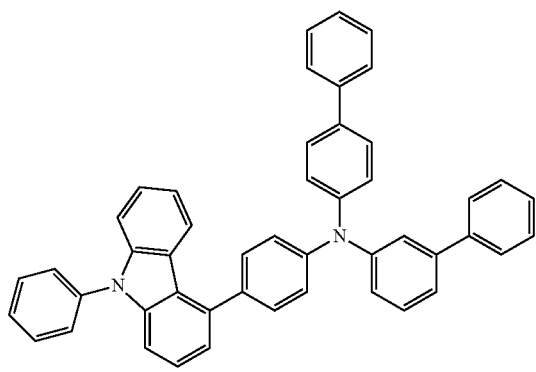
1-7
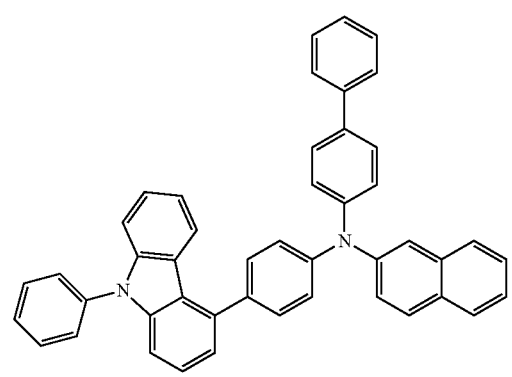
1-8
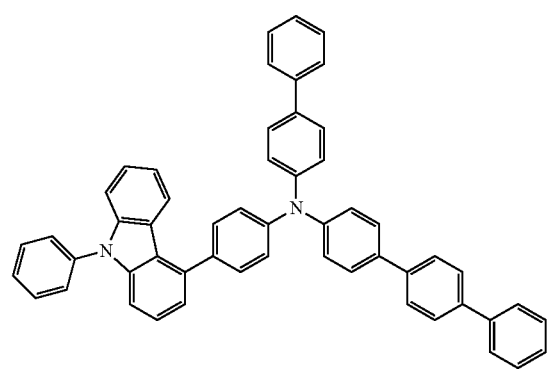
1-9
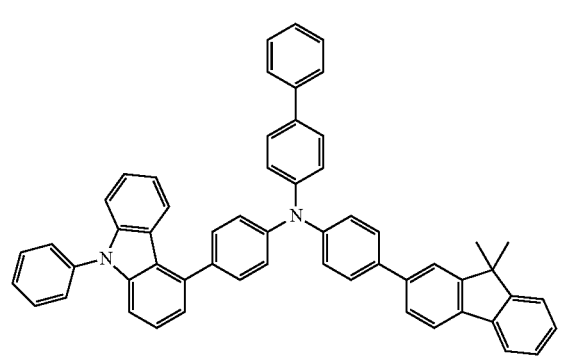
1-10
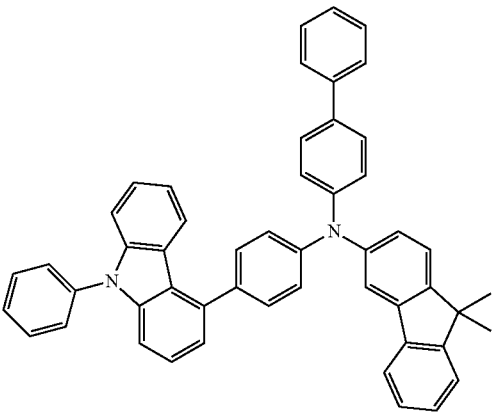
1-11
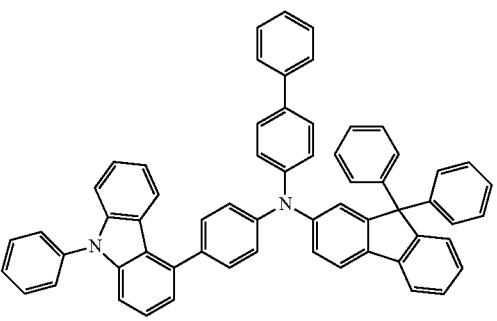
1-12
1-13
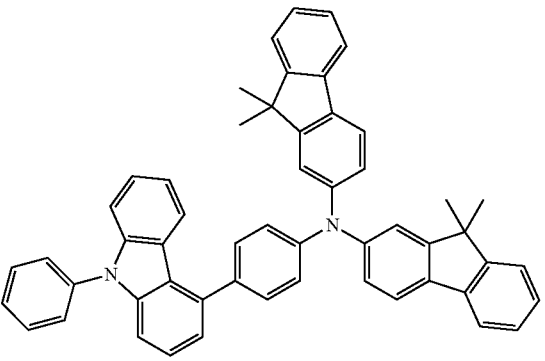

1-14
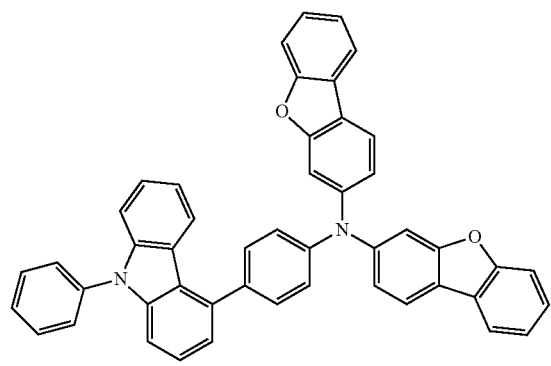
1-15
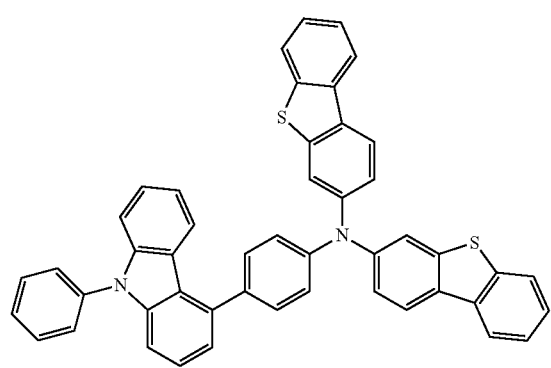
1-16
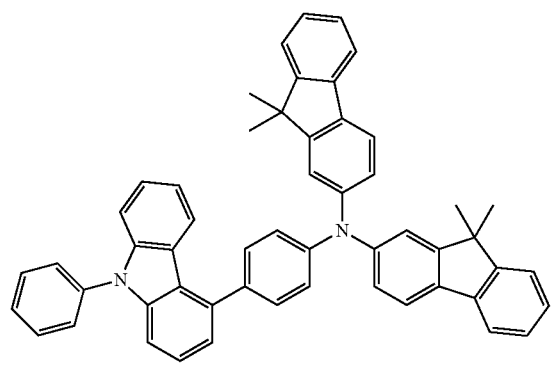
1-17
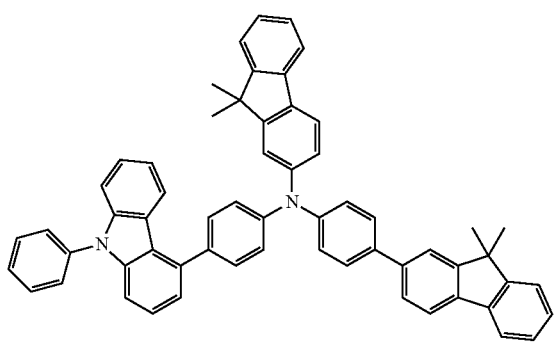
1-18
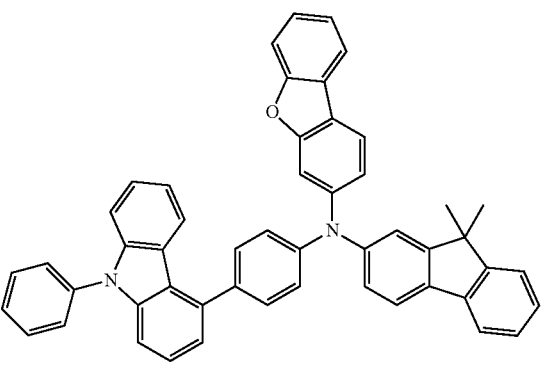
1-19
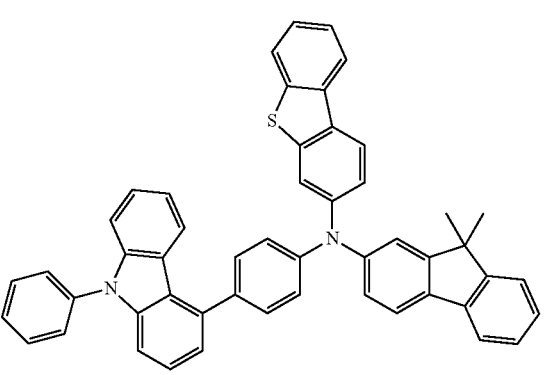
1-20
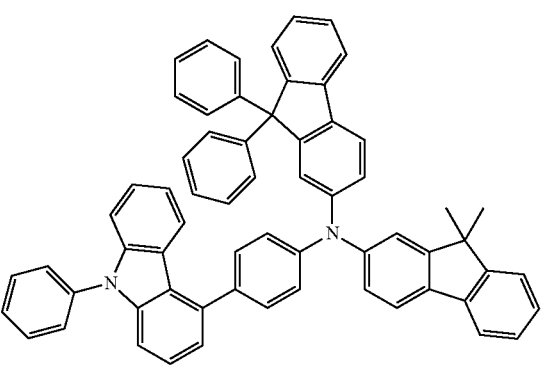
1-21
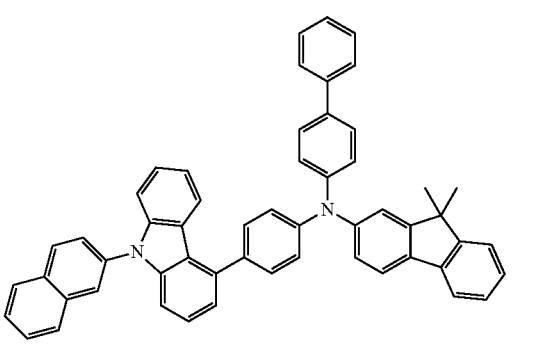

1-22
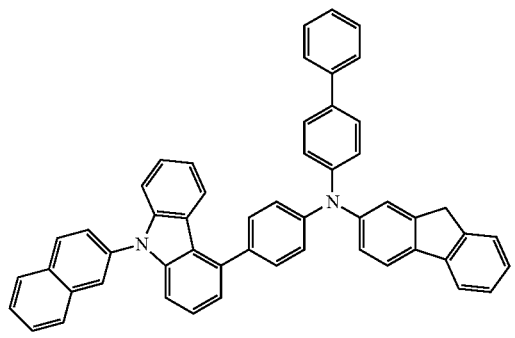
1-23
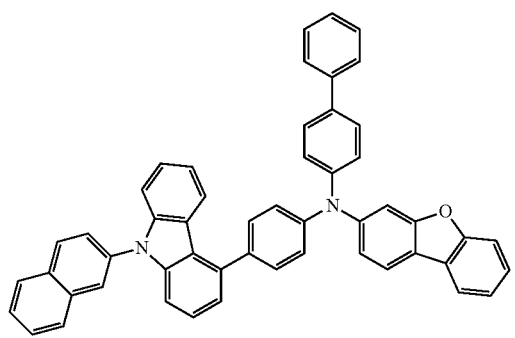
1-24
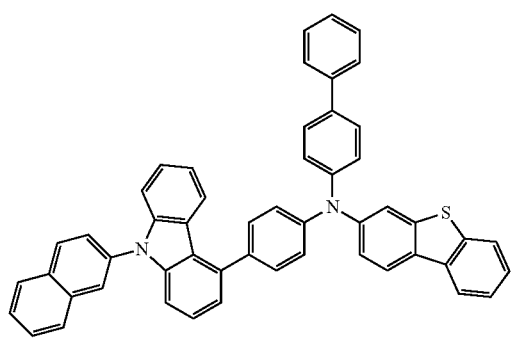
1-25
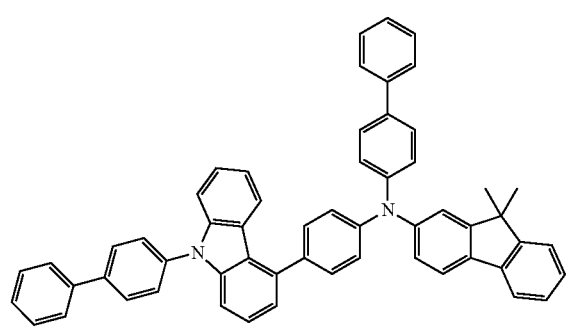
1-26
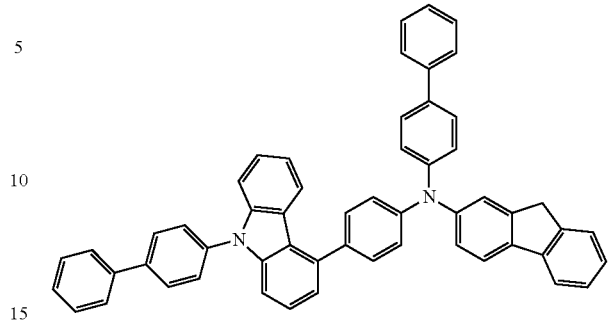
1-27
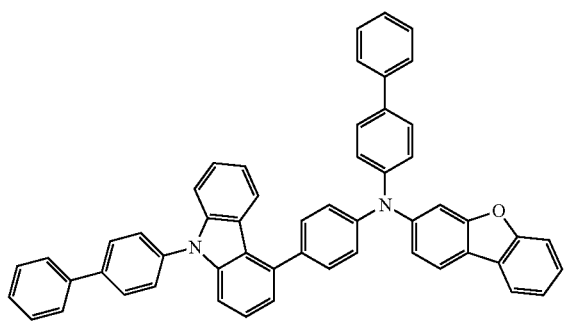
1-28
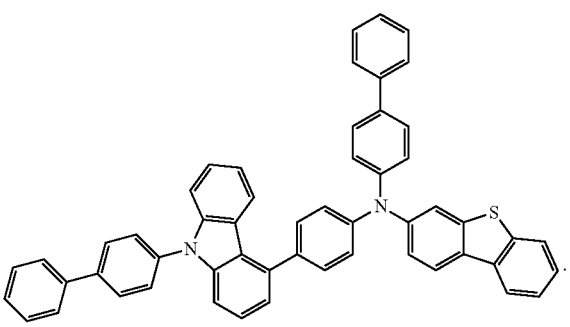
In one embodiment, the middle hole transport material and/or the anode-side hole transport material may be at least one selected from the following Compounds 2-1 to 2-17:

(2-1)
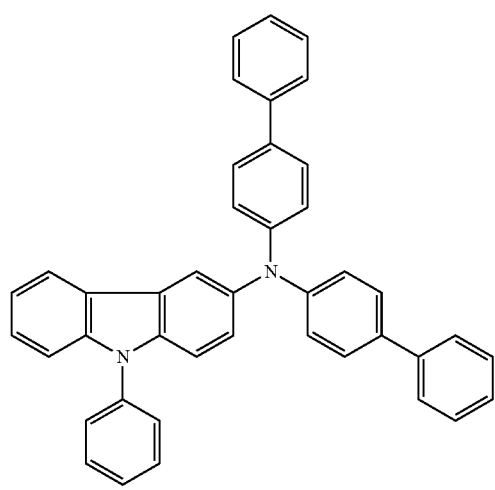
(2-4)
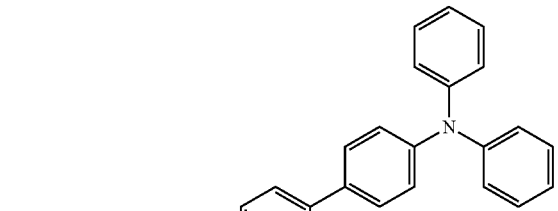
(2-2)
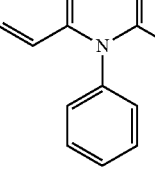
(2-5)
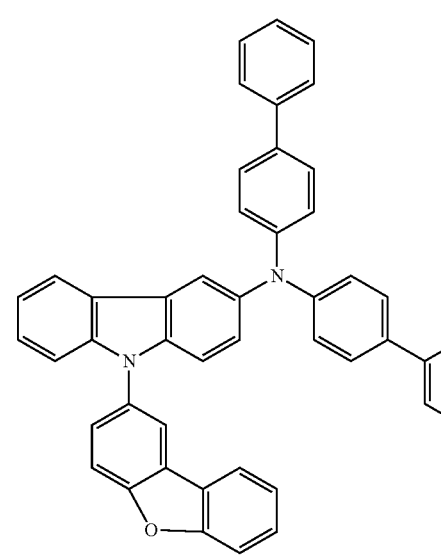
(2-3)
(2-6)
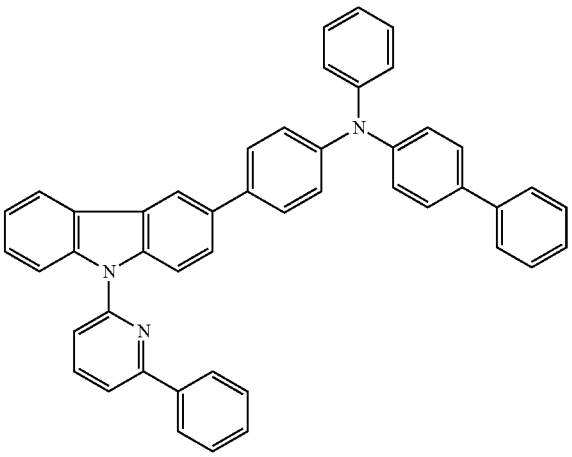

(2-7)
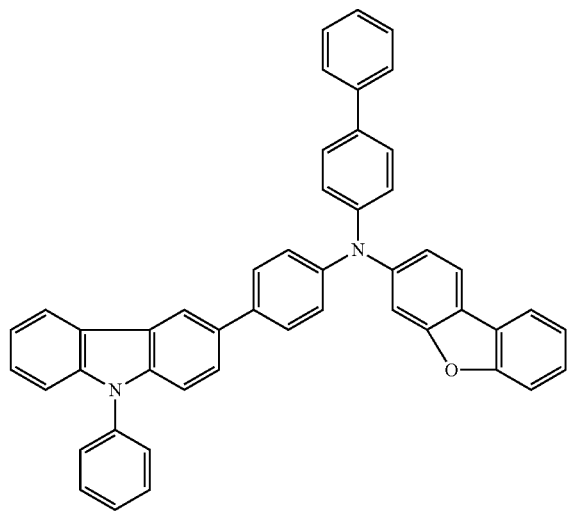
(2-8)
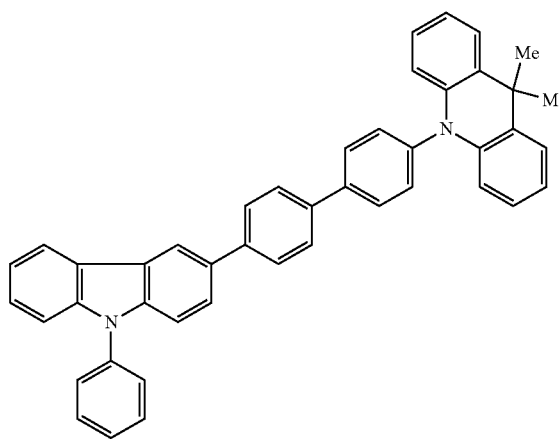
(2-9)
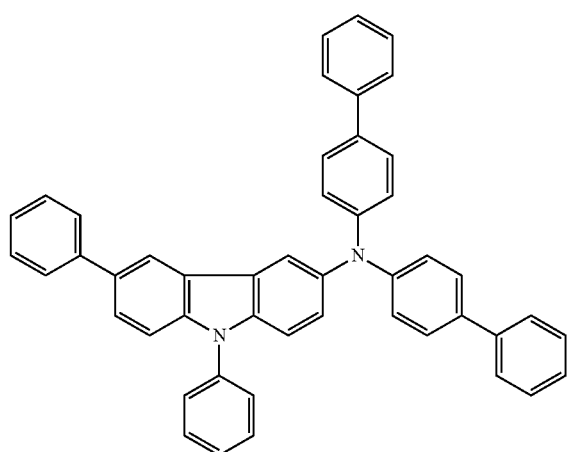
(2-10)
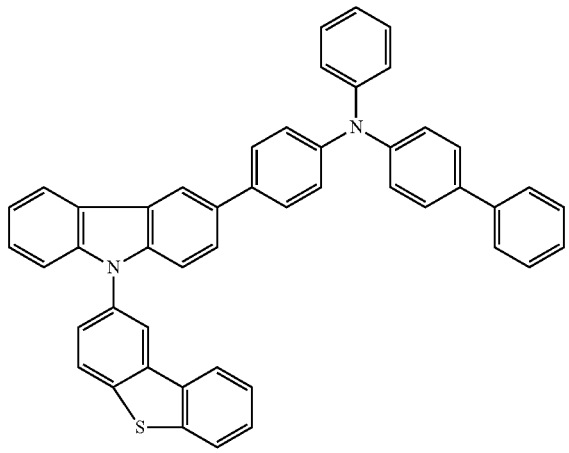
(2-11)
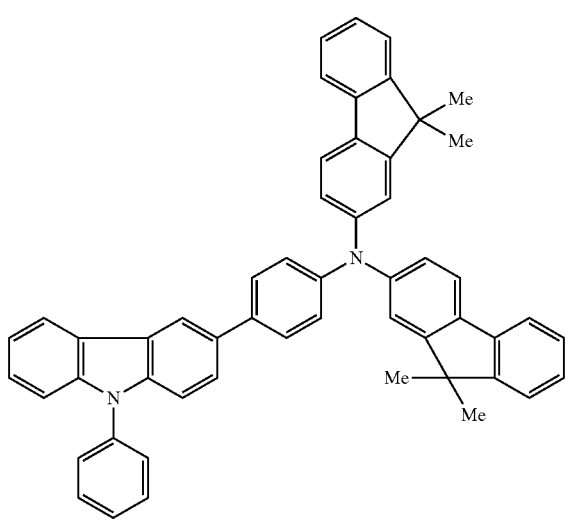
(2-12)
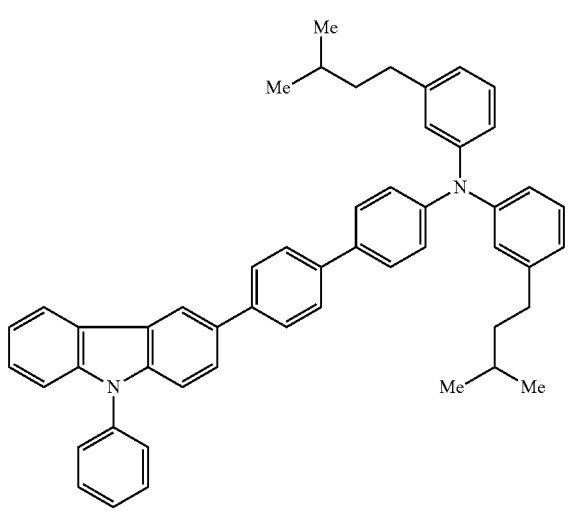

-continued (2-13)

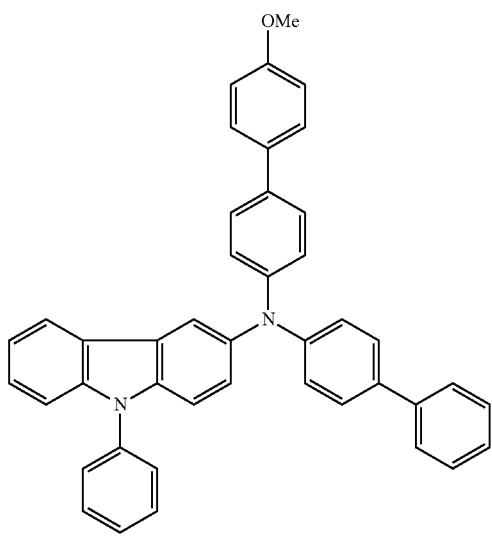

(2-14)

(2-15)

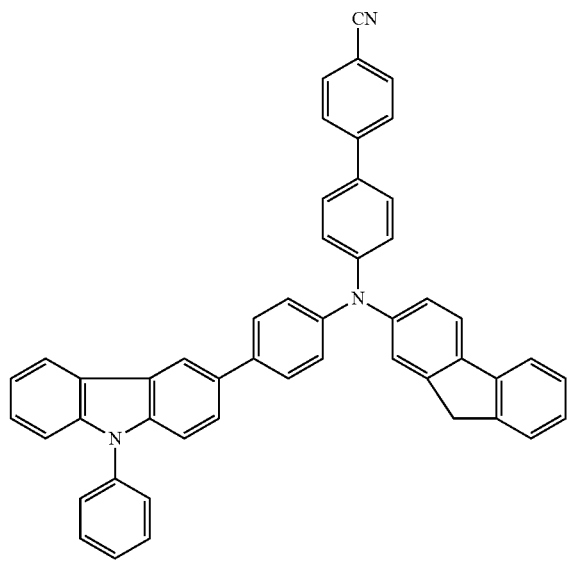

(2-16)

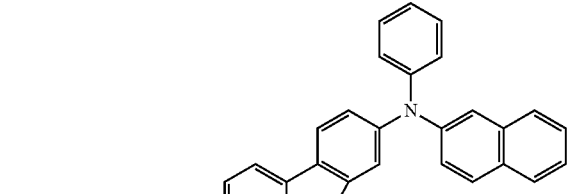

(2-17)

In one embodiment, the emission layer may include a compound represented by the following Formula 3:

[Formula 3]

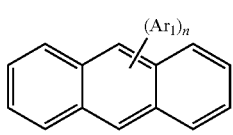

(3)

In Formula 3, each $Ar_1$ may be independently selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group, and n may be an integer selected from 1 to 10.

BRIEF DESCRIPTION OF THE DRAWING

The accompanying drawing is included to provide a further understanding of the present disclosure, and is incorporated in and constitutes a part of this specification. The drawing illustrates example embodiments of the present disclosure and, together with the description, serves to explain principles of the present disclosure.

The drawing is a cross-sectional schematic diagram showing the configuration of an organic electroluminescent device according to an embodiment of the present disclosure.

DETAILED DESCRIPTION

Hereinafter, preferred embodiments will be explained in more detail with reference to the accompanying drawing. The organic electroluminescent device according to an embodiment of the present disclosure may, however, be embodied in different forms and should not be construed as being limited to the example embodiments set forth herein.

In the description and drawing, elements having substantially the same function will be designated by the same reference numerals, and repeated explanation thereof will not be provided.

In the drawing, the thicknesses of layers, films, panels, regions, etc., may be exaggerated for clarity. It will be understood that when an element such as a layer, film, region, or substrate is referred to as being "on" another element, it can be directly on the other element or intervening element(s) may also be present. In contrast, when an element is referred to as being "directly on" another element, no intervening elements are present.

1. Configuration of an Organic Electroluminescent Device According to an Embodiment of the Present Disclosure The organic electroluminescent device according to an embodiment of the present disclosure may include an anode, an emission layer, and a plurality of hole transport layers between the anode and the emission layer. The plurality of hole transport layers may include an anode-side hole transport layer, a middle hole transport layer, and an emission layer-side hole transport layer. The anode-side hole transport layer may be between the anode and the emission layer and may include an anode-side hole transport material and an electron accepting material doped in the anode-side hole transport material. The middle hole transport layer may be between the anode-side hole transport layer and the emission layer and may include a middle hole transport material. The emission layer-side hole transport layer may be between the middle hole transport layer and the emission layer and adjacent to the emission layer.

Hereinafter, the configuration of the organic electroluminescent device according to an embodiment of the present disclosure will be explained in more detail.

1-1. Overall Configuration of Organic Electroluminescent Device

The drawing is a cross-sectional schematic diagram illustrating the overall configuration of an organic electroluminescent device 100.

As shown in the drawing, an organic electroluminescent device 100 according to an embodiment of the present disclosure may include a substrate 110, a first electrode 120 on the substrate 110, a hole transport layer 130 on the first electrode 120, an emission layer 140 on the hole transport layer 130, an electron transport layer 150 on the emission layer 140, an electron injection layer 160 on the electron transport layer 150, and a second electrode 170 on the electron injection layer 160. The hole transport layer 130 may have, for example, a multi-layer structure including a plurality of layers 131, 133, and/or 135.

1-2. Configuration of Substrate

The substrate 110 may be any suitable substrate available in the art for an organic electroluminescent device. For example, the substrate 110 may be a glass substrate, a semiconductor substrate, or a transparent plastic substrate.

1-3. Configuration of First Electrode

The first electrode 120 may be formed on the substrate 110 using an evaporation method, a sputtering method, etc. The first electrode 120 may be an anode. In one or more embodiments, the first electrode 120 may be formed as a transmission type electrode using a material with a large work function (such as a metal, an alloy, a conductive compound, etc., and/or a mixture thereof). For example, the first electrode 120 may be formed using indium tin oxide (ITO), indium zinc oxide (IZO), tin oxide ($SnO_2$), zinc oxide (ZnO), etc. having good transparency and/or conductivity. In some embodiments, the first electrode 120 may be formed as a reflection type (e.g., reflective) electrode using magnesium (Mg), aluminum (Al), etc.

1-4. Configuration of Hole Transport Layer

The hole transport layer 130 may include a hole transport material and may have a function of transporting holes. The hole transport layer 130 may be formed, for example, on the first electrode 120 to a thickness (total layer thickness in a laminated structure) of about 10 nm to about 150 nm.

The hole transport layer 130 of the organic electroluminescent device 100 according to an embodiment of the present disclosure may be a multi-layer structure formed by sequentially laminating the first electrode 120, an anode-side hole transport layer 131, a middle hole transport layer 133, and an emission layer-side hole transport layer 135. However, the ratio of the thicknesses of the layers (e.g., the thicknesses of the layers) are not specifically limited.

1-4-1. Configuration of Anode-Side Hole Transport Layer

The anode-side hole transport layer 131 may include an anode-side hole transport material. The anode-side hole transport layer 131 may be doped with an electron accepting material. In some embodiments, the anode-side hole transport layer 131 may be formed on the first electrode 120.

The anode-side hole transport layer 131 may be doped with the electron accepting material and may improve the hole injecting function of the first electrode 120. The anode-side hole transport layer 131 may be adjacent to the first electrode 120.

The anode-side hole transport material included in the anode-side hole transport layer 131 may be any suitable hole transport material available in the art. Non-limiting examples of the anode-side hole transport material included in the anode-side hole transport layer 131 may include 1,1-bis[(di-4-tolylamino)phenyl]cyclohexane (TAPC), a carbazole derivative (such as N-phenyl carbazole and/or polyvinyl carbazole), N,N'-bis(3-methylphenyl)-N,N'-diphenyl-[1,1-biphenyl]-4,4'-diamine (TPD), 4,4',4"-tris(N-carbazolyl)triphenylamine (TCTA), and N,N'-di(1-naphthyl)-N,N'-diphenylbenzidine (NPB).

The electron accepting material included in the anode-side hole transport layer 131 may be any suitable electron accepting material available in the art. In some embodiments, the electron accepting material included in the anode-side hole transport layer 131 may have a LUMO energy level at about −9.0 eV to about −4.0 eV, and in some embodiments, at about −6.0 eV to about −4.0 eV.

Non-limiting examples of electron accepting material having a LUMO energy level at about −9.0 eV to about −4.0 eV may include the compounds represented by the following Formulae 4-1 to 4-14:

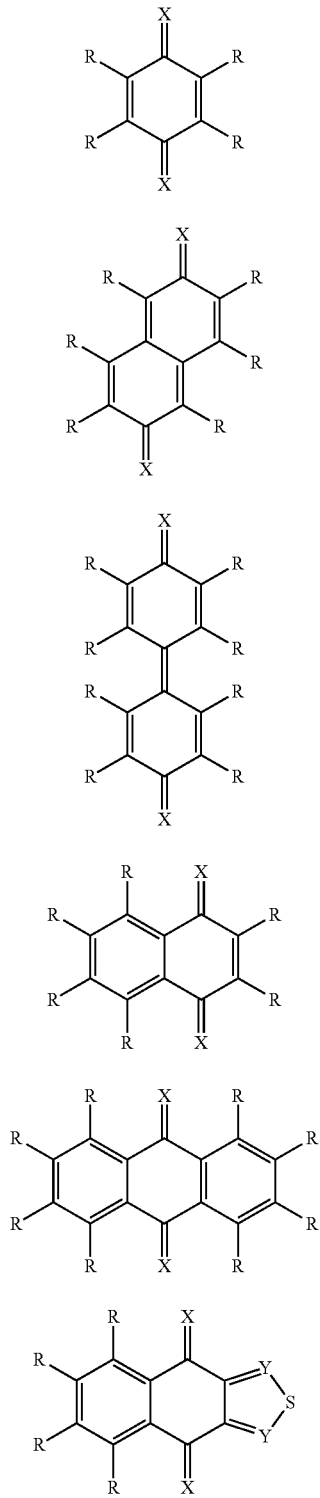

-continued

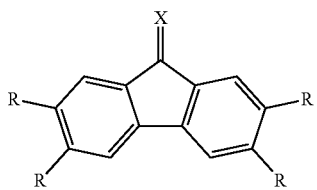

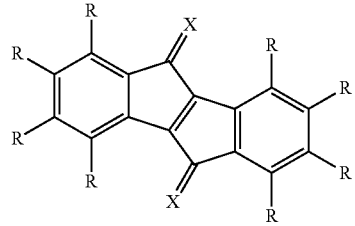

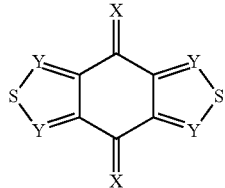

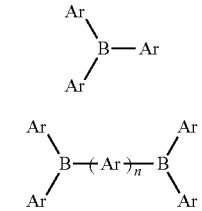

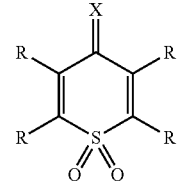

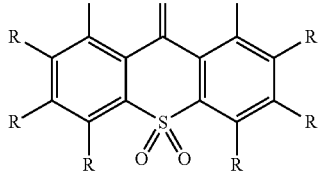

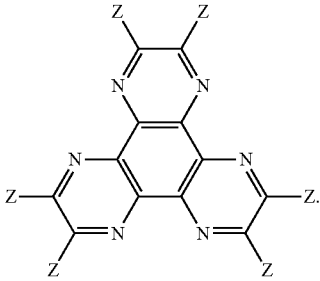

In Formulae 4-1 to 4-14, R may be selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, an aryl group having 6 to 50 carbon atoms for forming a ring, and a heteroaryl group having 5 to 50 carbon atoms for forming a ring. As used herein, the term "atoms for forming a ring" may refer to "ring-forming atoms".

Ar may be selected from a substituted aryl group with an electron withdrawing group, an unsubstituted aryl group having 6 to 50 carbon atoms for forming a ring, and a substituted or unsubstituted heteroaryl group having 5 to 50 carbon atoms for forming a ring, Y may be selected from a methine group (—CH═) and nitrogen (—N═), Z may be selected from a pseudohalogen and sulfur (S), n may be an integer selected from 0 to 10, and X may be one selected from the substituents represented by the following Formulae X1 to X7:

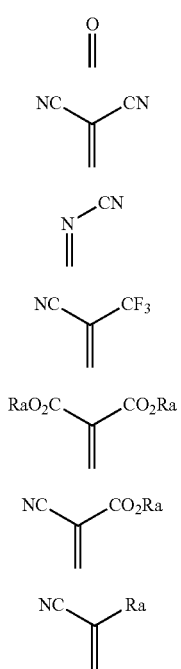

In Formulae X1 to X7, Ra may be selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, a substituted or unsubstituted aryl group having 6 to 50 carbon atoms for forming a ring, and a substituted or unsubstituted heteroaryl group having 5 to 50 carbon atoms for forming a ring.

Non-limiting examples of the substituted or unsubstituted aryl group having 6 to 50 carbon atoms for forming a ring (as represented by R, Ar, and Ra) may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4"-t-butyl-p-terphenyl-4-yl group, a fluoranthenyl group, a fluorenyl group, etc.

Non-limiting examples of the substituted or unsubstituted heteroaryl group having 5 to 50 carbon atoms for forming a ring (as represented by R, Ar, and Ra) may include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, 1,9-phenanthroline-10-yl group, an 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, an 1-phenazinyl group, a 2-phenazinyl group, an 1-phenothiazinyl group, a 2-phenothiazinyl group, a 3-phenothiazinyl group, a 4-phenothiazinyl group, a 10-phenothiazinyl group, a 1-phenoxaziny group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolylyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, etc.

Non-limiting examples of the substituted or unsubstituted alkyl fluoride group having 1 to 50 carbon atoms (as represented by R and Ra) may include a perfluoroalkyl group (such as a trifluoromethyl group, a pentafluoroethyl group, a heptafluoropropyl group, and/or a heptadecafluorooctane group, etc.), a monofluoromethyl group, a difluoromethyl group, a trifluoroethyl group, a tetrafluoropropyl group, an octafluoropentyl group, etc.

Non-limiting examples of the substituted or unsubstituted alkyl group having 1 to 50 carbon atoms (as represented by R and Ra) may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, etc.

The substituted or unsubstituted alkoxy group having 1 to 50 carbon atoms (as represented by R and Ra) may be a group represented by —O—Y. Non-limiting examples of Y may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, an 1,2-dichloroethyl group, an 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, etc.

Non-limiting examples of the halogen atom (as represented by R and Ra) may include fluorine (F), chlorine (Cl), bromine (Br), iodine (I), etc.

In some embodiments, the electron accepting material may include at least one selected from the following Compounds 4-15 and 4-16. The LUMO energy level of Compound 4-15 is about −4.40 eV, and the LUMO energy level of Compound 4-16 is about −5.20 eV.

However, embodiments of the electron accepting material are not limited to Compounds 4-15 and 4-16:

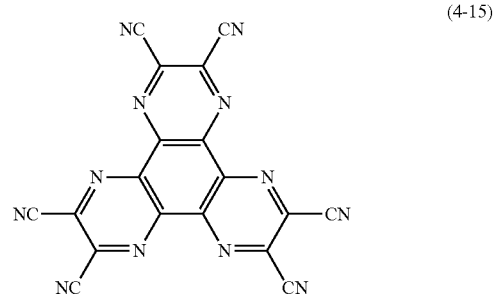

(4-15)

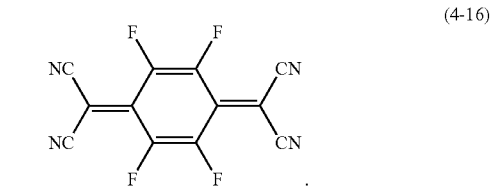

(4-16)

The doping amount (e.g., mass %) of the electron accepting material into the anode-side hole transport layer 131 is not specifically limited. For example, the doping amount of the electron accepting material may be about 0.1 mass % to about 50 mass %, and in some embodiments, about 0.5 mass % to about 5 mass % relative to the total mass of the anode-side hole transport material included in the anode-side hole transport layer 131.

1-4-2. Configuration of Middle Hole Transport Layer

The middle hole transport layer 133 may include a middle hole transport material. The middle hole transport layer 133 may be formed, for example, on the anode-side hole transport layer 131.

The middle hole transport material included in the middle hole transport layer 133 may be any suitable hole transport material available in the art. For example, the hole transport material may include the above-described anode-side hole transport material.

In some embodiments, the middle hole transport material may be a compound represented by the following Formula 2:

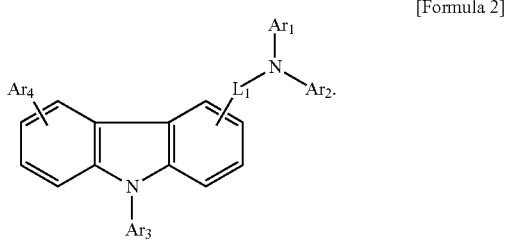

[Formula 2]

In Formula 2, $Ar_1$ to $Ar_3$ may each independently be selected from a substituted or unsubstituted aryl group having 6 to 50 carbon atoms for forming a ring and a substituted or unsubstituted heteroaryl group having 5 to 50 carbon atoms for forming a ring. $Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms. $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring. As used herein, the term "direct linkage" may refer to a bond such as a single bond.

Non-limiting examples of $Ar_1$ to $Ar_3$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, etc.

In some embodiments, $Ar_1$ to $Ar_3$ may be selected from a phenyl group, a biphenyl group, a terphenyl group, a fluorenyl group, a carbazolyl group, a dibenzofuranyl group, etc.

Non-limiting examples of $Ar_4$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a pyrazolyl group, a dibenzofuranyl group, a dibenzothienyl group, a methyl group, an ethyl group, a propyl group, an isopropyl group, an n-butyl group, etc. In some embodiments, $Ar_4$ may be selected from a phenyl group, a biphenyl group, a terphenyl group, a fluorenyl group, a carbazolyl group, a dibenzofuranyl group, a methyl group, an ethyl group, etc.

Non-limiting examples of $L_1$ (other than a direct linkage) may include a phenylene group, a biphenylene group, a terphenylene group, a naphthalene group, an anthrylene group, a phenanthrenylene group, a fluorenylene group, an indenylene group, a pyrenylene group, an acetonaphthenylene group, a fluoranthenylene group, a triphenylenylene group, a pyridylene group, a furanylene group, a pyranylene group, a thienylene group, a quinolylene group, an isoquinolylene group, a benzofuranylene group, a benzothienylene group, an indolylene group, a carbazolylene group, a benzoxazolylene group, a benzothiazolylene group, a quinoxalylene group, a benzoimidazolylene group, a pyrazolylene group, a dibenzofuranylene group, a dibenzothienylene group, etc. In some embodiments, $L_1$ may be selected from a direct linkage, a phenylene group, a biphenylene group, a terphenylene group, a fluorenylene group, a carbazolylene group, and a dibenzofuranylene group.

Non-limiting examples of compounds represented by Formula 2 may include the following Compounds 2-1 to 2-17. However, the compounds represented by Formula 2 are not limited to Compounds 2-1 to 2-17:

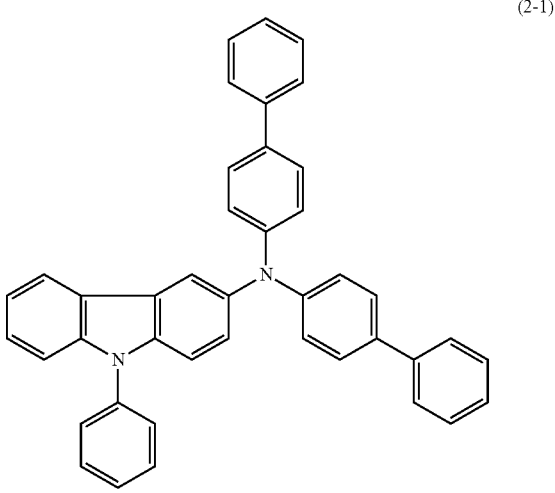

(2-1)

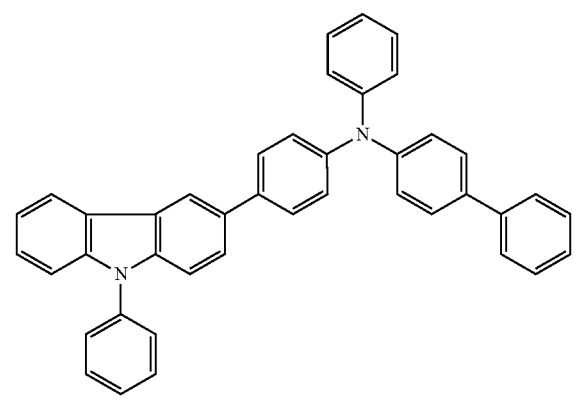

(2-2)

(2-3)
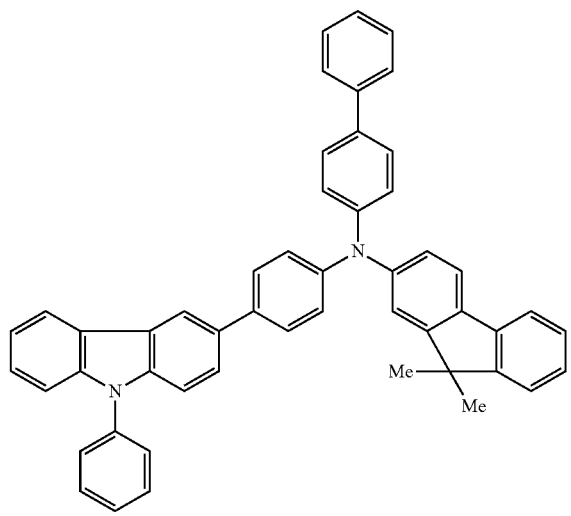
(2-4)
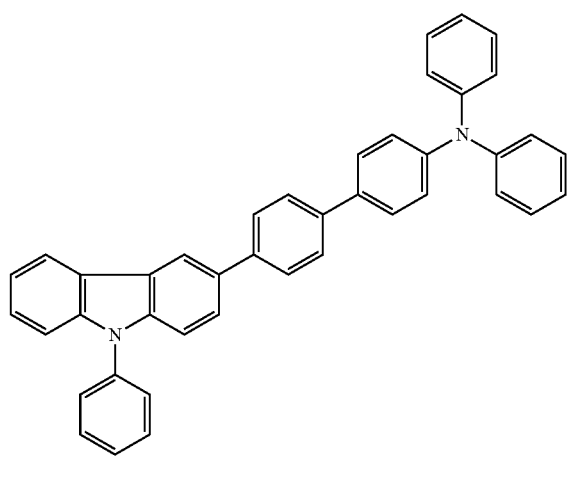
(2-5)
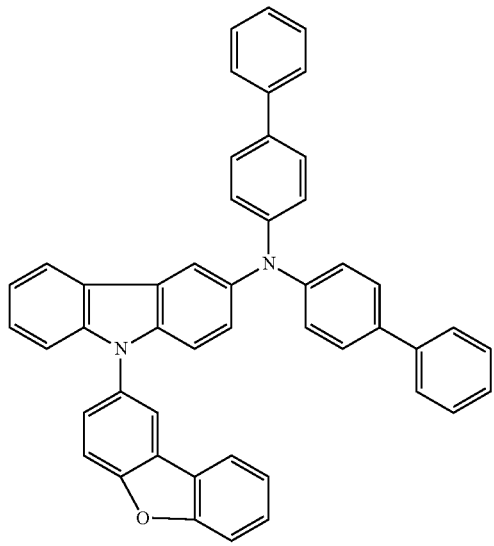
(2-6)
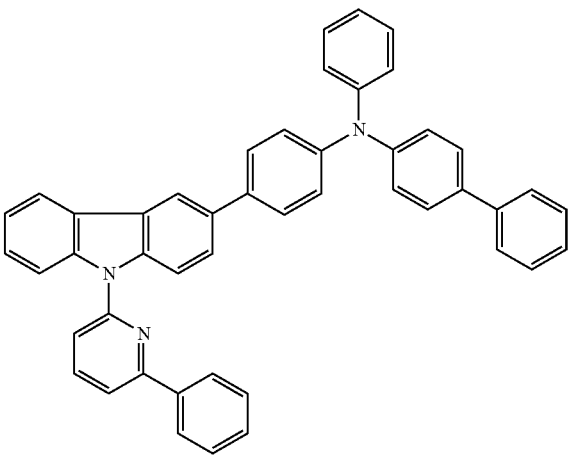
(2-7)
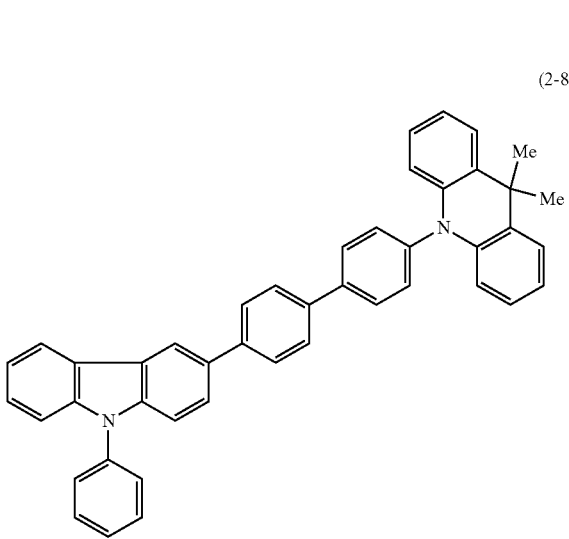
(2-8)

(2-9)
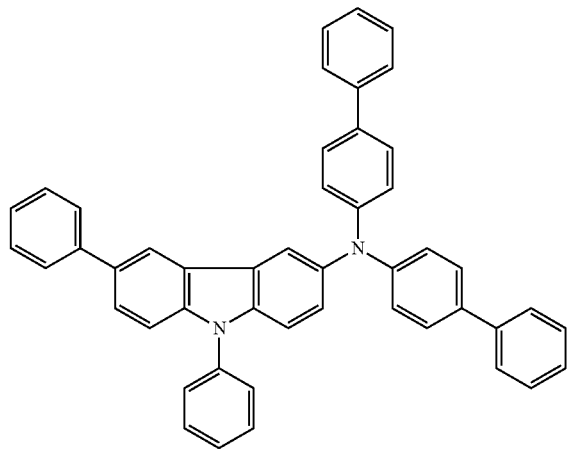
(2-10)
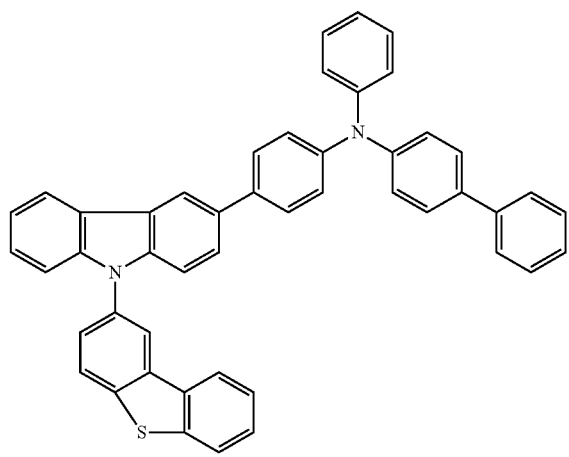
(2-11)
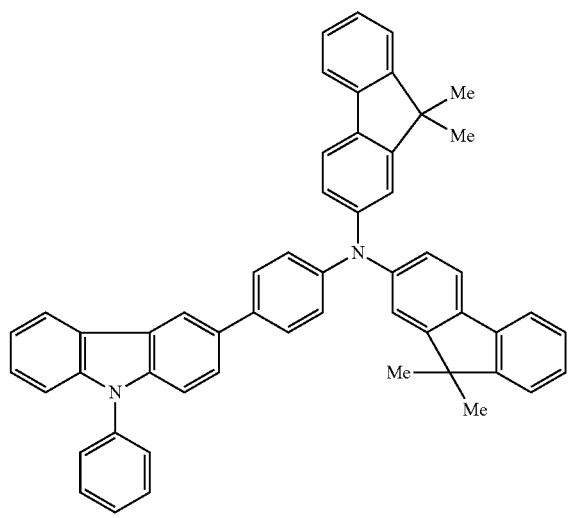
(2-12)
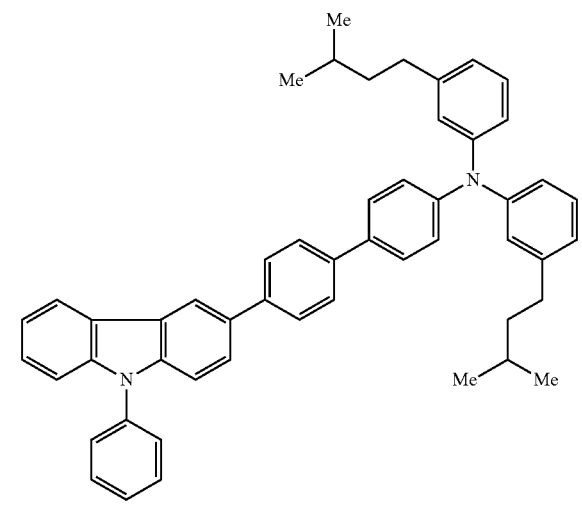
(2-13)
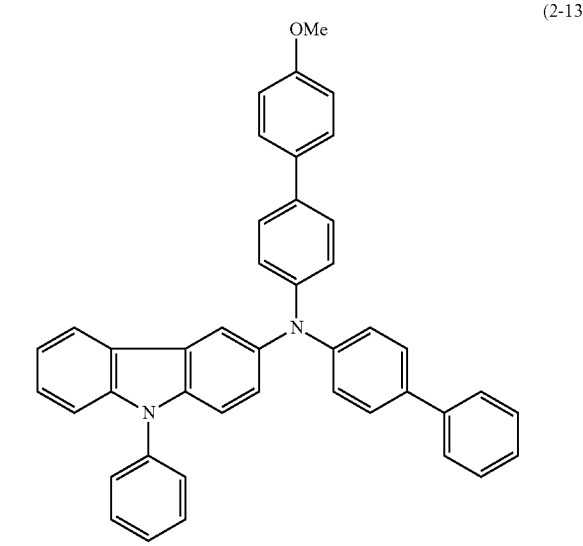
(2-14)
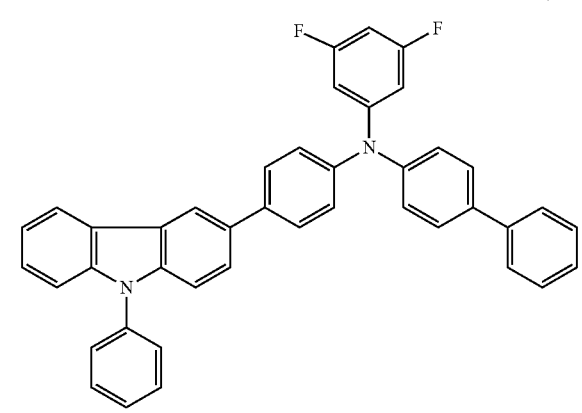

-continued (2-15)
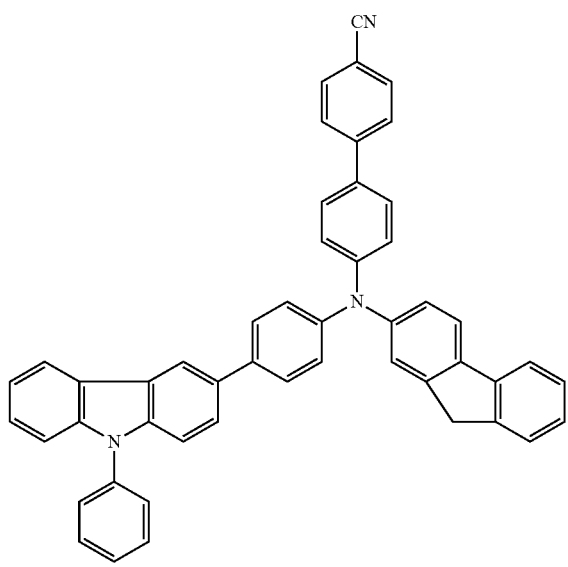

(2-16)
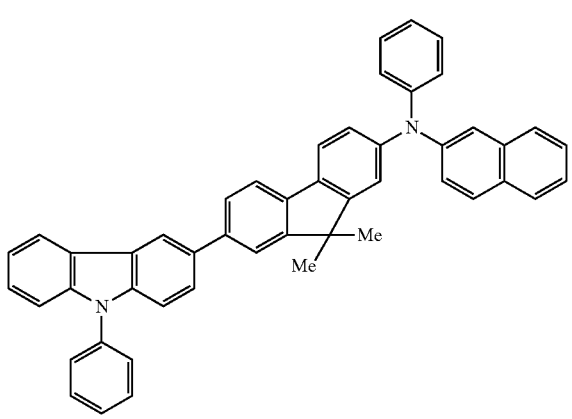

(2-17)
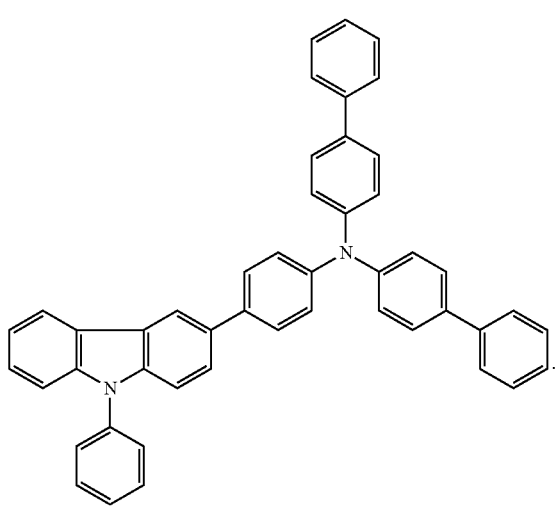

The middle hole transport layer 133 may include a compound represented by Formula 2 as a middle hole transport material, thereby improving the ability of the hole transport layer 130 to transport holes. The emission efficiency of the organic electroluminescent device 100 may also be improved.

A compound represented by Formula 2 may be included in the anode-side hole transport layer 131 as an anode-side hole transport material. When the anode-side hole transport layer 131 includes a compound represented by Formula 2 as an anode-side hole transport material, the ability of the hole transport layer 130 to transport holes may be improved, and the emission efficiency of the organic electroluminescent device 100 may also be improved.

When the concentration of a carbazole derivative such as a compound represented by Formula 1 and/or 2 is high in the hole transport layer 130, the emission efficiency of the organic electroluminescent device 100 may be improved.

In some embodiments, the anode-side hole transport layer 131 may include other hole transport materials in addition to a compound represented by Formula 2 as the anode-side hole transport material.

1-4-3. Configuration of Emission Layer-Side Hole Transport Layer

The emission layer-side hole transport layer 135 may include a compound represented by the following Formula 1. The emission layer-side hole transport layer 135 may be formed, for example, on the middle hole transport layer 133, and adjacent to the emission layer 140.

[Formula 1]

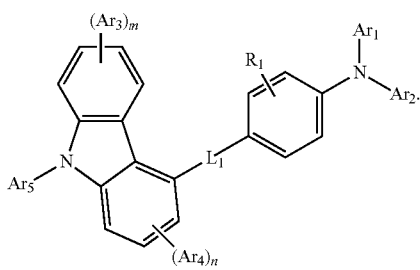

(1)

In Formula 1, $Ar_1$ to $Ar_5$ may each independently be selected from a substituted or unsubstituted aryl group having 6 to 50 carbon atoms for forming a ring and a substituted or unsubstituted heteroaryl group having 5 to 50 carbon atoms for forming a ring, m may be an integer selected from 0 to 4, and n may be an integer selected from 0 to 3. $R_1$ may be selected from hydrogen, deuterium, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms. $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring. Here, adjacent $Ar_1$ to $Ar_5$ substituents may combine (e.g., couple) to form a ring. For example, adjacent $Ar_1$ and $Ar_2$ may form a ring, adjacent $Ar_3$ or $Ar_4$ groups may form rings, and/or $Ar_3$ and $Ar_4$ may combine (e.g., couple) with an aromatic ring in a carbazole group to form another ring.

Non-limiting examples of $Ar_1$ to $Ar_5$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a pyrazolyl group, a dibenzofuranyl group, and a dibenzothienyl group. In some embodiments, $Ar_1$ to $Ar_5$ may be selected from a phenyl group, a biphenyl group, a terphenyl group, a fluorenyl group, a carbazolyl group, and a dibenzofuranyl group.

Non-limiting examples of $R_1$ (other than hydrogen and deuterium) may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a pyranyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a dibenzofuranyl group, and a dibenzothienyl group. In some embodiments, $R_1$ may be selected from a phenyl group, a biphenyl group, a terphenyl group, a fluorenyl group, a carbazolyl group, and a dibenzofuranyl group.

Non-limiting examples of $L_1$ (other than a direct linkage) may include the divalent forms of $Ar_1$ to $Ar_5$. Such non-limiting examples of $L_1$ may include a phenylene group, a biphenylylene group, a terphenylylene group, a naphthylene group, an anthrylene group, a phenanthrylene group, a fluorirene group, an indanediyl group, a pyrenediyl group, an acenaphthenediyl group, a fluoranthenediyl group, a triphenylenediyl group, a pyridinediyl group, a pyranediyl group, a quinolinediyl group, an isoquinolinediyl group, a benzofurandiyl group, a benzothiophenediyl group, an indolediyl group, a carbazolediyl group, a benzoxazolediyl group, a benzothiazolediyl group, a quinoxalinediyl group, a benzoimidazolediyl group, a dibenzofurandiyl group, etc. In some embodiments, $L_1$ may be selected from a phenylene group, a terphenylene group, a fluorenediyl group, a carbazolediyl group, and a dibenzofurandiyl group, etc.

Non-limiting examples of compounds represented by Formula 1 may include the following Compounds 1-1 to 1-28. However, the compounds represented by Formula 1 are not limited to Compounds 1-1 to 1-28:

1-1

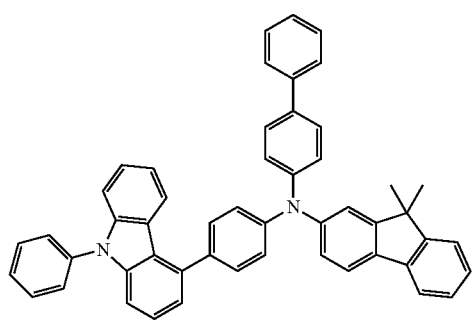

1-2

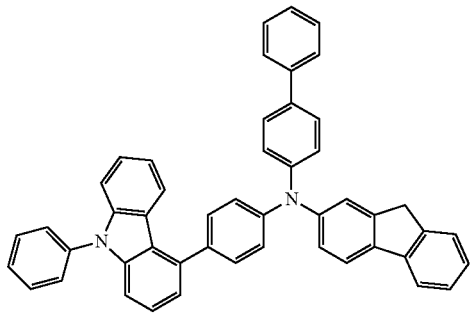

1-3

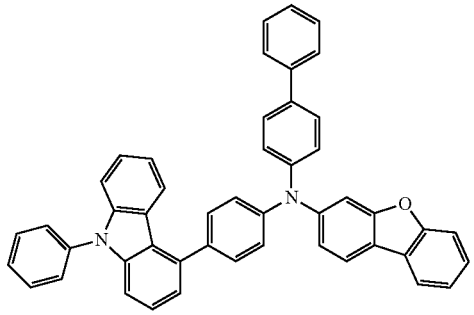

1-4

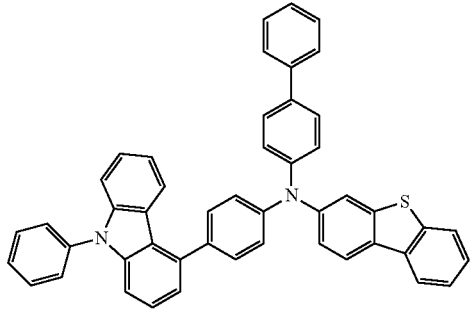

1-5

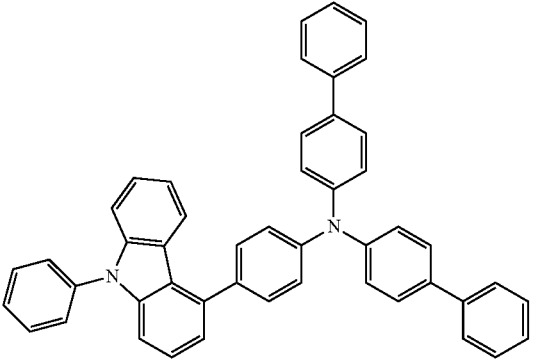

1-6
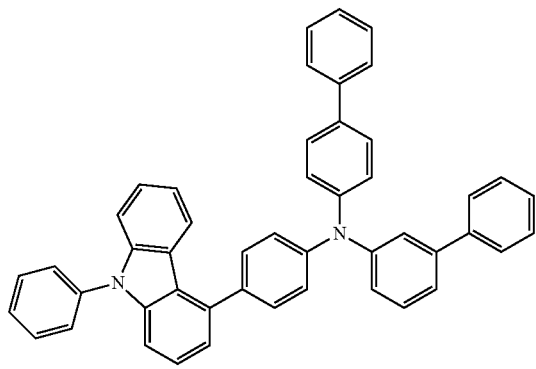
1-7
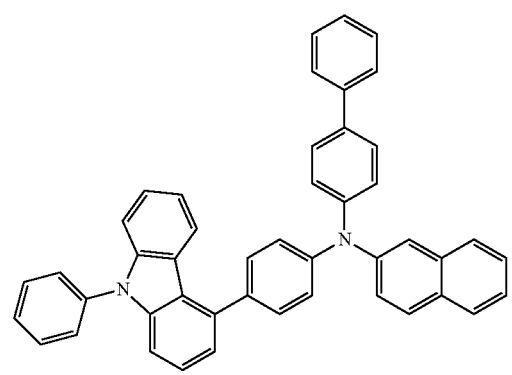
1-8
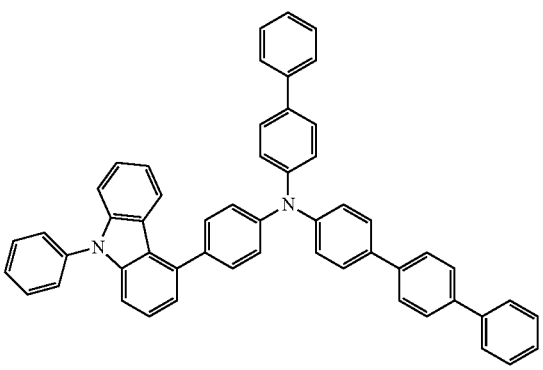
1-9
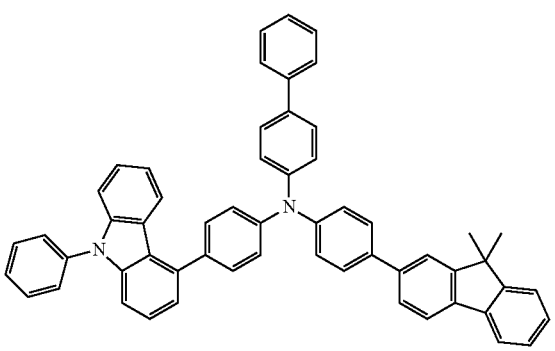
1-10
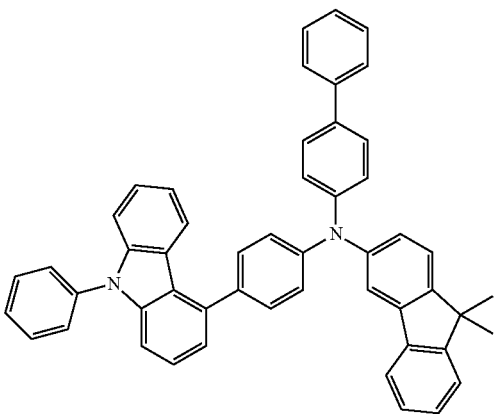
1-11
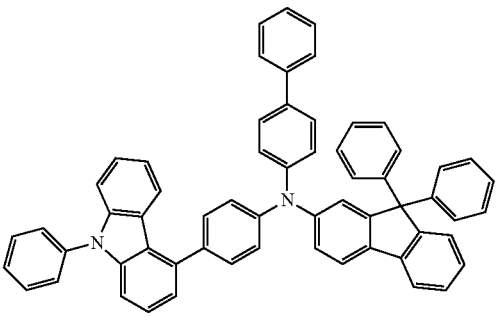
1-12
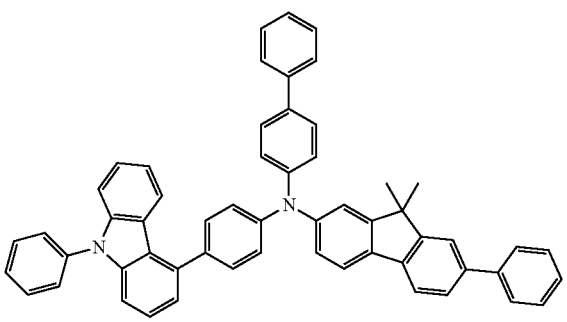
1-13
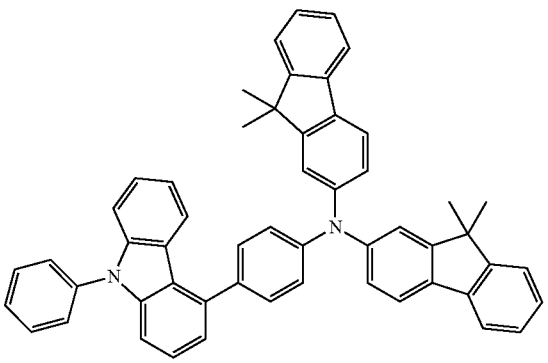

1-14
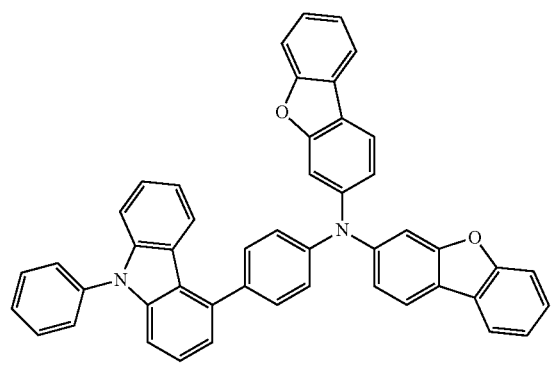
1-15
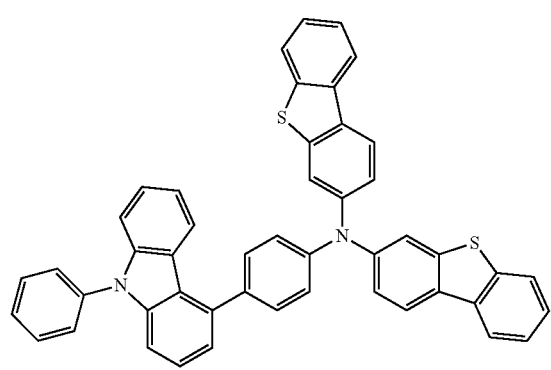
1-16
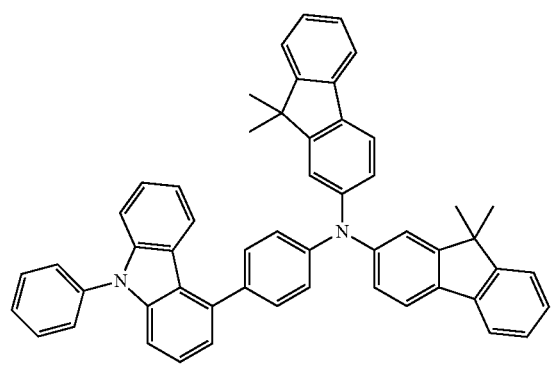
1-17
1-18
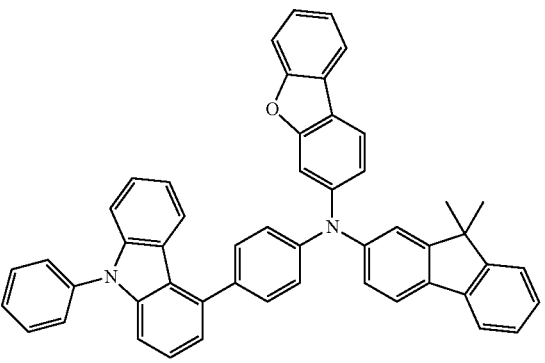
1-19
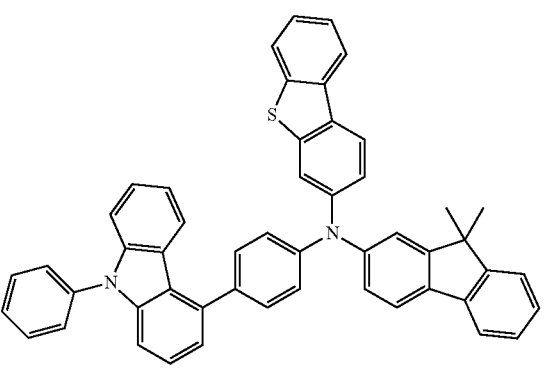
1-20
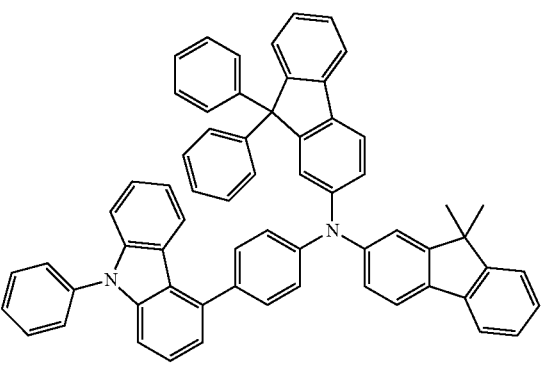
1-21
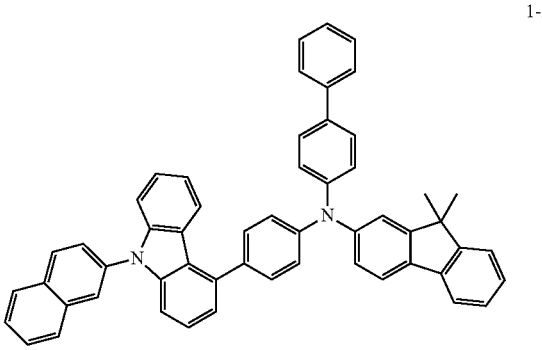

1-22

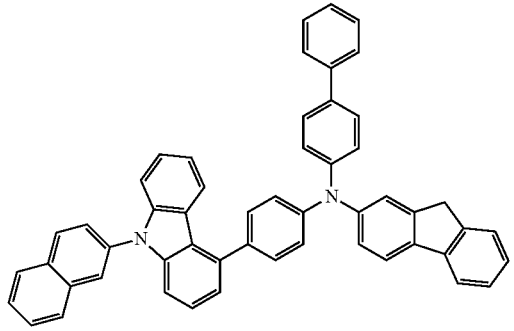

1-23

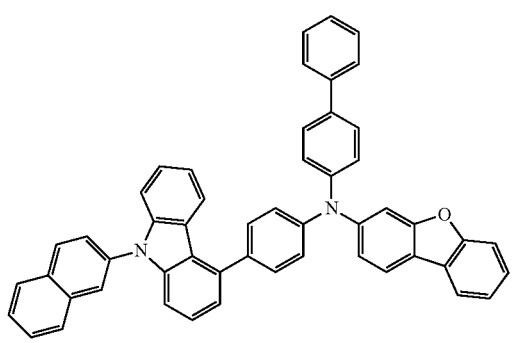

1-24

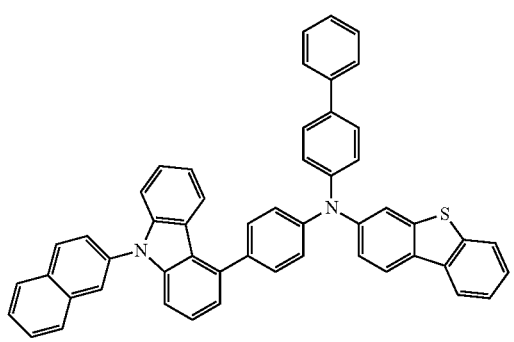

1-25

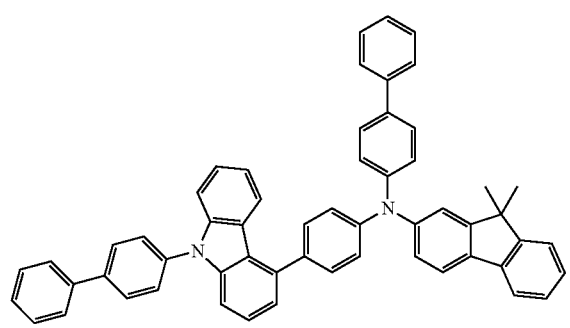

1-26

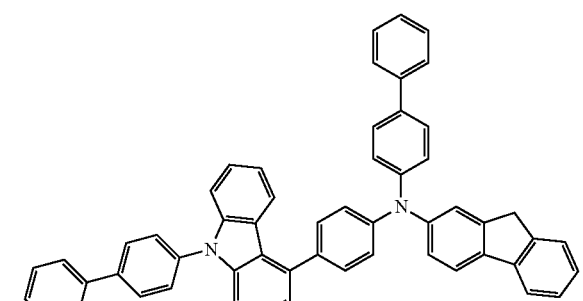

1-27

1-28

The emission layer-side hole transport layer 135 may include a compound represented by the above Formula 1 as an emission layer-side hole transport material. The emission layer-side hole transport layer 135 may passivate (e.g., protect) the hole transport layer 130 from electrons not consumed in the emission layer 140. When the emission layer-side hole transport layer 135 includes a compound represented by Formula 1, diffusion of energy in an excited state (e.g., excitons) generated in the emission layer 140 to the hole transport layer 130 may be prevented or reduced. Therefore, in this configuration, the emission layer-side hole transport layer 135 may improve the current flow durability of the hole transport layer 130.

The emission layer-side hole transport layer 135 may be formed adjacent to the emission layer 140 to prevent or reduce the diffusion of electrons and/or energy (e.g., excitons) from the emission layer 140.

In some embodiments, when the emission layer-side hole transport layer 135 includes a compound represented by Formula 1, the charge balance of the overall organic electroluminescent device 100 may be controlled, and diffusion of the electron accepting material doped in the anode-side hole transport layer 131 to the emission layer 140 may be restrained or reduced. Accordingly, the emission layer-side hole transport layer 135 may improve the charge transport properties of the hole transport layer 130.

The emission layer-side hole transport layer 135 may include a compound represented by Formula 1, and the charge transport properties and current flow tolerance of the hole transport layer 130 may be improved, thereby improving the emission efficiency and emission lifetime of the organic electroluminescent device 100.

As described above, the hole transport layer 130 including the anode-side hole transport layer 131, the middle hole transport layer 133, and the emission layer-side hole transport layer 135 may improve the current flow tolerance and hole transport properties of the organic electroluminescent device 100. Accordingly, the organic electroluminescent device 100 according to an embodiment of the present disclosure may have improved emission efficiency and an improved emission lifetime.

1-5. Configuration of Emission Layer

The emission layer 140 may include a host material and a luminescent dopant material, and may emit light via fluorescence or phosphorescence. The emission layer 140 may be formed, for example, on the hole transport layer 130 to a thickness of about 10 nm to about 60 nm.

The host material and the dopant material included in the emission layer 140 may include any suitable host material and/or dopant material available in the art, without limitation. For example, the emission layer 140 may include a fluoranthene derivative, pyrene (or a derivative thereof), an arylacetylene derivative, a fluorene derivative, perylene (or a derivative thereof), a chrysene derivative, a styryl derivative, etc. as the host material and/or the dopant material. In some embodiments, the emission layer 140 may include tris(8-quinolinolato)aluminum (Alq3), 4,4'-N,N'-dicarbazole-9-biphenyl (CBP), poly(N-vinylcarbazole) (PVK), 4,4',4"-tris(N-carbazolyl)triphenylamine (TCTA), 1,3,5-tris(N-phenylbenzimidazol-2-yl)benzene (TPBI), 3-tert-butyl-9,10-di(naphtho-2-yl)anthracene (TBADN), distyrylarylene (DSA), 4,4'-bis(9-carbazole)-2,2'-dimethyl-biphenyl (dmCBP), bis(2,2-diphenylvinyl)-1,1'-biphenyl (DPVBi), 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalene-2-yl)vinyl)phenyl)-N-phenylbenzeneamine (N-BDAVBi), 2,5,8,11-tetra-t-butylperylene (TBPe), 1,1-dipyrene, 1,4-dipyrenylbenzene, 1,4-bis(N,N-diphenylamino)pyrene, etc. as the host material and/or the dopant material.

In some embodiments, the emission layer 140 may include a compound represented by the following Formula 3:

[Formula 3]

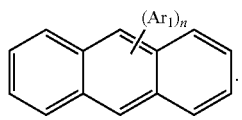
(3)

In Formula 3, each $Ar_1$ may be independently selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group, and n may be an integer selected from 1 to 10.

Non-limiting examples of compounds represented by Formula 3 may include the following Compounds 3-1 to 3-12. However, the compounds represented by Formula 3 are not limited to Compounds 3-1 to 3-12:

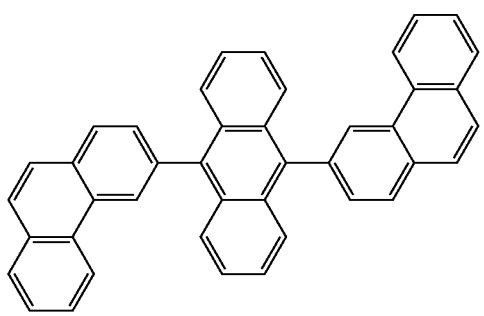
(3-1)

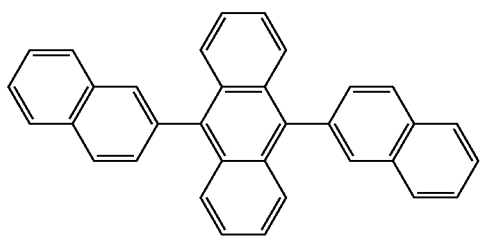
(3-2)

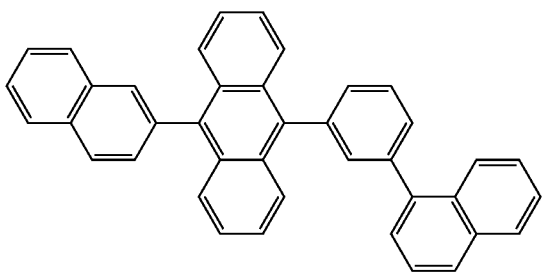
(3-3)

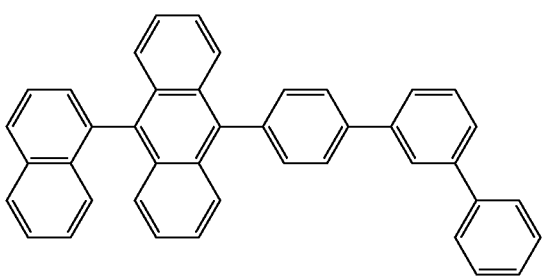
(3-4)

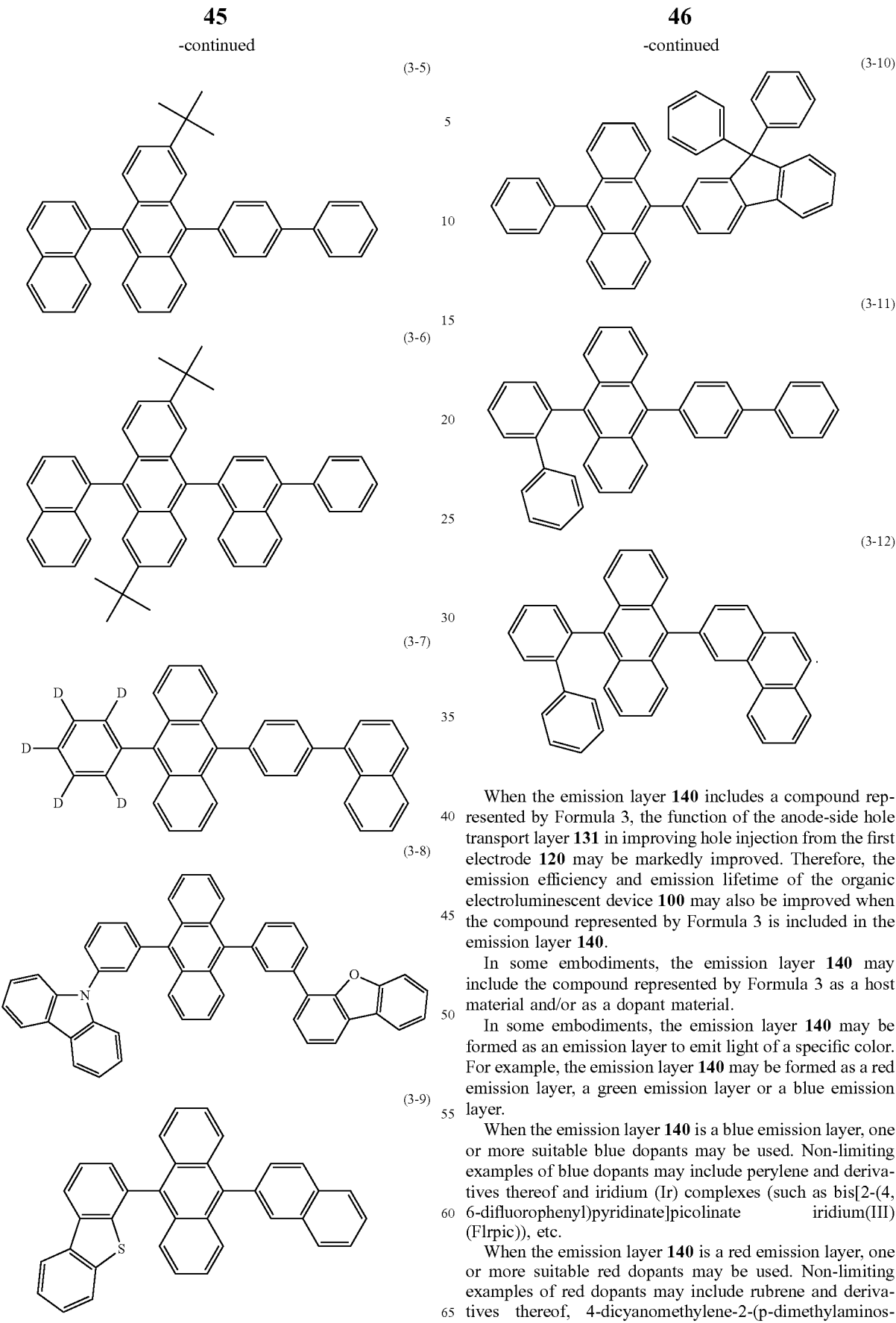

When the emission layer 140 includes a compound represented by Formula 3, the function of the anode-side hole transport layer 131 in improving hole injection from the first electrode 120 may be markedly improved. Therefore, the emission efficiency and emission lifetime of the organic electroluminescent device 100 may also be improved when the compound represented by Formula 3 is included in the emission layer 140.

In some embodiments, the emission layer 140 may include the compound represented by Formula 3 as a host material and/or as a dopant material.

In some embodiments, the emission layer 140 may be formed as an emission layer to emit light of a specific color. For example, the emission layer 140 may be formed as a red emission layer, a green emission layer or a blue emission layer.

When the emission layer 140 is a blue emission layer, one or more suitable blue dopants may be used. Non-limiting examples of blue dopants may include perylene and derivatives thereof and iridium (Ir) complexes (such as bis[2-(4, 6-difluorophenyl)pyridinate]picolinate iridium(III) (Flrpic)), etc.

When the emission layer 140 is a red emission layer, one or more suitable red dopants may be used. Non-limiting examples of red dopants may include rubrene and derivatives thereof, 4-dicyanomethylene-2-(p-dimethylaminostyryl)-6-methyl-4H-pyrane (DCM) and derivatives thereof, iridium complexes (such as bis(1-phenylisoquinoline)

(acetylacetonate) iridium(III) (Ir(piq)$_2$(acac))), osmium (Os) complexes, platinum complexes, etc.

When the emission layer 140 is a green emission layer, one or more suitable green dopants may be used. Non-limiting examples of green dopants may include coumarin and derivatives thereof and iridium complexes (such as tris(2-phenylpyridine) iridium(III) (Ir(ppy)$_3$)), etc.

1-6. Configuration of Electron Transport Layer

The electron transport layer 150 may include an electron transport material and have the function of transporting electrons. The electron transport layer 150 may be formed, for example, on the emission layer 140 to a thickness of about 15 nm to about 50 nm. The electron transport material included in the electron transport layer 150 may be any suitable electron transport material available in the art, without limitation. Non-limiting examples of the electron transport material may include a material having a nitrogen-containing aromatic ring (such as a quinoline derivative, e.g., tris(8-quinolinolato)aluminum (Alq3)), a 1,2,4-triazole (TAZ) derivative, and a Li complex (such as bis(2-methyl-8-quinolinolato)-(p-phenylphenolate)-aluminum (BAlq), beryllium bis(benzoquinoline-10-olate) (BeBq2), and/or lithium quinolate (LiQ)). Non-limiting examples of the nitrogen-containing aromatic ring may include a material including a pyridine ring (such as 1,3,5-tri[(3-pyridyl)-phen-3-yl]benzene), a material including a triazine ring (such as 2,4,6-tris(3'-(pyridin-3-yl)biphenyl-3-yl)-1,3,5-triazine), a material including an imidazole derivative (such as 2-(4-(N-phenylbenzoimidazolyl-1-yl-phenyl)-9,10-dinaphthylanthracene)), etc.

1-7. Configuration of Electron Injection Layer

The electron injection layer 160 may facilitate easy injection of electrons from a second electrode 170. The electron injection layer 160 may be formed, for example, on the electron transport layer 150 to a thickness of about 0.3 nm to about 9 nm. The electron injection layer 160 may be formed using any suitable material. Non-limiting examples of material that may be used to form the electron injection layer 160 may include lithium fluoride (LiF), sodium chloride (NaCl), cesium fluoride (CsF), lithium oxide (Li$_2$O), barium oxide (BaO), lithium quinolate (LIQ), etc.

1-8. Configuration of Second Electrode

The second electrode 170 may be a cathode, and may be formed on the electron injection layer 160 using an evaporation method and/or a sputtering method. The second electrode 170 may be a reflection type electrode formed using a metal, an alloy, a conductive compound, etc. having a small work function. The second electrode 170 may be formed using, for example, lithium (Li), magnesium (Mg), aluminum (Al), silver (Ag), aluminum-lithium (Al—Li), calcium (Ca), magnesium-indium (Mg—In), magnesium-silver (Mg—Ag), etc. In some embodiments, the second electrode 170 may be formed as a transmission type electrode using ITO, IZO, etc.

1-9. Modified Example of an Organic Electroluminescent Device

While the drawing shows the structure of one embodiment of the organic electroluminescent device 100, the structure of embodiments of the organic EL device 100 is not limited to the structure shown in the drawing. In the organic electroluminescent device 100 according to an embodiment of the present disclosure, at least a portion of each layer may be formed as a multi-layer structure, and/or additional layers may be included. The organic electroluminescent device 100 according to an embodiment of the present disclosure may exclude at least one selected from the electron transport layer 150 and the electron injection layer 160.

In some embodiments, in the organic electroluminescent device 100 according to an embodiment of the present disclosure, a hole injection layer may be between the first electrode 120 and the hole transport layer 130.

The hole injection layer may facilitate easy hole injection from the first electrode 120. The hole injection layer may be formed, for example, on the first electrode 120 to a thickness of about 10 nm to about 150 nm. The hole injection layer may be formed using any suitable material available in the art. Non-limiting examples of the material for forming the hole injection layer may include a triphenylamine-containing poly(ether ketone) (TPAPEK), 4-isopropyl-4'-methyldiphenyliodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), a phthalocyanine compound (such as copper phthalocyanine), 4,4',4"-tris(3-methylphenylamino)triphenylamine (m-MTDATA), N,N'-di(1-naphthyl)-N,N'-diphenylbenzidine (NPB), 4,4',4"-tris{N, N-diphenylamino}triphenylamine (TDATA), 4,4',4"-tris(N, N-2-naphthylphenylamino)triphenylamine (2-TNATA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), and polyaniline/poly(4-styrenesulfonate) (PANI/PSS).

1-9. Method of Manufacturing Organic Electroluminescent Device

Each layer of the organic electroluminescent device 100 according to an embodiment of the present disclosure as described above may be formed using an appropriate or suitable layer forming method such as vacuum evaporation, sputtering and/or any suitable coating method according to the material to be used in each layer.

For example, a metal layer (such as the first electrode 120, the second electrode 170, and/or the electron injection layer 160) may be formed using an evaporation method (such as electron beam evaporation, hot filament evaporation, and/or vacuum evaporation), a sputtering method, and/or a plating method (such as electroplating and/or electroless plating).

In some embodiments, an organic layer (such as the hole transport layer 130, the emission layer 140, and/or the electron transport layer 150) may be formed using, for example, a physical vapor deposition (PVD) method (such as vacuum evaporation), a printing method (such as screen printing and/or ink jet printing), a laser transcription method, and/or a coating method (such as spin coating).

2. Configuration of an Organic Electroluminescent Device According to an Embodiment of the Present Disclosure An organic electroluminescent device according to an embodiment of the present disclosure may include an anode, an emission layer, and a plurality of hole transport layers between the anode and the emission layer. The plurality of hole transport layers may include an anode-side hole transport layer, a middle hole transport layer, and an emission layer-side hole transport layer. The anode-side hole transport layer may be between the anode and the emission layer and include an electron accepting material. The middle hole transport layer may be between the anode-side hole transport layer and the emission layer and may include a middle hole transport material. The emission layer-side hole transport layer may be between the middle hole transport layer and the emission layer and may be adjacent to the emission layer.

Hereinafter, the configuration of the organic electroluminescent device according to an embodiment of the present disclosure will be explained in more detail. However, the overlapped portion with the configuration of the organic electroluminescent device will not be explained (e.g., explanations of features and elements that are substantially similar to the configurations described above will not be repeated), and different points from the configuration of the above embodiment will be the main focus of the explanation.

For example, the configuration of the substrate, the configuration of the first electrode and the second electrode, the configuration of the emission layer, the configuration of the electron transport layer, and the configuration of the electron injection layer may be the same as those in the above described organic electroluminescent device according to an embodiment of the present disclosure.

Hereinafter, the configurations of the anode-side hole transport layer, the middle hole transport layer, and the emission layer-side hole transport layer in the organic electroluminescent device according to an embodiment of the present disclosure will be explained in more detail.

2-1. Configuration of Hole Transport Layer

The hole transport layer 130 may include a hole transport material and have the function of transporting holes. The hole transport layer 130 may be formed, for example, on the first electrode 120 to a thickness (total layer thickness in a laminated structure) of about 10 nm to about 150 nm.

Here, the hole transport layer 130 of the organic electroluminescent device 100 according to an embodiment of the present disclosure may be formed as a multi-layer structure by sequentially laminating the first electrode 120, an anode-side hole transport layer 131, a middle hole transport layer 133, and an emission layer-side hole transport layer 135. The ratio of the thicknesses of the layers is not specifically limited.

2-1-1. Configuration of Anode-Side Hole Transport Layer

The anode-side hole transport layer 131 may be a layer including mainly an electron accepting material. The anode-side hole transport layer 131 may be formed on the first electrode 120.

The anode-side hole transport layer 131 may include a material other than the electron accepting material, however, in some embodiments, the anode-side hole transport layer 131 may be a layer including mainly the electron accepting material. For example, the anode-side hole transport layer 131 may include at least about 50 mass % of the electron accepting material relative to the total amount of the anode-side hole transport layer 131, and in some embodiments, may be formed using only the electron accepting material.

The anode-side hole transport layer 131 may be formed using mainly the electron accepting material and may improve hole injection from the first electrode 120. Therefore, the anode-side hole transport layer 131 may be near the first electrode 120, and may be adjacent to the first electrode 120.

The electron accepting material included in the anode-side hole transport layer 131 may be any suitable electron accepting material available in the art. In one embodiment, the electron accepting material included in the anode-side hole transport layer 131 may have a LUMO energy level at about −9.0 eV to about −4.0 eV, and in one embodiment, the electron accepting material may have a LUMO energy level at about −6.0 eV to about −4.0 eV.

Non-limiting examples of the electron accepting material having a LUMO energy level at about −9.0 eV to about −4.0 eV may include compounds represented by Formulae 4-1 to 4-14:

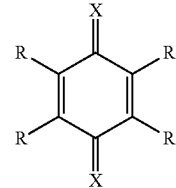 (4-1)

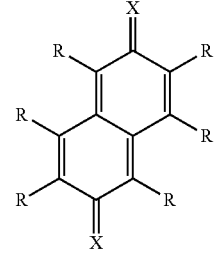 (4-2)

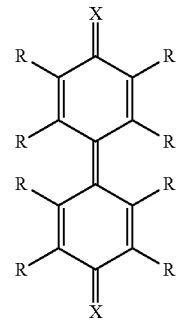 (4-3)

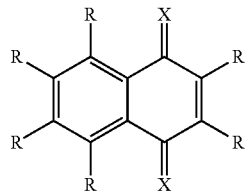 (4-4)

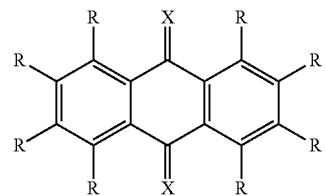 (4-5)

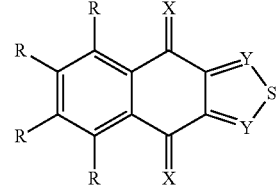 (4-6)

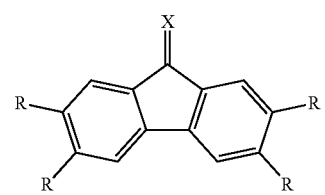 (4-7)

-continued

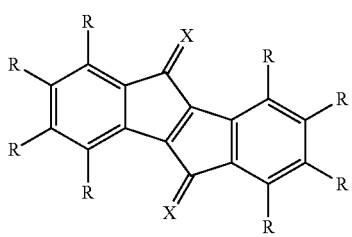
(4-8)

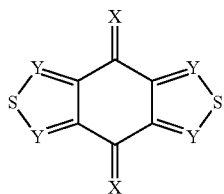
(4-9)

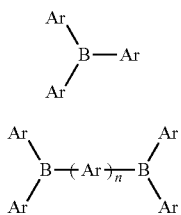
(4-10)

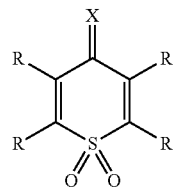
(4-11)

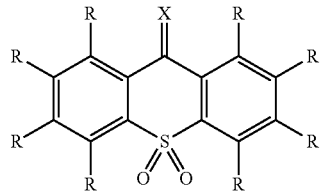
(4-12)

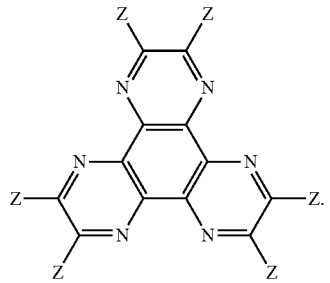
(4-13)

(4-14)

In Compounds 4-1 to 4-14, R may be selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, an aryl group having 6 to 50 carbon atoms, and a heteroaryl group having 5 to 50 carbon atoms for forming a ring.

Ar may be selected from a substituted aryl group with an electron withdrawing group, an unsubstituted aryl group having 6 to 50 carbon atoms for forming a ring, and a substituted or unsubstituted heteroaryl group having 5 to 50 carbon atoms for forming a ring, Y may be selected from a methine group (—CH=) and nitrogen (—N=), Z may be selected from a pseudohalogen and sulfur (S), n may be an integer selected from 0 to 10, and X may be one selected from the substituents represented by the following Formulae X1 to X7:

X1

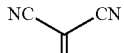
X2

X3

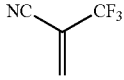
X4

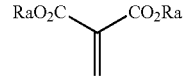
X5

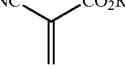
X6

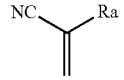
X7

In Formulae X1 to X7, Ra may be selected from hydrogen, deuterium, a halogen atom, an alkyl fluoride group having 1 to 50 carbon atoms, a cyano group, an alkoxy group having 1 to 50 carbon atoms, an alkyl group having 1 to 50 carbon atoms, a substituted or unsubstituted aryl group having 6 to 50 carbon atoms for forming a ring, and a substituted or unsubstituted heteroaryl group having 5 to 50 carbon atoms for forming a ring.

Non-limiting examples of the substituted or unsubstituted aryl group having 6 to 50 carbon atoms for forming a ring (as represented by R, Ar, and Ra) may include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4''-t-butyl-p-terphenyl-4-yl group, a fluoranthenyl group, a fluorenyl group, etc.

Non-limiting examples of the substituted or unsubstituted heteroaryl group having 5 to 50 carbon atoms for forming a ring (as represented by R, Ar, and Ra) may include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthroline-2-yl group, a 1,7-phenanthroline-3-yl group, a 1,7-phenanthroline-4-yl group, a 1,7-phenanthroline-5-yl group, a 1,7-phenanthroline-6-yl group, a 1,7-phenanthroline-8-yl group, a 1,7-phenanthroline-9-yl group, a 1,7-phenanthroline-10-yl group, a 1,8-phenanthroline-2-yl group, a 1,8-phenanthroline-3-yl group, a 1,8-phenanthroline-4-yl group, a 1,8-phenanthroline-5-yl group, a 1,8-phenanthroline-6-yl group, a 1,8-phenanthroline-7-yl group, a 1,8-phenanthroline-9-yl group, a 1,8-phenanthroline-10-yl group, a 1,9-phenanthroline-2-yl group, a 1,9-phenanthroline-3-yl group, a 1,9-phenanthroline-4-yl group, a 1,9-phenanthroline-5-yl group, a 1,9-phenanthroline-6-yl group, a 1,9-phenanthroline-7-yl group, a 1,9-phenanthroline-8-yl group, a 1,9-phenanthroline-10-yl group, a 1,10-phenanthroline-2-yl group, a 1,10-phenanthroline-3-yl group, a 1,10-phenanthroline-4-yl group, a 1,10-phenanthroline-5-yl group, a 2,9-phenanthroline-1-yl group, a 2,9-phenanthroline-3-yl group, a 2,9-phenanthroline-4-yl group, a 2,9-phenanthroline-5-yl group, a 2,9-phenanthroline-6-yl group, a 2,9-phenanthroline-7-yl group, a 2,9-phenanthroline-8-yl group, a 2,9-phenanthroline-10-yl group, a 2,8-phenanthroline-1-yl group, a 2,8-phenanthroline-3-yl group, a 2,8-phenanthroline-4-yl group, a 2,8-phenanthroline-5-yl group, a 2,8-phenanthroline-6-yl group, a 2,8-phenanthroline-7-yl group, a 2,8-phenanthroline-9-yl group, a 2,8-phenanthroline-10-yl group, a 2,7-phenanthroline-1-yl group, a 2,7-phenanthroline-3-yl group, a 2,7-phenanthroline-4-yl group, a 2,7-phenanthroline-5-yl group, a 2,7-phenanthroline-6-yl group, a 2,7-phenanthroline-8-yl group, a 2,7-phenanthroline-9-yl group, a 2,7-phenanthroline-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxaziny group, a 2-phenoxazinyl group, a 3-phenoxazinyl group, a 4-phenoxazinyl group, a 10-phenoxazinyl group, a 2-oxazolyl group, a 4-oxazolyl group, a 5-oxazolylyl group, a 2-oxadiazolyl group, a 5-oxadiazolyl group, a 3-furazanyl group, a 2-thienyl group, a 3-thienyl group, a 2-methylpyrrole-1-yl group, a 2-methylpyrrole-3-yl group, a 2-methylpyrrole-4-yl group, a 2-methylpyrrole-5-yl group, a 3-methylpyrrole-1-yl group, a 3-methylpyrrole-2-yl group, a 3-methylpyrrole-4-yl group, a 3-methylpyrrole-5-yl group, a 2-t-butylpyrrole-4-yl group, a 3-(2-phenylpropyl)pyrrole-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, a 4-t-butyl-3-indolyl group, etc.

Non-limiting examples of the substituted or unsubstituted alkyl fluoride group having 1 to 50 carbon atoms (as represented by R and Ra) may include a perfluoroalkyl group (such as a trifluoromethyl group, a pentafluoroethyl group, a heptafluoropropyl group, and/or a heptadecafluorooctanyl group, etc.), a monofluoromethyl group, a difluoromethyl group, a trifluoroethyl group, a tetrafluoropropyl group, an octafluoropentyl group, etc.

Non-limiting examples of the substituted or unsubstituted alkyl group having 1 to 50 carbon atoms (as represented by R and Ra) may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, a 2-norbornyl group, etc.

The substituted or unsubstituted alkoxy group having 1 to 50 carbon atoms (as represented by R and Ra) may be a functional group represented by —O—Y. Non-limiting examples of Y may include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, etc.

Non-limiting examples of the halogen atom (as represented by R and Ra) may include fluorine (F), chlorine (Cl), bromine (Br), iodine (I), etc.

In some embodiments, the electron accepting material may include one selected from the following Compounds 4-15 and 4-16. The LUMO energy level of Compound 4-15 is about −4.40 eV, and the LUMO energy level of Compound 4-16 is about −5.20 eV. However, the electron accepting material is not limited to Compounds 4-15 and 4-16:

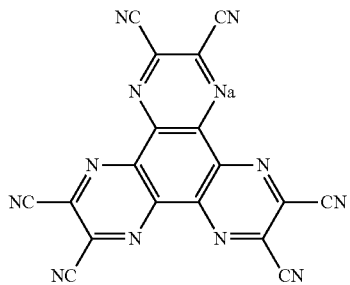
(4-15)

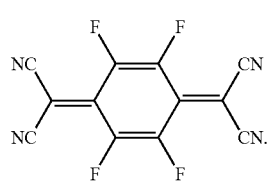
(4-16)

2-1-2. Configuration of Middle Hole Transport Layer

The middle hole transport layer 133 may include a middle hole transport material. The middle hole transport layer 133 may be formed, for example, on the anode-side hole transport layer 131.

The middle hole transport material included in the middle hole transport layer 133 may include any suitable hole transport material. Non-limiting examples of the middle hole transport material included in the middle hole transport layer 133 may include 1,1-bis[(di-4-tolylamino)phenyl]cyclohexane (TAPC), a carbazole derivative (such as N-phenyl carbazole and polyvinyl carbazole), N,N'-bis(3-methylphenyl)-N,N'-diphenyl-[1,1-biphenyl]-4,4'-diamine (TPD), 4,4', 4''-tris(N-carbazolyl)triphenylamine (TCTA), N,N'-di(1-naphthyl)-N,N'-diphenylbenzidine (NPB), etc.

In some embodiments, the middle hole transport material may be a compound represented by the following Formula 2:

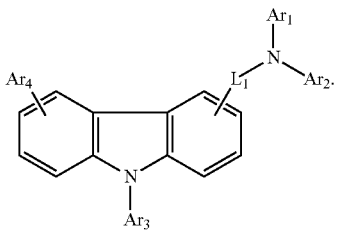
[Formula 2]

In Formula 2, $Ar_1$ to $Ar_3$ may each independently be selected from a substituted or unsubstituted aryl group having 6 to 50 carbon atoms for forming a ring and a substituted or unsubstituted heteroaryl group having 5 to 50 carbon atoms for forming a ring. $Ar_4$ may be selected from hydrogen, deuterium, a halogen atom, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms. $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

Non-limiting examples of $Ar_1$ to $Ar_3$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, etc. In some embodiments, $Ar_1$ to $Ar_3$ may each independently be selected from a phenyl group, a biphenyl group, a terphenyl group, a fluorenyl group, a carbazolyl group, a dibenzofuranyl group, etc.

Non-limiting examples of $Ar_4$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoimidazolyl group, a pyrazolyl group, a dibenzofuranyl group, a dibenzothienyl group, a methyl group, an ethyl group, a propyl group, an isopropyl group, an n-butyl group, etc. In some embodiments, $Ar_4$ may be selected from a phenyl group, a biphenyl group, a terphenyl group, a fluorenyl group, a carbazolyl group, a dibenzofuranyl group, a methyl group, a ethyl group, etc.

Non-limiting examples of $L_1$ (other than a direct linkage) may include a phenylene group, a biphenylene group, a terphenylene group, a naphthylene group, an anthrylene group, a phenanthrylene group, a fluorenylene group, an indenylene group, a pyrenylene group, an acetonaphthenylene group, a fluoranthenylene group, a triphenylenylene group, a pyridylene group, a furanylene group, a pyrenylene group, a thienylene group, a quinolylene group, an isoquinolylene group, a benzofuranylene group, a benzothienylene group, an indolylene group, a carbazolylene group, a benzoxazolylene group, a benzothiazolylene group, a quinoxalylene group, a benzoimidazolylene group, a pyrazolylene group, a dibenzofuranylene group, a dibenzothienylene group, etc. In some embodiments, $L_1$ may be selected from a direct linkage, a phenylene group, a biphenylene group, a terphenylene group, a fluorenylene group, a carbazolylene group and a dibenzofuranylene group.

Non-limiting examples of compounds represented by Formula 2 may include the following Compounds 2-1 to 2-17. However, the compounds represented by Formula 2 are not limited to Compounds 2-1 to 2-17:

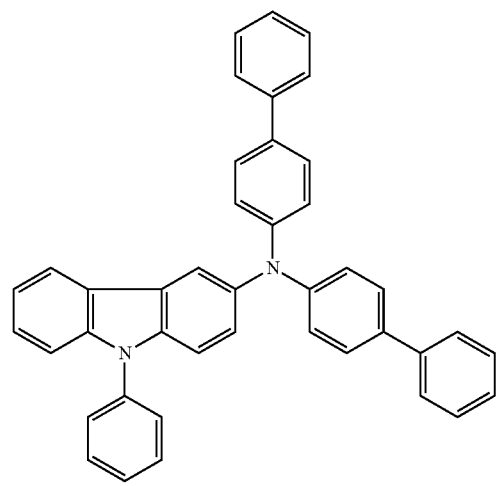

(2-1)

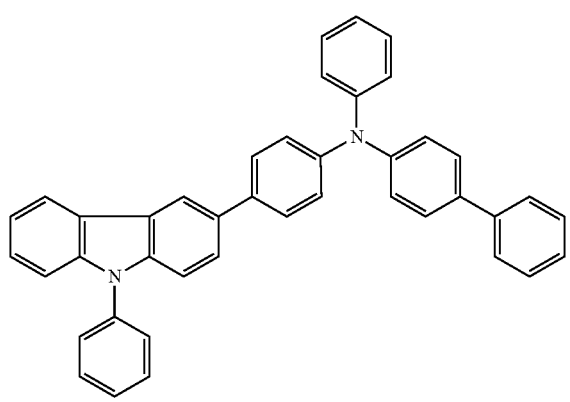

(2-2)

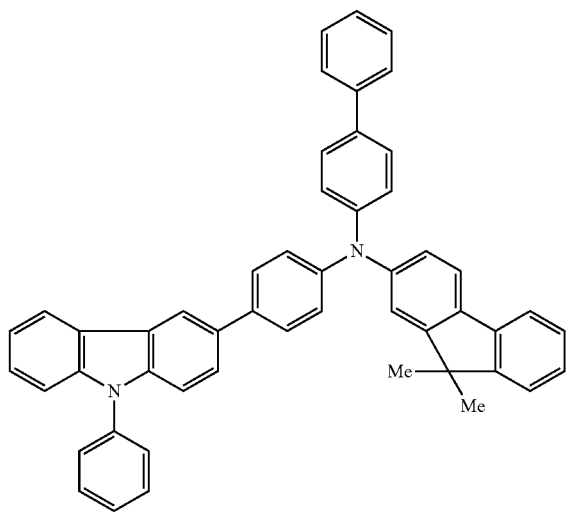

(2-3)

-continued

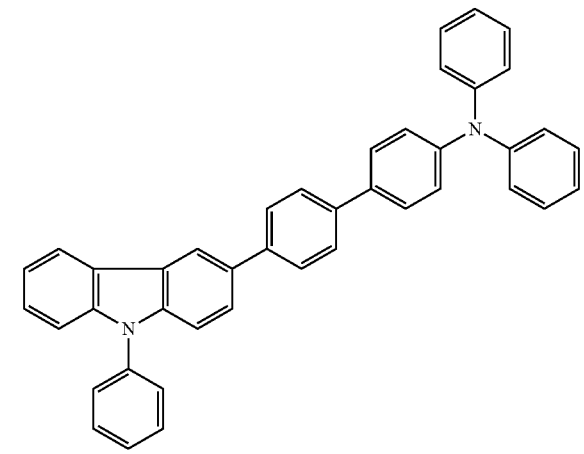

(2-4)

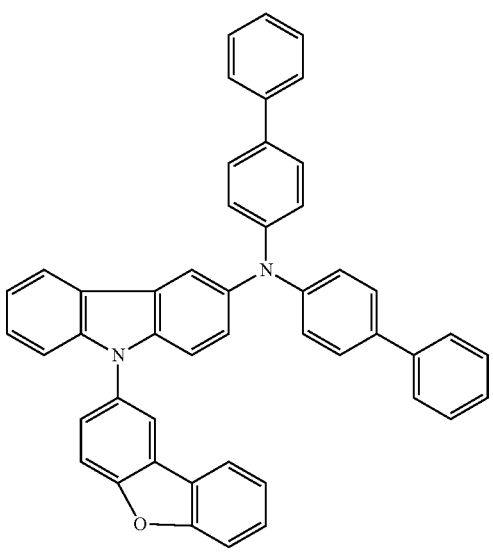

(2-5)

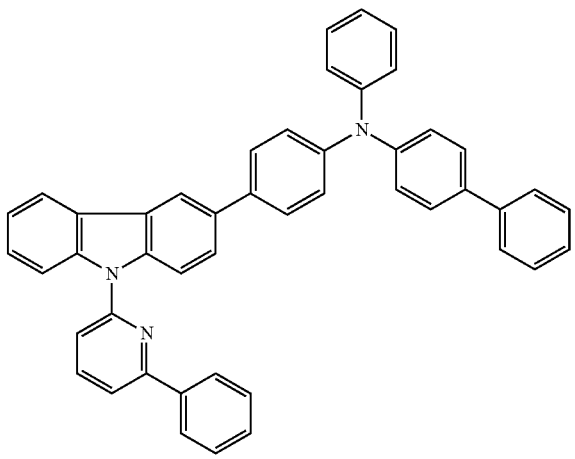

(2-6)

(2-7)
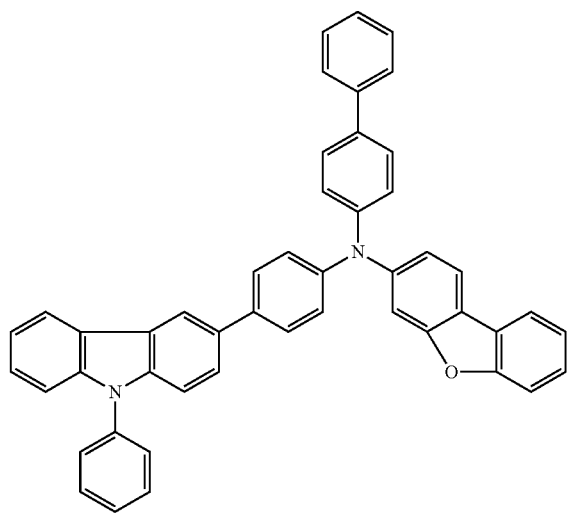
(2-8)
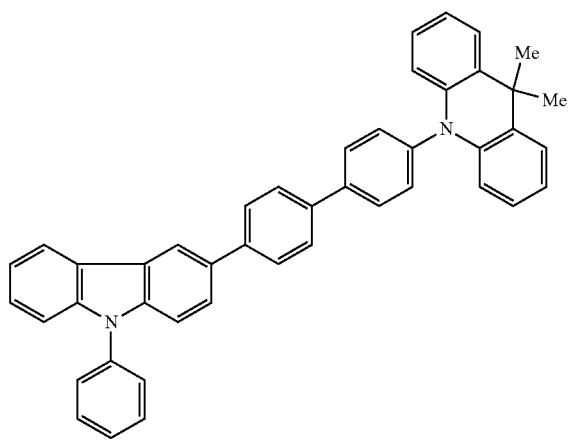
(2-9)
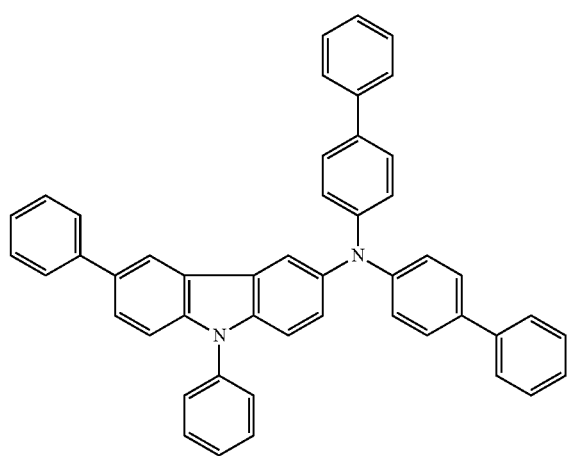
(2-10)
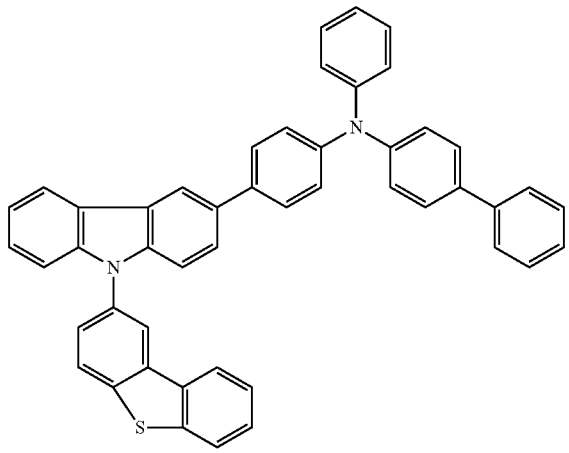
(2-11)
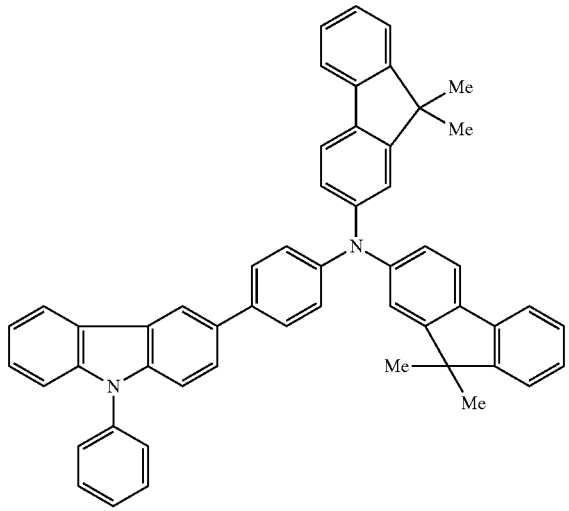
(2-12)
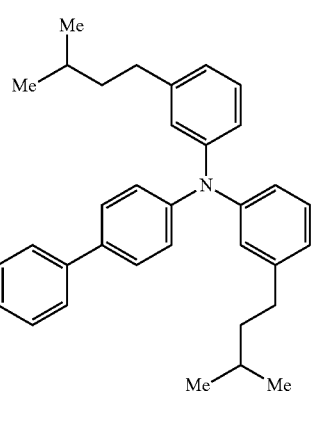

(2-13)

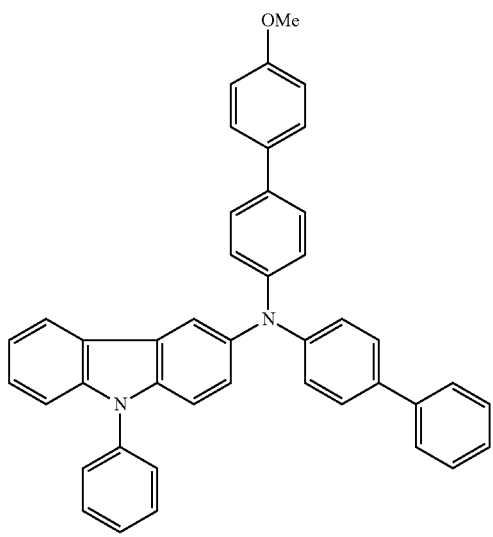

(2-14)

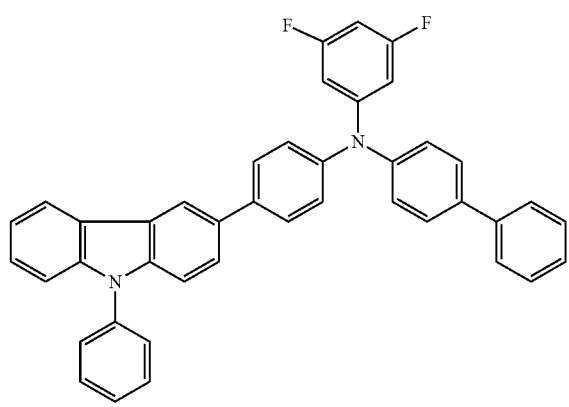

(2-15)

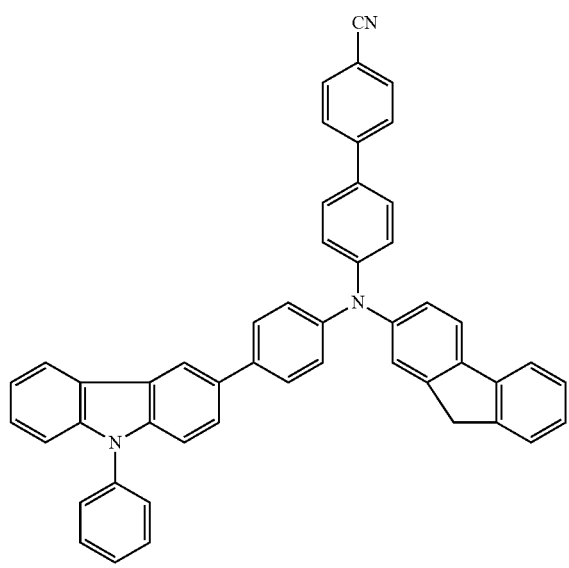

(2-16)

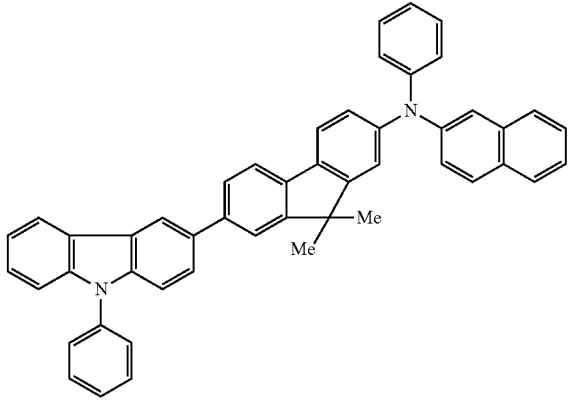

(2-17)

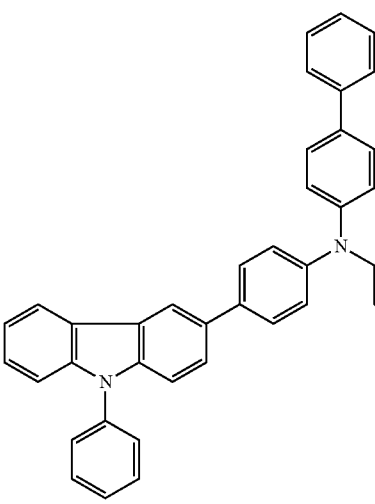

The middle hole transport layer 133 may include a compound represented by Formula 2, thereby improving the hole transporting function of the hole transport layer 130. Further, the emission property of the organic electroluminescent device 100 may also be improved. When a high concentration of a carbazole derivative such as a compound represented by Formula 2 is included in the hole transport layer 130, the emission lifetime of the organic electroluminescent device 100 may be increased.

2-1-3. Configuration of Emission Layer-Side Hole Transport Layer

The emission layer-side hole transport layer 135 may include a compound represented by the following Formula 1. The emission layer-side hole transport layer 135 may be formed, for example, on the middle hole transport layer 133, adjacent to the emission layer 140.

[Formula 1]

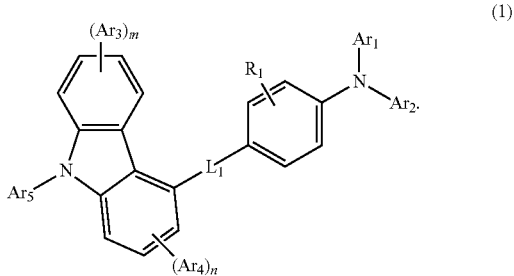

(1)

In Formula 1, $Ar_1$ to $Ar_5$ may each independently be selected from a substituted or unsubstituted aryl group having 6 to 50 carbon atoms for forming a ring and a substituted or unsubstituted heteroaryl group having 5 to 50 carbon atoms for forming a ring, where m may be an integer selected from 0 to 4, and n may be an integer selected from 0 to 3. $R_1$ may be selected from hydrogen, deuterium, a substituted or unsubstituted aryl group having 6 to 50 carbon atoms for forming a ring, a substituted or unsubstituted heteroaryl group having 5 to 50 carbon atoms for forming a ring, and a substituted or unsubstituted alkyl group having 1 to 50 carbon atoms. $L_1$ may be selected from a direct linkage, a substituted or unsubstituted arylene group having 6 to 18 carbon atoms for forming a ring, and a substituted or unsubstituted heteroarylene group having 5 to 15 carbon atoms for forming a ring.

Here, adjacent $Ar_1$ to $Ar_5$ may combine (e.g., couple) to form a ring. For example, adjacent $Ar_1$ and $Ar_2$ may form a ring, adjacent $Ar_3$ or $Ar_4$ groups may form a ring, and/or $Ar_3$ or $Ar_4$ may combine (e.g., couple) with an aromatic ring in a carbazole group to form another ring.

Non-limiting examples of $Ar_1$ to $Ar_5$ may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a furanyl group, a pyranyl group, a thienyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a pyrazolyl group, a dibenzofuranyl group, and a dibenzothienyl group. In some embodiments, $Ar_1$ to $Ar_5$ may each independently be selected from a phenyl group, a biphenyl group, a terphenyl group, a fluorenyl group, a carbazolyl group, and a dibenzofuranyl group.

Non-limiting examples of $R_1$ (other than hydrogen and deuterium) may include a phenyl group, a biphenyl group, a terphenyl group, a naphthyl group, an anthryl group, a phenanthryl group, a fluorenyl group, an indenyl group, a pyrenyl group, an acetonaphthenyl group, a fluoranthenyl group, a triphenylenyl group, a pyridyl group, a pyranyl group, a quinolyl group, an isoquinolyl group, a benzofuranyl group, a benzothienyl group, an indolyl group, a carbazolyl group, a benzoxazolyl group, a benzothiazolyl group, a quinoxalyl group, a benzoxazolyl group, a dibenzofuranyl group, and a dibenzothienyl group. In some embodiments, $R_1$ may be selected from a phenyl group, a biphenyl group, a terphenyl group, a fluorenyl group, a carbazolyl group, and a dibenzofuranyl group.

Non-limiting examples of $L_1$ (other than a direct linkage) may include the divalent forms of $Ar_1$ to $Ar_5$. Such non-limiting examples of $L_1$ may include a phenylene group, a biphenylylene group, a terphenylylene group, a naphthylene group, an anthrylene group, a phenanthrylene group, a fluorirene group, an indanediyl group, a pyrenediyl group, an acenaphthenediyl group, a fluoranthenediyl group, a triphenylenediyl group, a pyridinediyl group, a pyranediyl group, a quinolinediyl group, an isoquinolinediyl group, a benzofurandiyl group, a benzothiophenediyl group, an indolediyl group, a carbazolediyl group, a benzoxazolediyl group, a benzothiazolediyl group, a quinoxalinediyl group, a benzoimidazolediyl group, a dibenzofurandiyl group, etc. In some embodiments, a phenylene group, a terphenylene group, a fluorenediyl group, a carbazolediyl group, a dibenzofurandiyl group, etc.

Non-limiting examples of compounds represented by Formula 1 may include the following Compounds 1-1 to 1-28. However, the compounds represented by Formula 1 are not limited to Compounds 1-1 to 1-28:

1-1

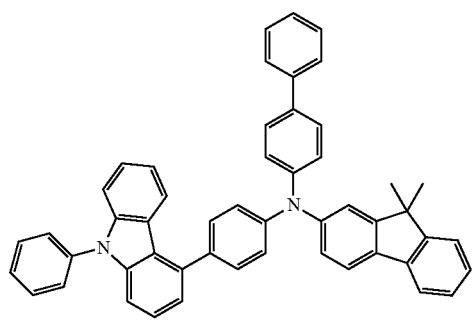

1-2

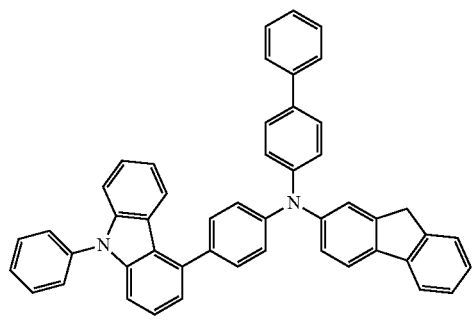

1-3

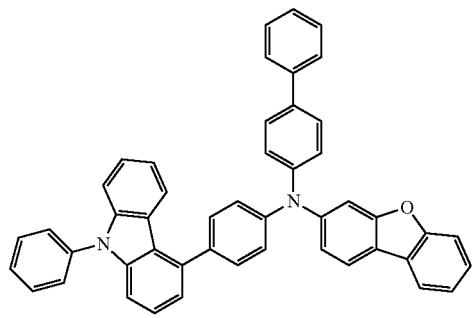

1-4
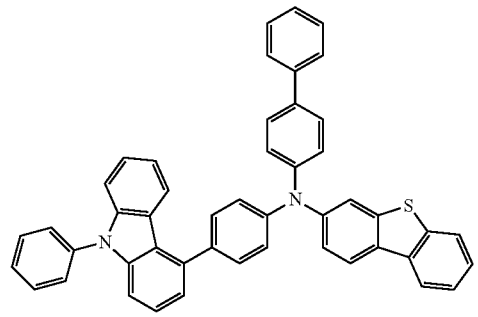
1-5
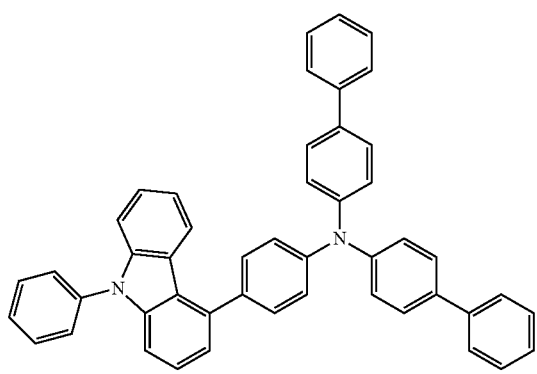
1-6
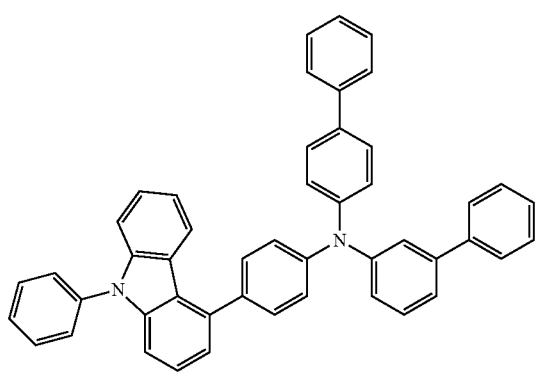
1-7
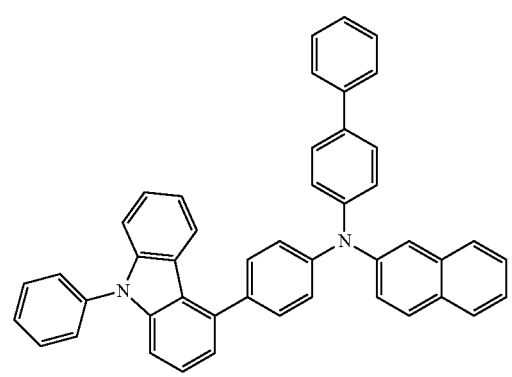
1-8
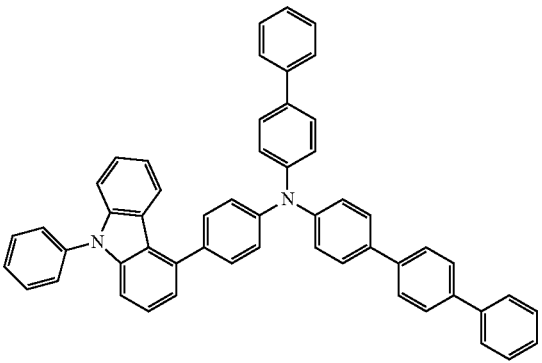
1-9
1-10
1-11
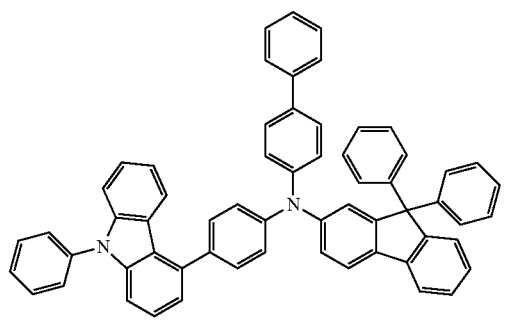

1-12
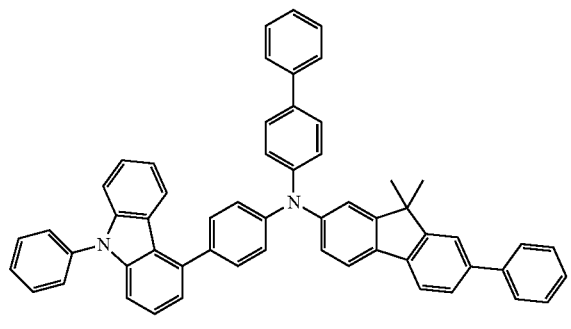
1-13
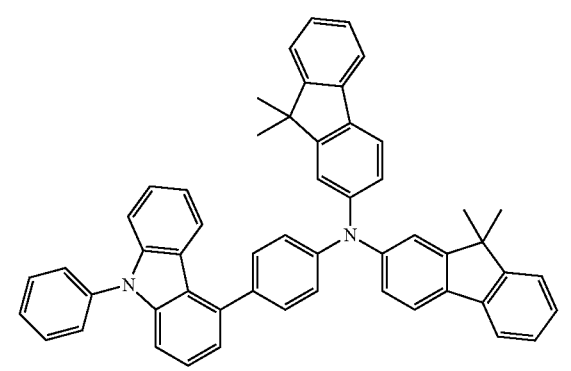
1-14
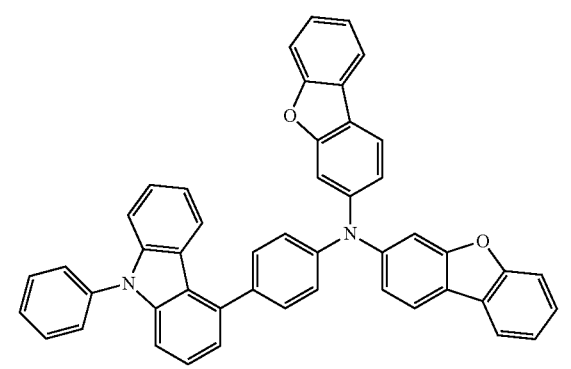
1-15
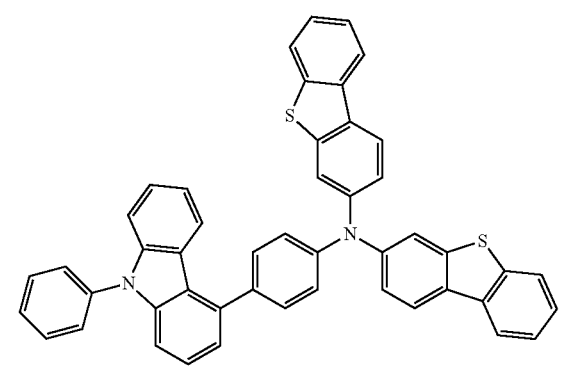
1-16
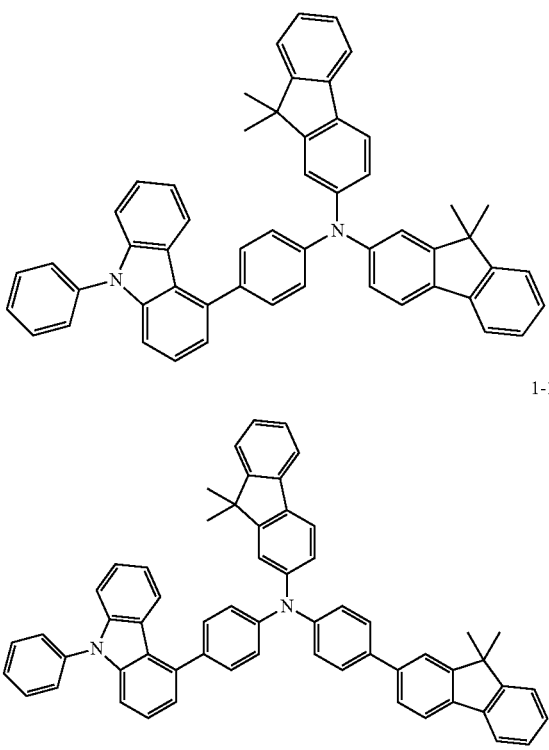
1-17
1-18
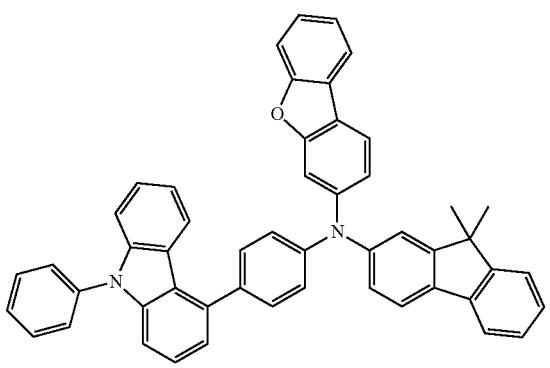
1-19
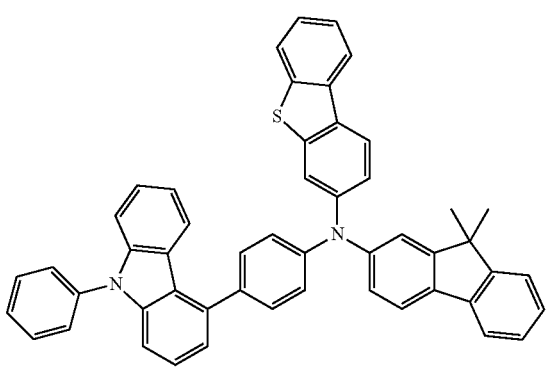

-continued
1-20
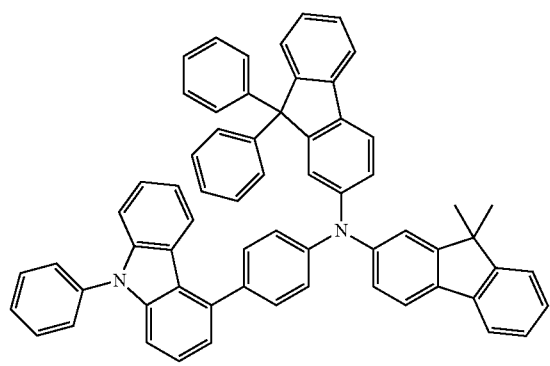
1-21
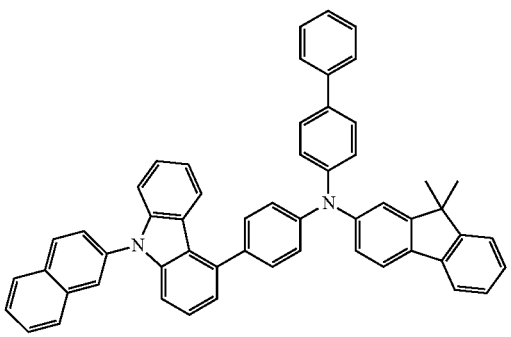
1-22
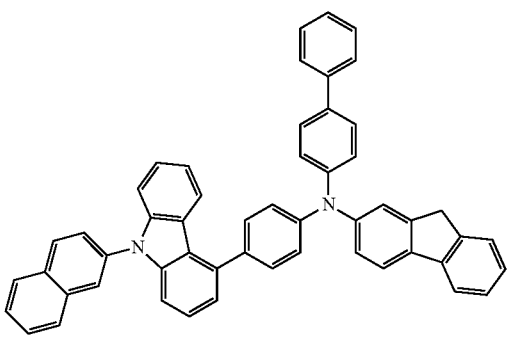
1-23
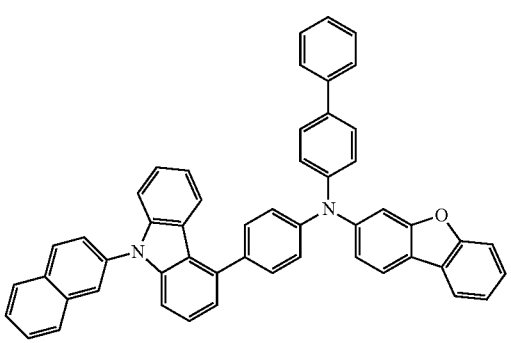
-continued
1-24
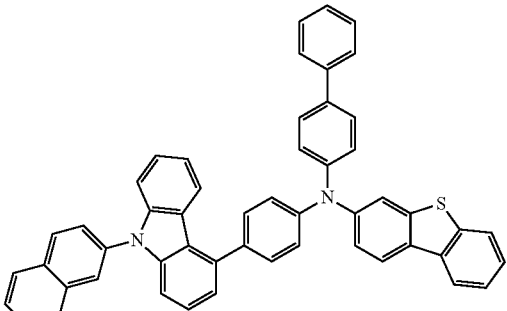
1-25
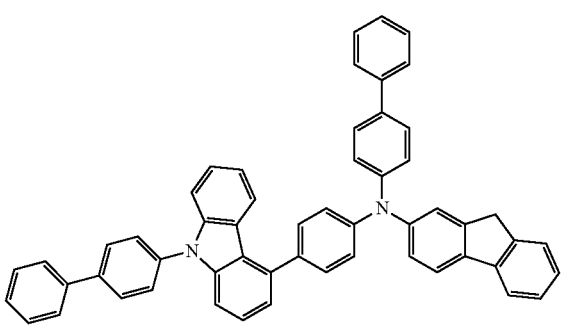
1-26
1-27
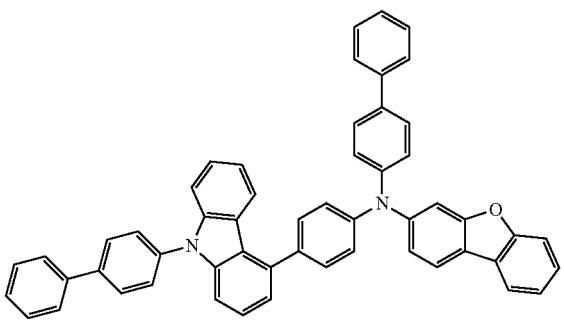

-continued 1-28

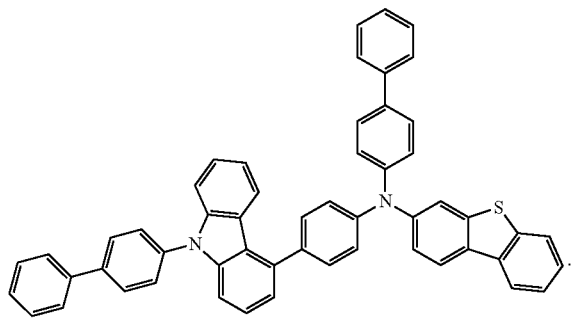

The emission layer-side hole transport layer 135 may include a compound represented by the above Formula 1 as an emission layer-side hole transport material. The emission layer-side hole transport layer 135 may passivate (e.g., protect) the hole transport layer 130 from electrons not consumed in the emission layer 140. When the emission layer-side hole transport layer 135 includes a compound represented by Formula 1, diffusion of energy in an excited state (e.g., excitons) generated in the emission layer 140 to the hole transport layer 130 may be prevented or reduced. Therefore, in this configuration, the emission layer-side hole transport layer 135 may improve the current flow tolerance of the hole transport layer 130.

The emission layer-side hole transport layer 135 may be formed near the emission layer 140, and in some embodiments, may be formed adjacent to the emission layer 140 to effectively prevent or reduce diffusion of electrons and/or energy (e.g., excitons) from the emission layer 140.

When the emission layer-side hole transport layer 135 includes a compound represented by Formula 1, the overall charge balance of the organic electroluminescent device 100 may be controlled, and diffusion of the electron accepting material included in the anode-side hole transport layer 131 to the emission layer 140 may be restrained. Accordingly, the emission layer-side hole transport layer 135 may improve the charge transport properties of the hole transport layer 130.

When the emission layer-side hole transport layer 135 includes a compound represented by Formula 1, the charge transport properties and current flow durability of the hole transport layer 130 may be improved, thereby improving the emission efficiency and emission lifetime of the organic electroluminescent device 100.

As described above, the hole transport layer 130 including the anode-side hole transport layer 131, the middle hole transport layer 133, and the emission layer-side hole transport layer 135 may contribute to the improvement of the current flow tolerance and hole transport of the organic electroluminescent device 100. Accordingly, the organic electroluminescent device 100 according to an embodiment of the present disclosure may have improved emission efficiency and emission lifetime.

An embodiment of an organic electroluminescent device 100 has been explained in detail above.

Examples

Hereinafter, the organic electroluminescent device according to example embodiments of the present disclosure will be explained with reference to examples and comparative examples. The following embodiments are provided only for illustration, and organic electroluminescent devices according to example embodiments of the present disclosure are not limited thereto.

1. An Embodiment of an Organic Electroluminescent Device Including an Anode-Side Hole Transport Layer Including an Anode-Side Hole Transport Material and an Electron Accepting Material Doped in the Anode-Side Hole Transport Material 1-1 Manufacture of Organic Electroluminescent Device An organic electroluminescent device according to an embodiment of the present disclosure was manufactured according to the following manufacturing method.

First, an ITO-glass substrate was patterned and washed in advance, followed by surface treatment using UV-Ozone ($O_3$). The thickness of the ITO layer (first electrode) on the glass substrate was about 150 nm. After ozone treatment, the substrate was washed and inserted into an evaporator for forming an organic layer, and an anode-side hole transport layer, a middle hole transport layer, an emission layer-side hole transport layer, an emission layer, and an electron transport layer were evaporated one by one at a vacuum degree of about $10^{-4}$ to about $10^{-5}$ Pa. The thickness of each of the anode-side hole transport layer, the middle hole transport layer, and the emission layer-side hole transport layer was about 10 nm. The thickness of each of the emission layer and the electron transport layer was about 25 nm. Then, the substrate was moved into an evaporator for forming a metal layer, and the electron injection layer and the second electrode were evaporated at a vacuum degree of about $10^{-4}$ to about $10^{-5}$ Pa. The thickness of the electron injection layer was about 1 nm, and the thickness of the second electrode was about 100 nm.

Here, the anode-side hole transport layer, the middle hole transport layer, and the emission layer-side hole transport layer collectively correspond to a hole transport layer with a laminated structure. In the Examples and Comparative Examples, the anode-side hole transport layer, middle hole transport layer, and emission layer-side hole transport layer were manufactured using the materials shown in Table 1.

In Table 1, for example, the entry "Compound 2-3, 4-15" means that Compound 2-3 was used as a hole transport material and doped with Compound 4-15 as an electron accepting material at about 3 mass % relative to the mass of the hole transport material.

In Table 1, Compounds 6-1, 6-2, and 6-3 refer to hole transport materials represented by the following formulae:

(6-1)

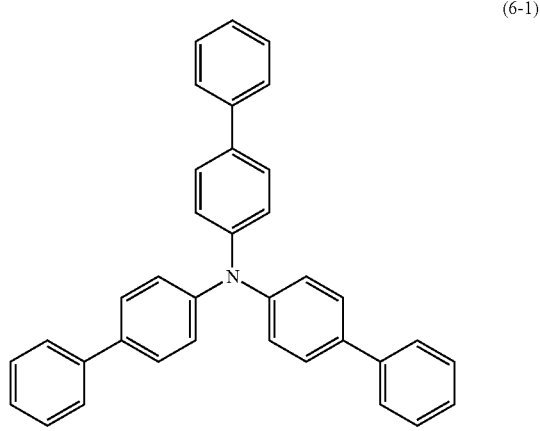

(6-2)

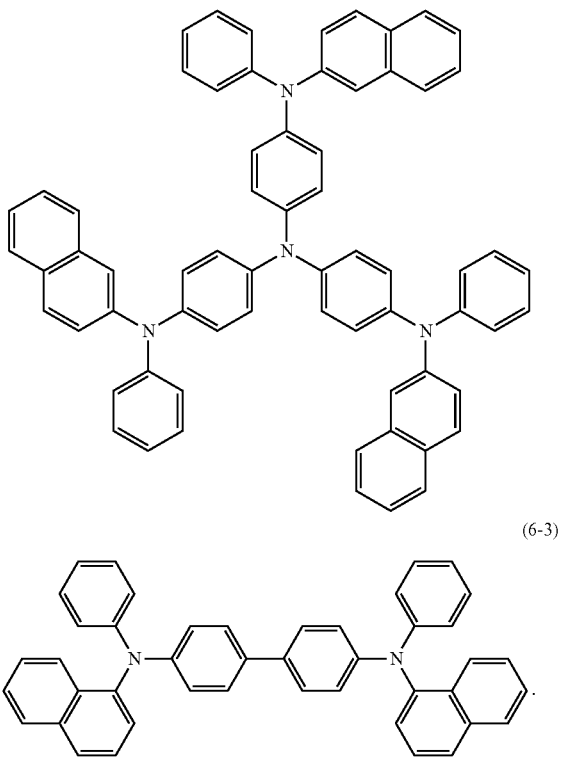

(6-3)

9,10-di(2-naphthyl)anthracene (ADN, Compound 3-2) was used as a host material in the emission layer, and 2,5,8,11-tetra-t-butylperylene (TBP) was used as a dopant material.

In some embodiments, the dopant material was added at about 3 mass % relative to the amount of the host material. An electron transport layer was formed using Alq3, an electron injection layer was formed using LiF, and a second electrode was formed using aluminum (Al).

1-2. Evaluation Results

The driving voltage, emission efficiency, and half-life of each organic electroluminescent device thus manufactured were evaluated. Evaluation results are shown in Table 2. The driving voltage and the emission efficiency in each Example and Comparative Example were measured at a current density of about 10 mA/cm². The half-life was measured and calculated using an initial luminance of about 1,000 cd/m².

The measurement was conducted using a Keithley Instruments Co. 2400 series source meter, a CS-200 color brightness photometer (Konica Minolta, measurement angle of 1°), and LabVIEW8.2 (National Instruments Japan) in a dark room.

TABLE 1

| | Anode-side hole transport layer | Middle hole transport layer | Emission layer-side hole transport layer |
|---|---|---|---|
| Example 1-1 | Compound 2-3, 4-15 | Compound 2-3 | Compound 1-1 |
| Example 1-2 | Compound 6-2, 4-15 | Compound 2-3 | Compound 1-1 |
| Example 1-3 | Compound 2-3, 4-15 | Compound 6-3 | Compound 1-1 |
| Example 1-4 | Compound 6-2, 4-15 | Compound 6-3 | Compound 1-3 |
| Example 1-5 | Compound 6-2, 4-15 | Compound 6-3 | Compound 1-14 |
| Comparative Example 1-1 | Compound 2-3, 4-15 | Compound 1-1 | Compound 2-3 |

TABLE 1-continued

| | Anode-side hole transport layer | Middle hole transport layer | Emission layer-side hole transport layer |
|---|---|---|---|
| Comparative Example 1-2 | Compound 2-3 | Compound 2-3 | Compound 1-1 |
| Comparative Example 1-3 | Compound 2-3, 4-15 | Compound 2-3 | Compound 6-1 |
| Comparative Example 1-4 | Compound 6-2, 4-15 | Compound 6-3 | Compound 6-1 |
| Comparative Example 1-5 | Compound 2-3 | Compound 2-3, 4-15 | Compound 1-1 |

TABLE 2

| | Voltage (V) | Emission efficiency (cd/A) | Half-life (h) |
|---|---|---|---|
| Example 1-1 | 6.2 | 7.5 | 4,100 |
| Example 1-2 | 6.4 | 7.5 | 3,300 |
| Example 1-3 | 6.4 | 7.4 | 3,100 |
| Example 1-4 | 6.2 | 7.5 | 4,300 |
| Example 1-5 | 6.1 | 7.6 | 3,700 |
| Comparative Example 1-1 | 6.3 | 7.0 | 2,400 |
| Comparative Example 1-2 | 7.4 | 6.8 | 2,200 |
| Comparative Example 1-3 | 6.4 | 7.3 | 2,300 |
| Comparative Example 1-4 | 6.2 | 7.1 | 2,200 |
| Comparative Example 1-5 | 7.9 | 5.6 | 3,100 |

Referring to Tables 1 and 2, the emission efficiency was improved and the half-life was increased for Examples 1-1 to 1-5 when compared with Comparative Examples 1-1 to 1-5. Accordingly, when the anode-side hole transport layer, the middle hole transport layer, and the emission layer-side hole transport layer are included between the first electrode and the emission layer, the emission efficiency and emission lifetime of the organic electroluminescent device may be improved.

The properties of Examples 1-1 were generally improved compared to Comparative Examples 1-2 and 1-5. Comparative Examples 1-2 and 1-5 did not include an electron accepting material (for example, Compound 4-15) doped in the anode-side hole transport layer. Accordingly, the properties of a device may be improved when an electron accepting material is doped in the anode-side hole transport layer.

In addition, the properties of Example 1-1 were generally improved compared to Comparative Example 1-1. In Comparative Example 1-1, the compounds included in the middle hole transport layer and the emission layer-side hole transport layer were switched compared to the compounds in Example 1-1 (e.g., the positions of the middle hole transport layer and the emission layer-side hole transport layer were effectively switched). Accordingly, the properties of a device may be improved when the emission layer-side hole transport layer including a compound represented by Formula 1 is adjacent to the emission layer.

The properties of Examples 1-1 and 1-2 were generally improved compared to Comparative Example 1-3, and the properties of Examples 1-4 and 1-5 were generally improved compared to Comparative Example 1-4. In Comparative Examples 1-3 and 1-4, the hole transport material included in the emission layer-side hole transport layers was a common hole transport material (Compound 6-1) instead of a compound represented by Formula 1. Accordingly, the properties of a device may be improved when the emission layer-side hole transport layer includes a compound represented by Formula 1.

The properties of Example 1-1 were generally improved compared to Example 1-2. In Example 1-2, the anode-side hole transport material included in the anode-side hole transport layer was a common hole transport material (Compound 6-2) that does not include a carbazolyl group, instead of a compound represented by Formula 2. Accordingly, the properties of a device may be improved when the anode-side hole transport material included in the anode-side hole transport layer is a compound represented by Formula 2.

The properties of Example 1-1 were generally improved compared to Example 1-3. In Example 1-3, the middle hole transport material included in the middle hole transport layer was a common hole transport material (Compound 6-3) that does not include a carbazolyl group, instead of a compound represented by Formula 2. Accordingly, the properties of a device may be improved when the middle hole transport material included in the middle hole transport layer is a compound represented by Formula 2.

As described above, according to an embodiment of the present disclosure, when an anode-side hole transport layer doped with an electron accepting material, a middle hole transport layer, and an emission layer-side hole transport layer including a compound represented by Formula 1 are laminated between a first electrode (anode) and an emission layer, the emission efficiency and emission lifetime of an organic electroluminescent device may be improved.

When the emission layer-side hole transport layer includes a compound represented by Formula 1, the emission layer-side hole transport layer may passivate (e.g., protect) the hole transport layer from electrons not consumed in the emission layer, may prevent or reduce the diffusion of excited state energy (e.g., excitons) generated in the emission layer to the hole transport layer, and may control the overall charge balance of a device. In some embodiments, when an emission layer-side hole transport layer including a compound represented by Formula 1 is adjacent to the first electrode (anode), the emission layer-side hole transport layer may restrain or reduce diffusion of the electron accepting material in the anode-side hole transport layer to the emission layer, and the emission efficiency and emission lifetime of the organic electroluminescent device may be improved.

2. An Embodiment of an Organic Electroluminescent Device Including an Anode-Side Hole Transport Layer Including an Electron Accepting Material 2-1. Manufacture of Organic Electroluminescent Device An organic electroluminescent device according to an embodiment of the present disclosure was manufactured by the following method.

First, an ITO-glass substrate was patterned and washed in advance, followed by surface treatment using UV-Ozone ($O_3$). The thickness of the ITO layer (first electrode) on the glass substrate was about 150 nm. After ozone treatment, the substrate was washed and inserted into an evaporator for forming an organic layer, and an anode-side hole transport layer, a middle hole transport layer, an emission layer-side hole transport layer, an emission layer, and an electron transport layer were evaporated one by one at a vacuum degree of about $10^{-4}$ to about $10^{-5}$ Pa. The thickness of each of the anode-side hole transport layer, the middle hole transport layer, and the emission layer-side hole transport layer was about 10 nm. The thickness of each of the emission layer and the electron transport layer was about 25 nm. Then, the substrate was moved into an evaporator for forming a metal layer, and the electron injection layer and the second electrode were evaporated at a vacuum degree of about $10^{-4}$ to about $10^{-5}$ Pa. The thickness of the electron injection layer was about 1 nm, and the thickness of the second electrode was about 100 nm.

Here, the anode-side hole transport layer, the middle hole transport layer, and the emission layer-side hole transport layer collectively correspond to a hole transport layer with a laminated structure. In the Examples and Comparative Examples, the anode-side hole transport layer, middle hole transport layer, and emission layer-side hole transport layer were manufactured using the materials shown in Table 3.

In Table 3, Compounds 6-1 and 6-2 refer to hole transport materials represented by the following formulae:

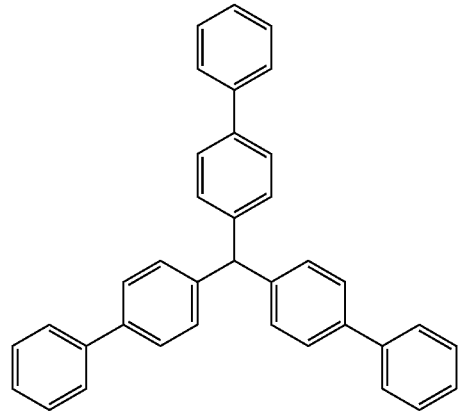

(6-1)

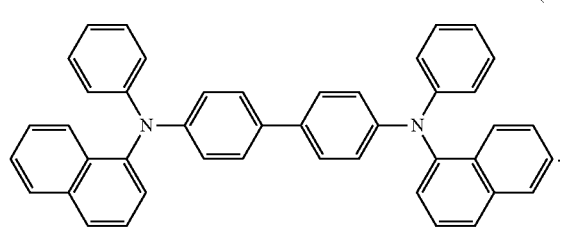

(6-2)

9,10-di(2-naphthyl)anthracene (ADN, Compound 3-2) was used as a host material in the emission layer, and 2,5,8,11-tetra-t-butylperylene (TBP) was used as a dopant material. In some embodiments, the dopant material was added at about 3 mass % relative to the amount of the host material. An electron transport layer was formed using Alq3, an electron injection layer was formed using LiF, and a second electrode was formed using aluminum (Al).

2-2. Evaluation Results

The driving voltage, emission efficiency, and half-life of each organic electroluminescent device thus manufactured were evaluated. Evaluation results are shown in Table 4. The driving voltage and the emission efficiency in each Example and Comparative Example were measured at a current density of about 10 mA/cm$^2$. The half-life was measured and calculated using an initial luminance of about 1,000 cd/m$^2$.

The measurements were conducted using a Keithley Instruments Co. 2400 series source meter, a CS-200 color brightness photometer (Konica Minolta, measurement angle of 1°), and LabVIEW8.2 (National Instruments Japan) in a dark room.

TABLE 3

|  | Anode-side hole transport layer | Middle hole transport layer | Emission layer-side hole transport layer |
| --- | --- | --- | --- |
| Example 2-1 | Compound 4-15 | Compound 2-3 | Compound 1-1 |
| Example 2-2 | Compound 4-15 | Compound 6-2 | Compound 1-1 |
| Example 2-3 | Compound 4-15 | Compound 2-3 | Compound 1-3 |
| Example 2-4 | Compound 4-15 | Compound 2-3 | Compound 1-14 |
| Comparative Example 2-1 | Compound 4-15 | Compound 1-1 | Compound 2-3 |
| Comparative Example 2-2 | Compound 1-1 | Compound 4-15 | Compound 1-1 |
| Comparative Example 2-3 | Compound 4-15 | Compound 2-3 | Compound 6-1 |
| Comparative Example 2-4 | Compound 2-3 | Compound 4-15 | Compound 1-1 |

TABLE 4

|  | Voltage (V) | Emission efficiency (cd/A) | Half-life (h) |
| --- | --- | --- | --- |
| Example 2-1 | 6.5 | 7.7 | 3,300 |
| Example 2-2 | 6.5 | 7.6 | 3,200 |
| Example 2-3 | 6.5 | 7.8 | 3,400 |
| Example 2-4 | 6.5 | 7.7 | 3,200 |
| Comparative Example 2-1 | 6.4 | 6.3 | 1,600 |
| Comparative Example 2-2 | 6.7 | 6.5 | 2,100 |
| Comparative Example 2-3 | 6.5 | 7.3 | 2,400 |
| Comparative Example 2-4 | 7.5 | 6.1 | 1,900 |

Referring to the results in Table 4, the emission efficiencies were improved and the half-lives were increased for Examples 2-1 to 2-4 when compared with Comparative Examples 2-1 to 2-4. Accordingly, when the anode-side hole transport layer, the middle hole transport layer, and the emission layer-side hole transport layer are included between the first electrode and the emission layer, the emission efficiency and emission lifetime of the organic electroluminescent device may be improved.

The properties of Examples 2-1, 2-3, and 2-4 were generally improved compared to Comparative Example 2-3. In Comparative Example 2-3, the emission layer-side hole transport material included in the emission layer-side hole transport layer was a common hole transport material (Compound 6-1), instead of the compound represented by Formula 1. Accordingly, the properties of a device may be improved when the emission layer-side hole transport layer includes a compound represented by Formula 1.

The properties of Example 2-1 were generally improved compared to Comparative Example 2-1. In Comparative Example 2-1, the compounds included in the middle hole transport layer and the emission layer-side hole transport layer were switched compared to the compounds of Example 2-1 (e.g., the positions of the middle hole transport layer and the emission layer-side hole transport layer were effectively switched). Accordingly, the properties of a device may be improved when the emission layer-side hole transport layer including a compound represented by Formula 1 is adjacent to the emission layer.

The properties of Example 2-1 were generally improved compared to with Comparative Examples 2-2 and 2-4. In Comparative Example 2-2, a hole transport layer including an electron accepting material (Compound 4-15), was positioned between hole transport layers including Compound 1-1. In Comparative Example 2-4, a hole transport layer including an electron accepting material Compound 4-15 was positioned between anode-side hole transport layer including Compound 2-3 and emission layer-side hole transport layer including Compound 1-1. Accordingly, the properties of a device may be improved when the hole transport layer including an electron accepting material is adjacent to the first electrode (anode) (e.g., is the anode-side hole transport layer).

The properties of Example 2-1 were generally improved compared to Example 2-2. In Example 2-2, a common hole transport material (Compound 6-2) was used instead of Compound 2-3 as the middle hole transport material included in the middle hole transport layer. Accordingly, the properties of a device may be improved when the middle hole transport layer includes a hole transport material compound represented by Formula 2.

As described above, according to an embodiment of the present disclosure, when an anode-side hole transport layer including an electron accepting material, a middle hole transport layer, and an emission layer-side hole transport layer including a compound represented by Formula 1 are laminated between a first electrode (anode) and an emission layer, the emission efficiency and emission lifetime of an organic electroluminescent device may be improved.

When the emission layer-side hole transport layer includes a compound represented by Formula 1, the emission layer-side hole transport layer may passivate (e.g., protect) the hole transport layer from electrons not consumed in the emission layer, may prevent or reduce the diffusion of excited state energy (e.g., excitons) generated in the emission layer to the hole transport layer, and may control the overall charge balance of a device. In some embodiments, when the emission layer-side hole transport layer including the compound represented by Formula 1 is adjacent to the first electrode (anode), the emission layer-side hole transport layer may restrain or reduce diffusion of the electron accepting material in the anode-side hole transport layer to the emission layer.

In view of the foregoing and according to certain embodiments, when an anode-side hole transport layer, a middle hole transport layer, and an emission layer-side hole transport layer are included between an anode and an emission layer, the emission efficiency and emission lifetime of an organic electroluminescent device may be improved.

As used herein, expressions such as "at least one of", "one of", "at least one selected from", and "one selected from", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more example embodiments of the present disclosure have been described with reference to the drawings, it will be understood by those of ordinary skill in the art that the present disclosure should not be limited to these example embodiments, but various changes and modifications can be made within the spirit and scope of the present disclosure as defined by the following claims and equivalents thereof.

What is claimed is:

1. An organic electroluminescent device comprising:
   an anode;
   an emission layer;
   an anode-side hole transport layer between the anode and the emission layer and directly adjacent to the anode, the anode-side hole transport layer comprising an anode-side hole transport material and an electron accepting material doped in the anode-side hole transport material;
   a middle hole transport layer between the anode-side hole transport layer and the emission layer, the middle hole transport layer consisting of a middle hole transport material; and
   an emission layer-side hole transport layer between the middle hole transport layer and the emission layer, the emission layer-side hole transport layer being directly adjacent to the emission layer,
   wherein the middle hole transport layer is directly between the anode-side hole transport layer and the emission layer-side hole transport layer,
   the emission layer-side hole transport layer consists of an emission layer-side hole transport material represented by at least one selected from Compounds 1-1 to 1-28,
   the middle hole transport material is at least one selected from Compounds 2-1 to 2-17, and
   the emission layer-side hole transport material is different from the middle hole transport material:

1-1

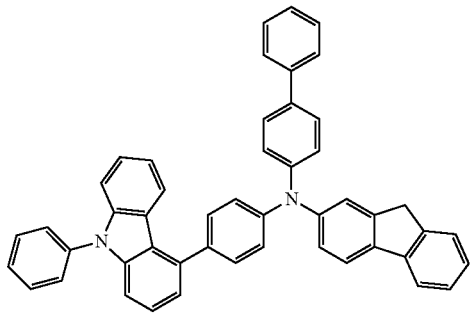

1-2

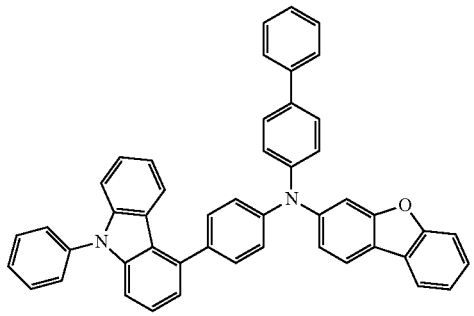

1-3

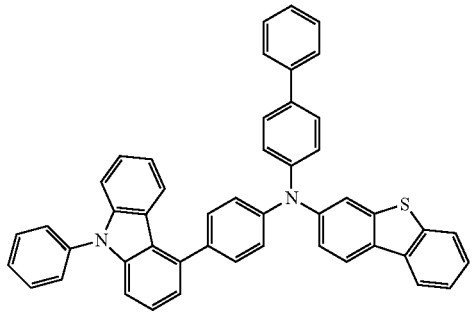

1-4

1-5

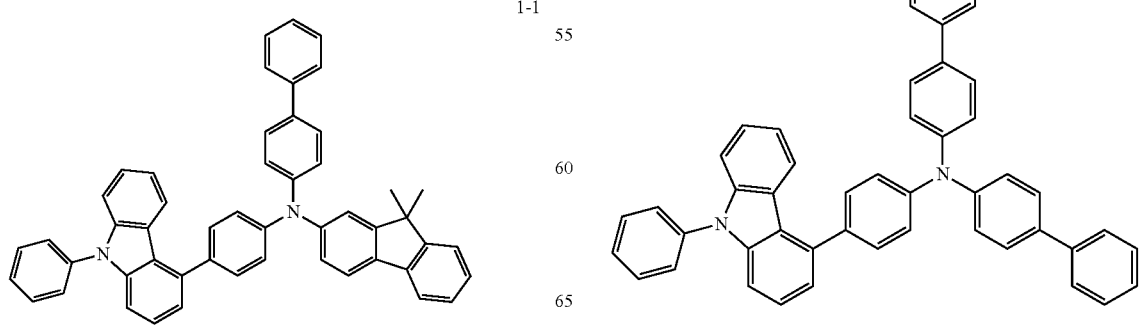

1-6
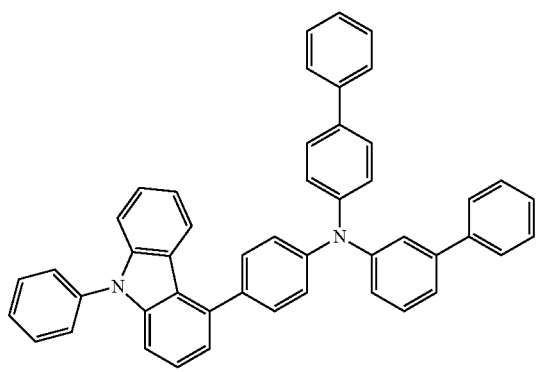
1-7
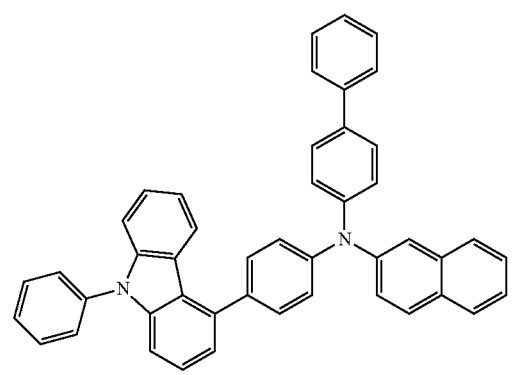
1-8
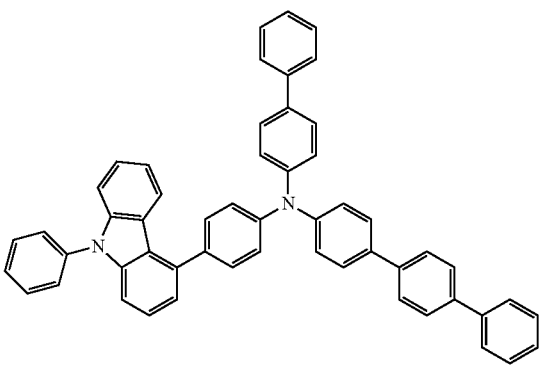
1-9
1-10
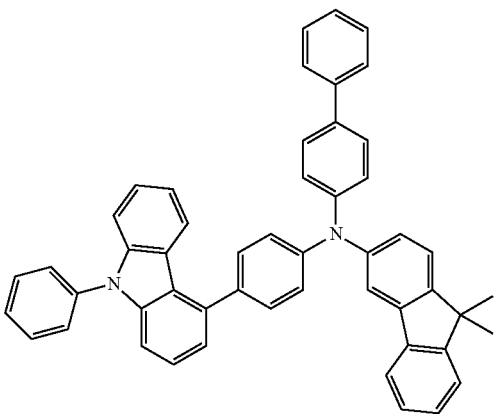
1-11
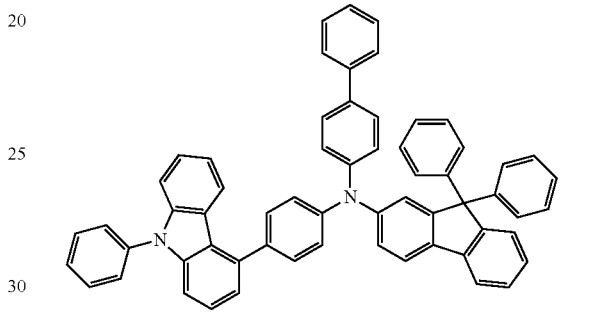
1-12
1-13
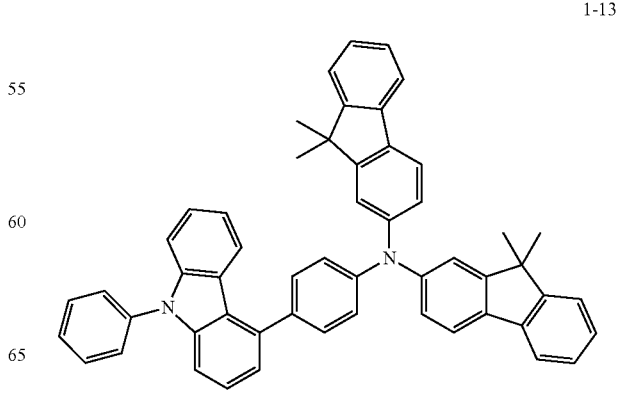

1-14
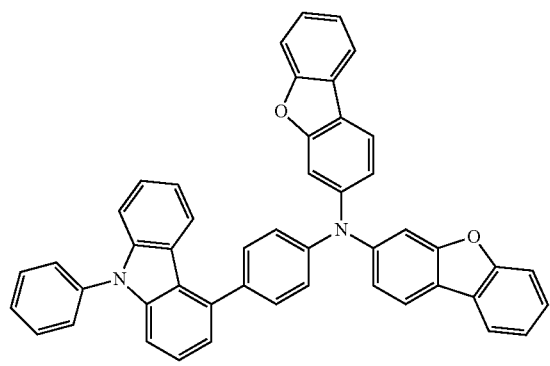
1-15
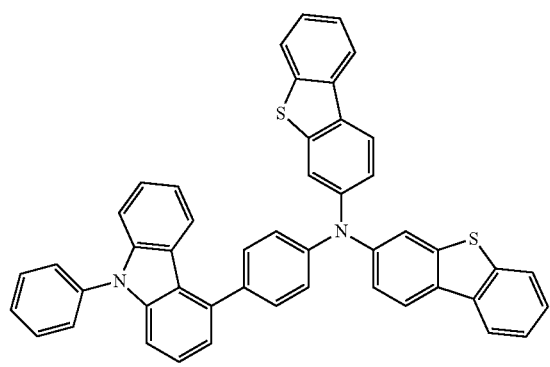
1-16
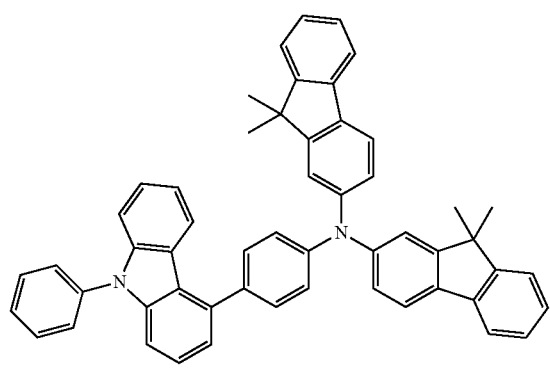
1-17
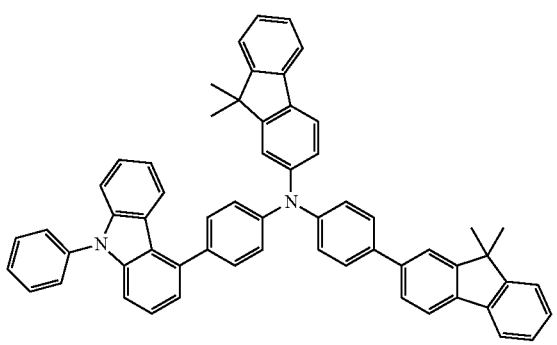
1-18
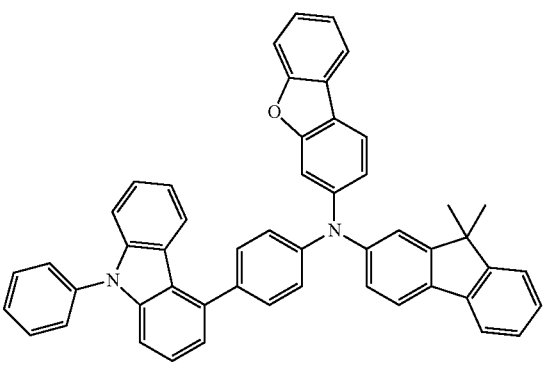
1-19
1-20
1-21
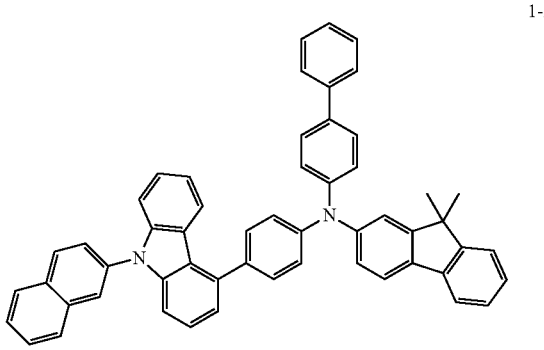

-continued
1-22
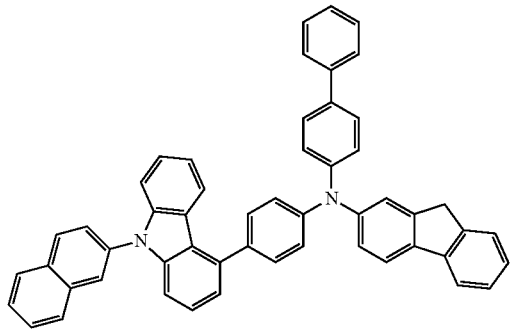
1-23
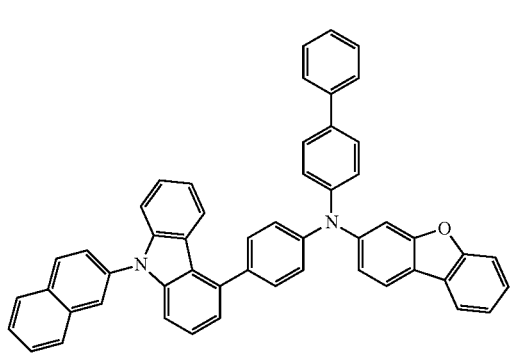
1-24
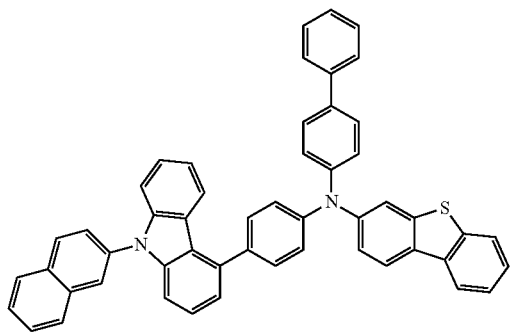
1-25
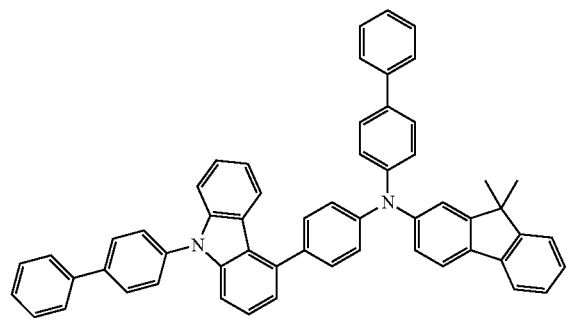
-continued
1-26
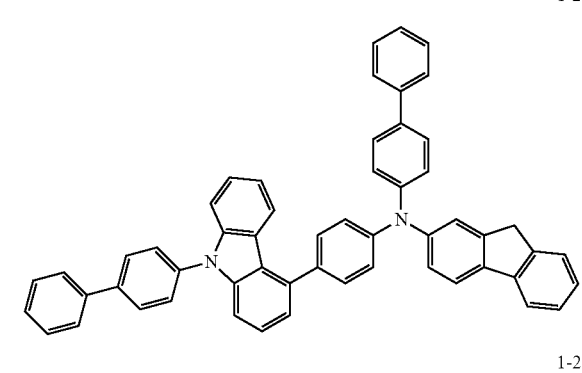
1-27
1-28
(2-1)
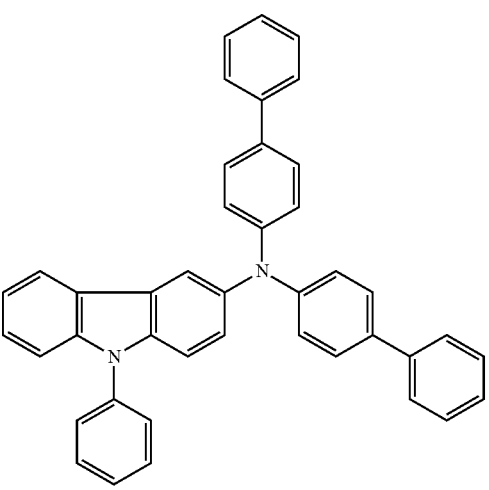

(2-2)
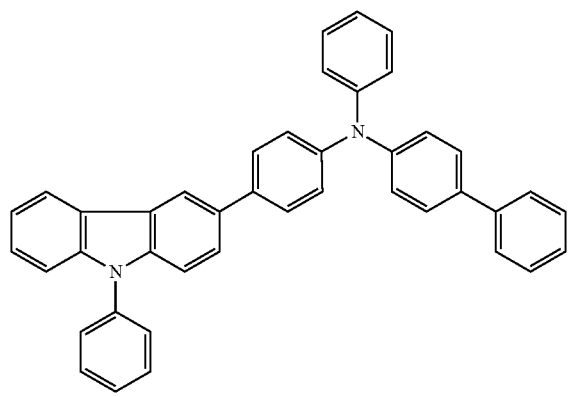
(2-3)
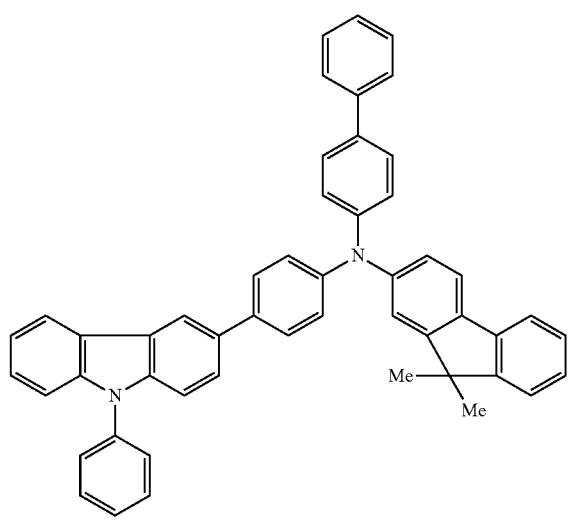
(2-4)
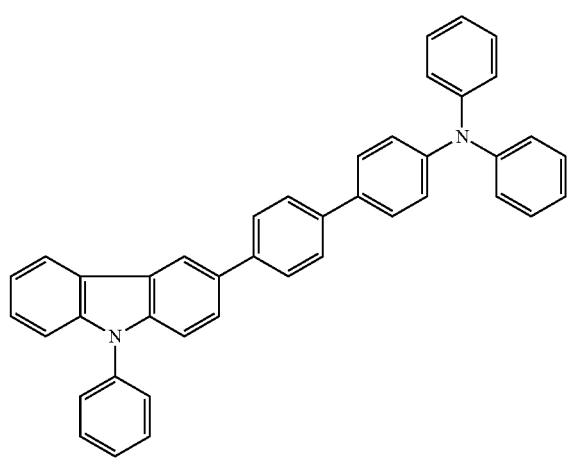
(2-5)
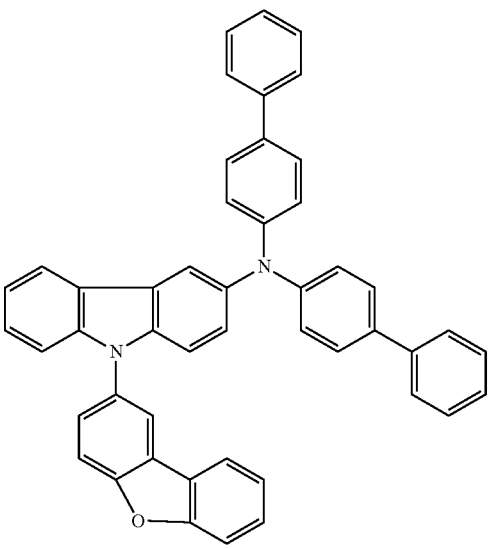
(2-6)
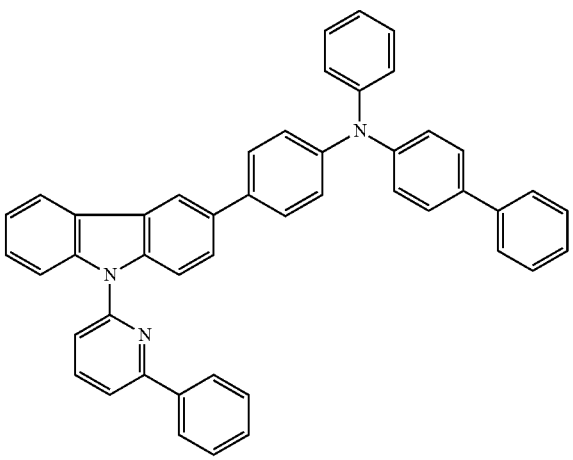
(2-7)
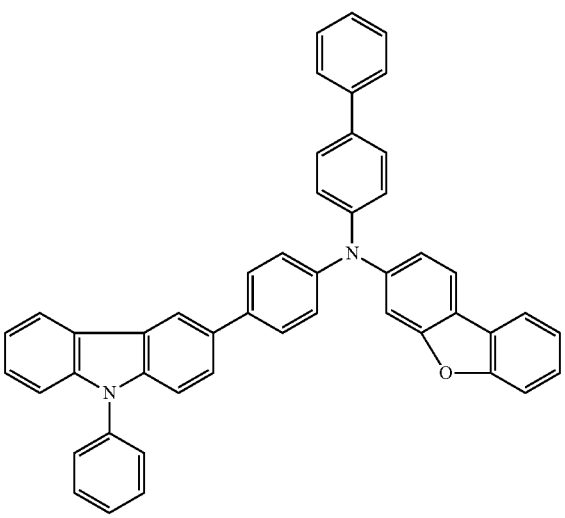

(2-8)
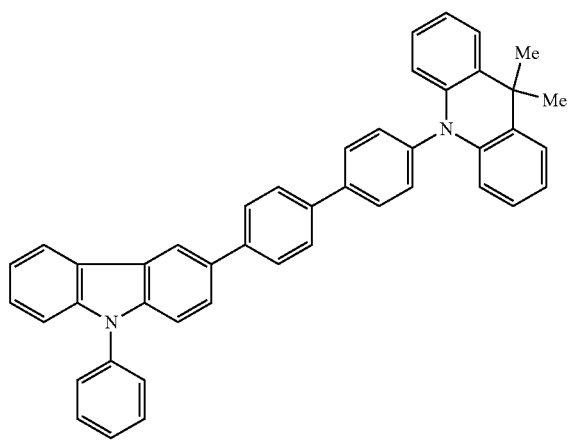
(2-9)
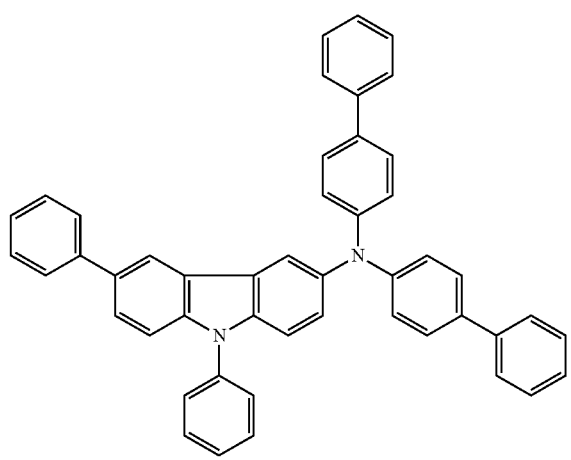
(2-10)
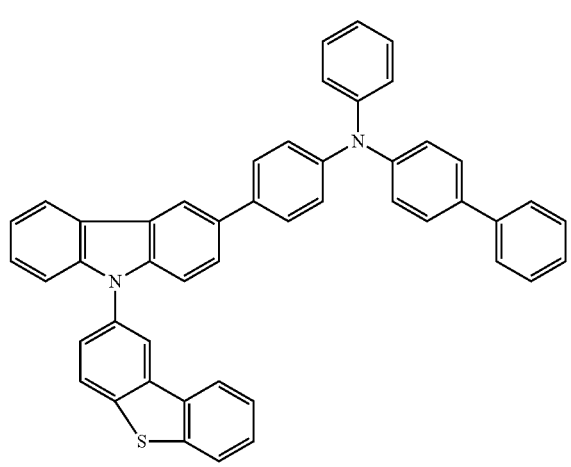
(2-11)
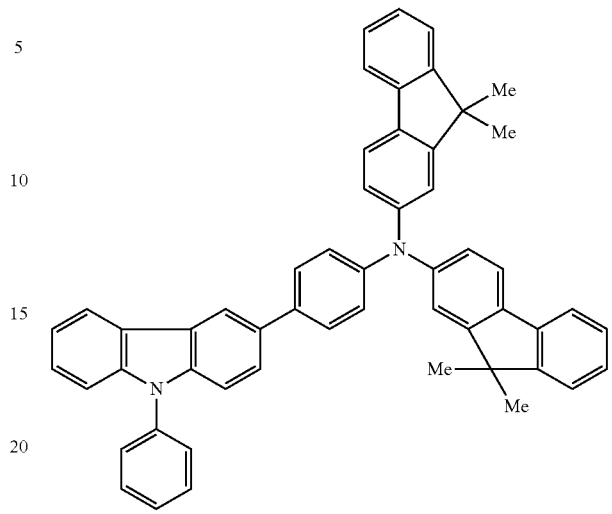
(2-12)
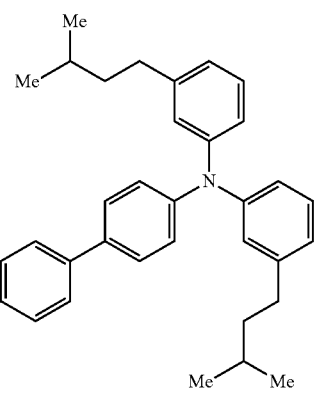
(2-13)
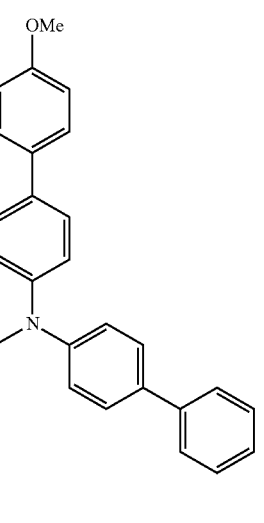

-continued
(2-14)
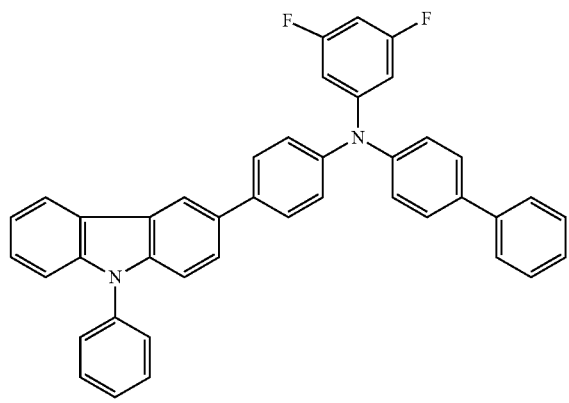
(2-15)
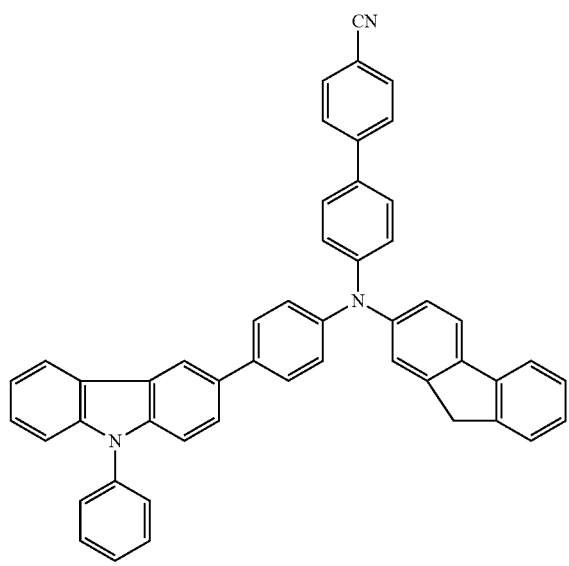
(2-16)
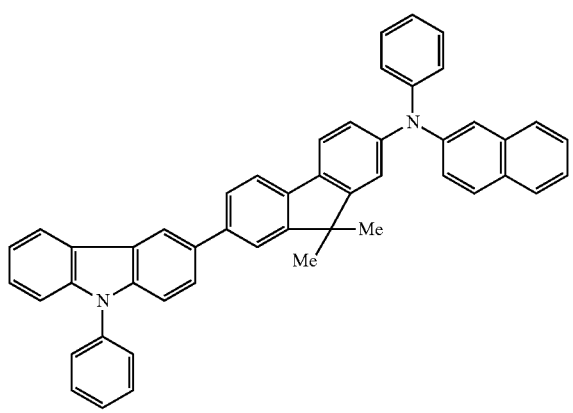
-continued
(2-17)
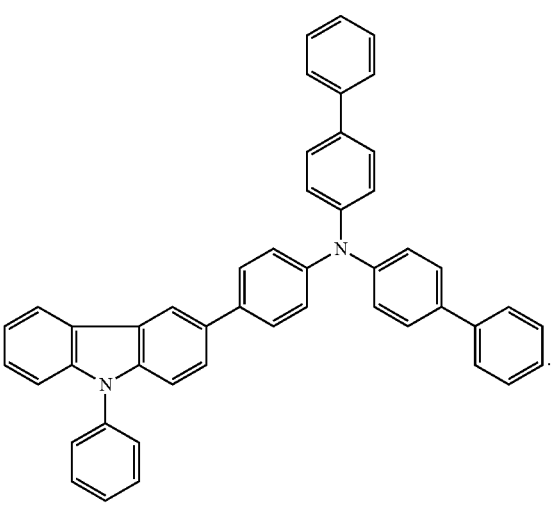
2. The organic electroluminescent device of claim 1, wherein the electron accepting material has a lowest unoccupied molecular orbital (LUMO) energy level at about −9.0 eV to about −4.0 eV.
3. The organic electroluminescent device of claim 1, wherein the electron accepting material is at least one selected from Compounds 4-1 to 4-14:
(4-1)
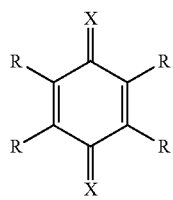
(4-2)
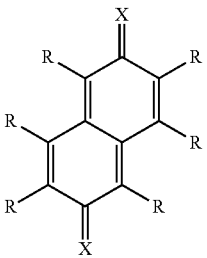
(4-3)
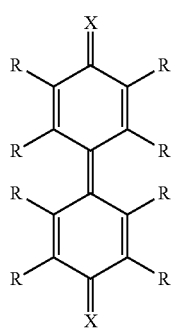

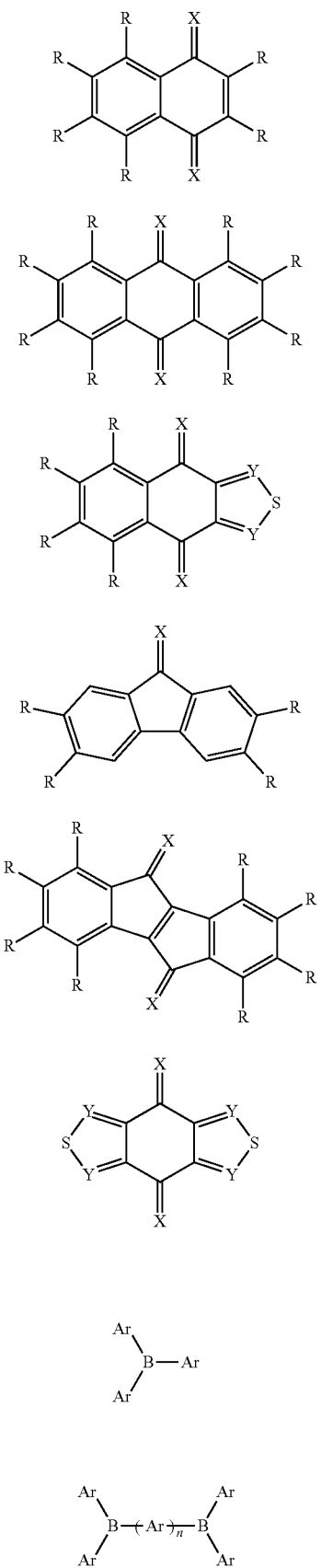

(4-4)
(4-5)
(4-6)
(4-7)
(4-8)
(4-9)
(4-10)
(4-11)

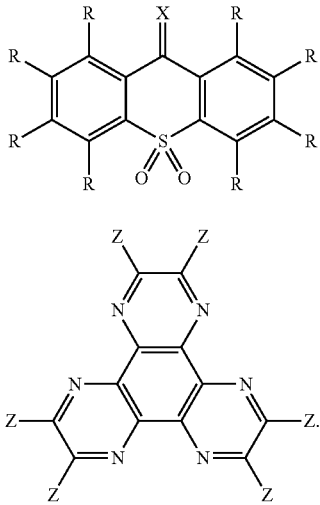

(4-12)
(4-13)
(4-14)

wherein R is selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, an aryl group having 6 to 50 carbon atoms for forming a ring, and a heteroaryl group having 5 to 50 carbon atoms for forming a ring, X is one selected from the substituents represented by Formulae X1 to X7:

 X1

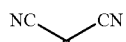 X2

 X3

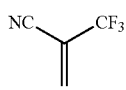 X4

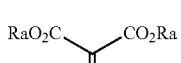 X5

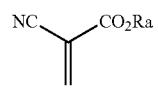 X6

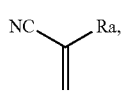

Y is selected from a methine group (—CH=) and nitrogen (—N=),

Z is selected from a pseudohalogen and sulfur,

Ar is selected from a substituted aryl group with an electron withdrawing group, an unsubstituted aryl group having 6 to 50 carbon atoms for forming a ring, and a substituted or unsubstituted heteroaryl group having 5 to 50 carbon atoms for forming a ring, n is an integer selected from 0 to 10, and in Formulae X1 to X7, Ra is selected from hydrogen, deuterium, a halogen atom, an alkyl fluoride having 1 to 50 carbon atoms, a cyano group, an alkoxy group having 1 to 50 carbon atoms, an alkyl group having 1 to 50 carbon atoms, a substituted or unsubstituted aryl group having 6 to 50 carbon atoms for forming a ring, and a substituted or unsubstituted heteroaryl group having 5 to 50 carbon atoms for forming a ring.

4. The organic electroluminescent device of claim 1, wherein the anode-side hole transport material is at least one selected from Compounds 2-1 to 2-17:

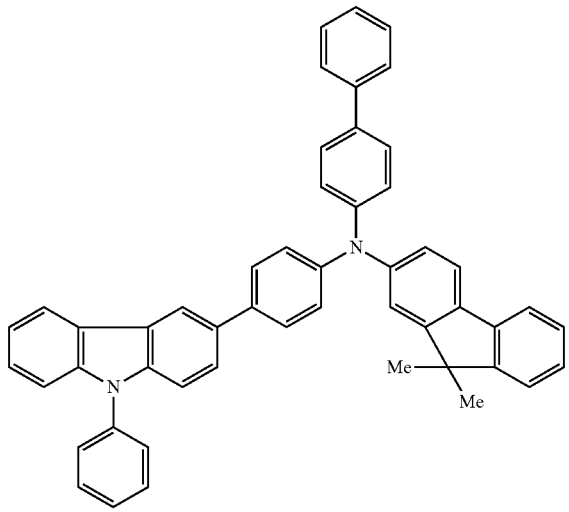

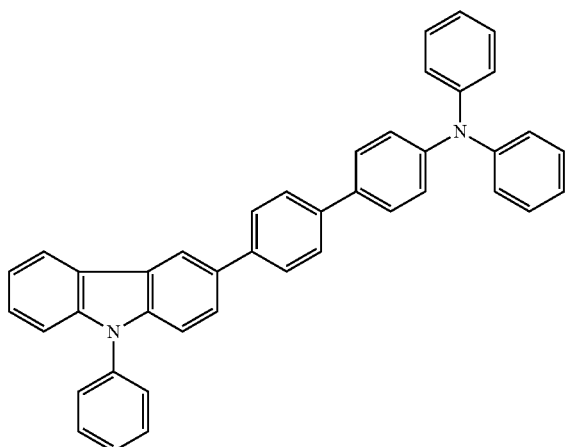

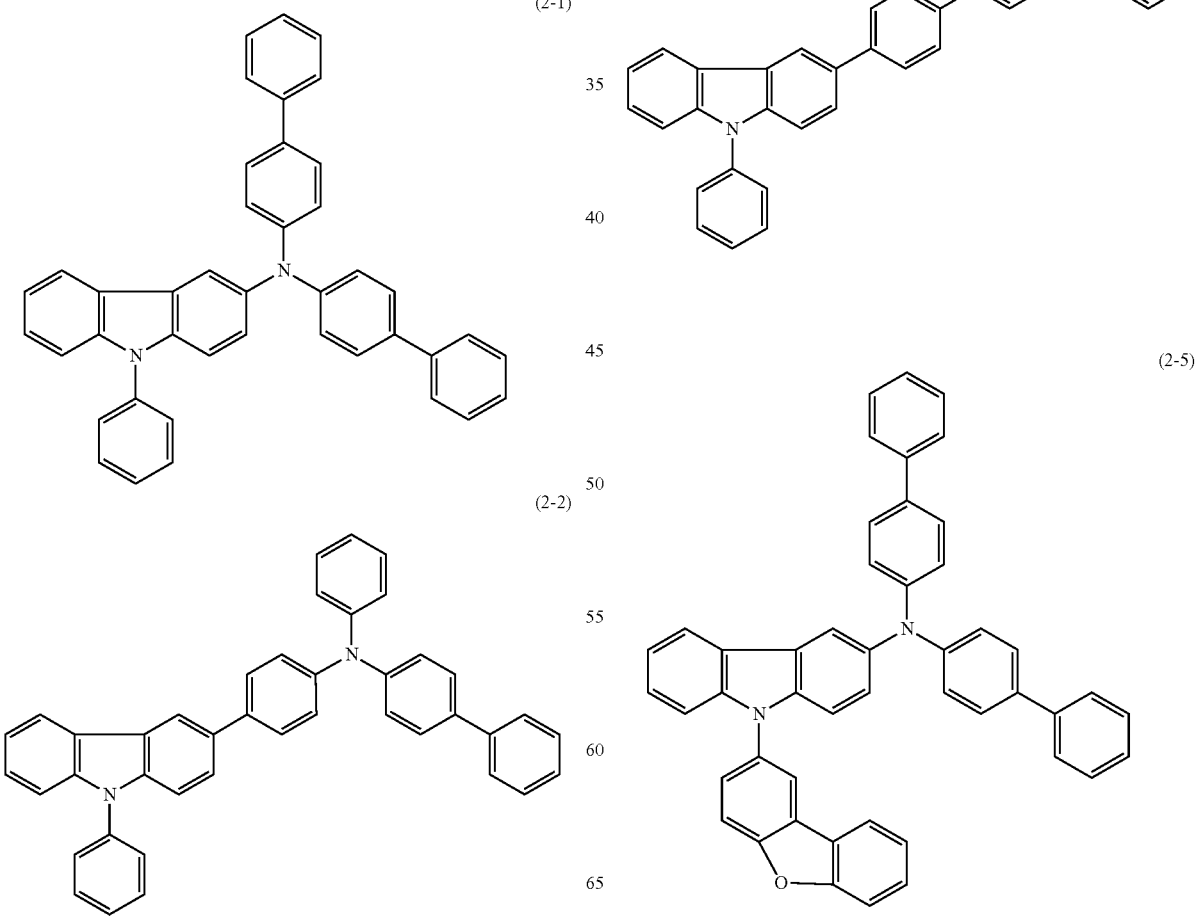

(2-6)
(2-7)
(2-8)
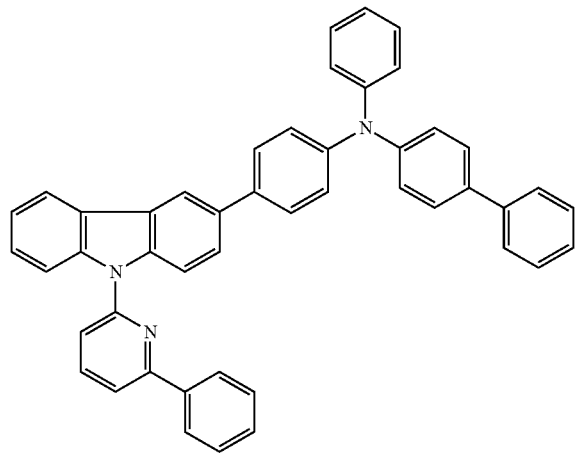
(2-9)
(2-10)
(2-11)
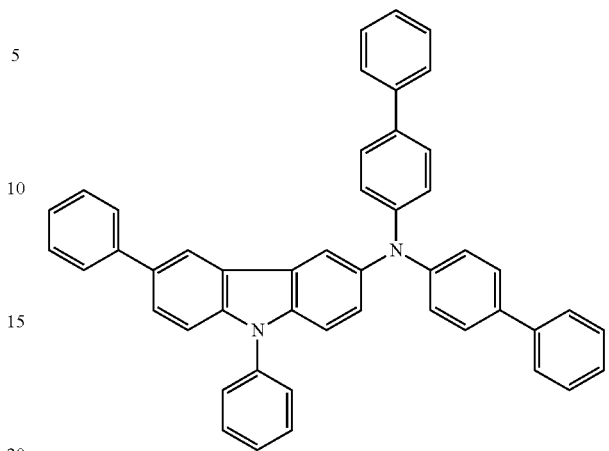
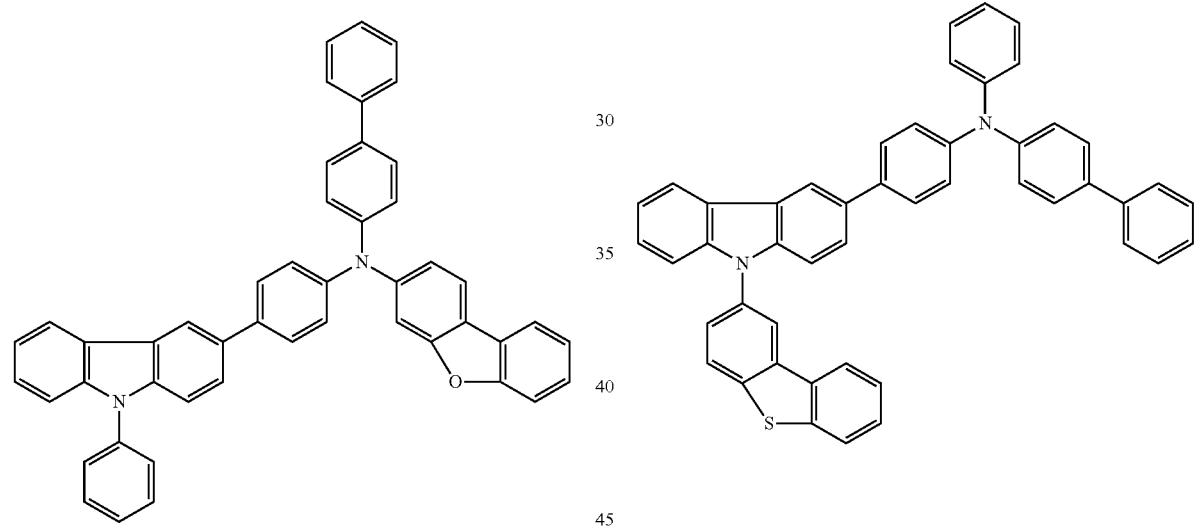
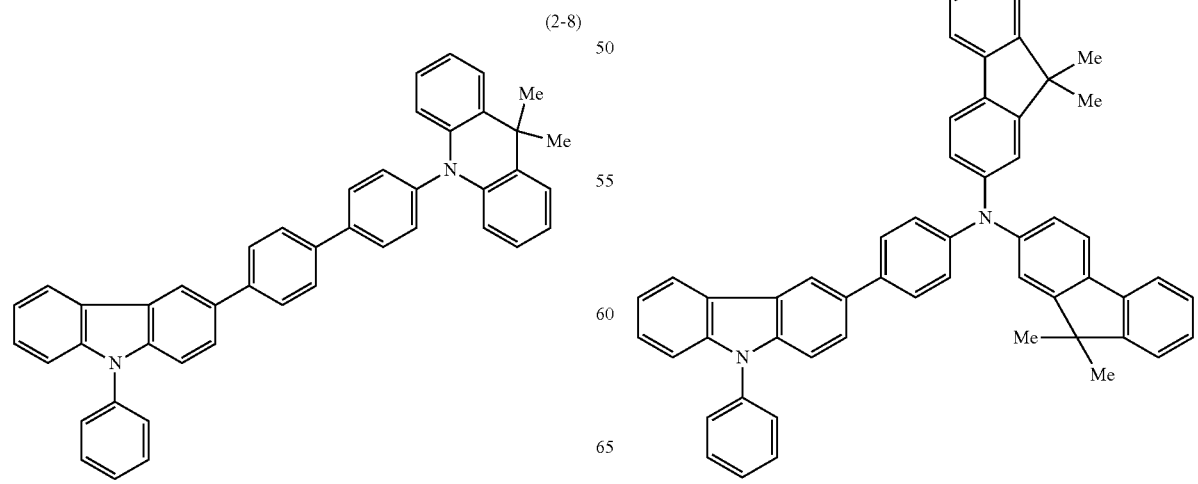

(2-12)
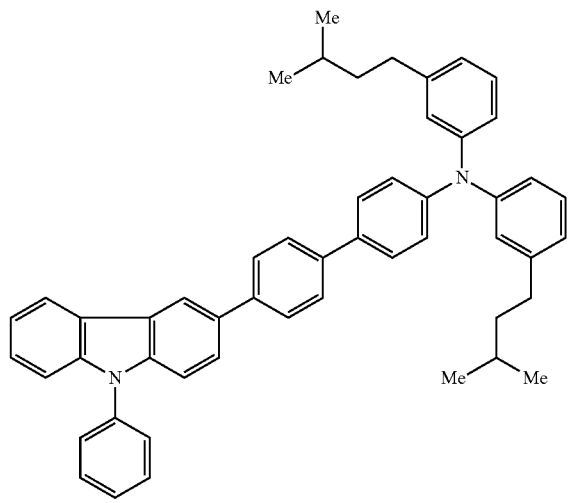
(2-13)
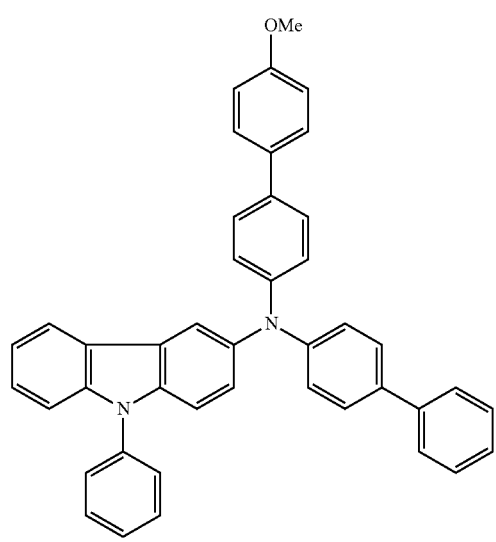
(2-14)
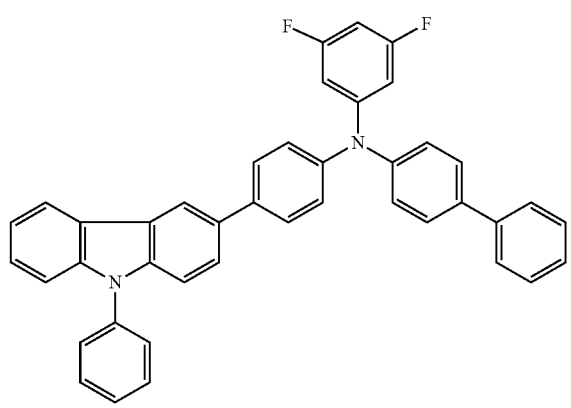
(2-15)
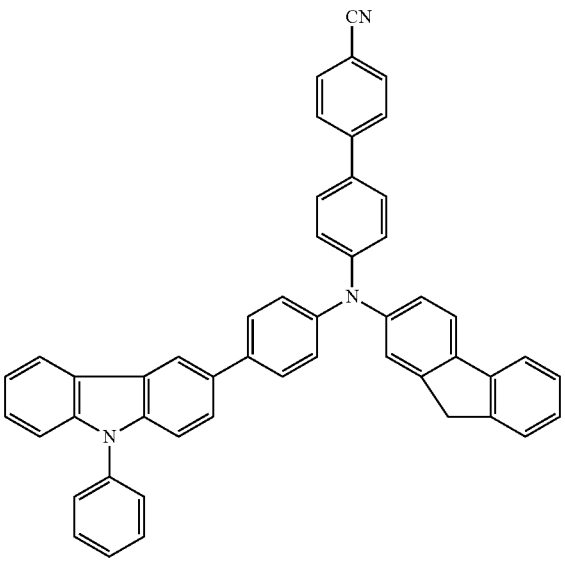
(2-16)
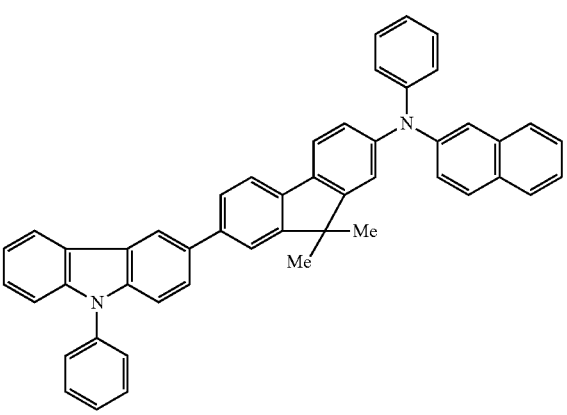
(2-17)
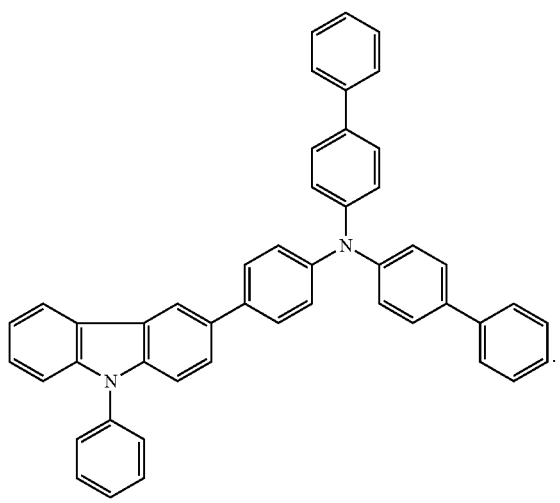
5. The organic electroluminescent device of claim 1, wherein the emission layer comprises a compound represented by Formula 3:

[Formula 3]

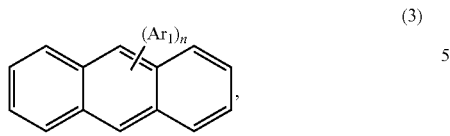

(3)

wherein each $Ar_1$ is independently selected from hydrogen, deuterium, a substituted or unsubstituted alkyl group having 1 to 50 carbon atoms, a substituted or unsubstituted cycloalkyl group having 3 to 50 carbon atoms for forming a ring, a substituted or unsubstituted alkoxy group having 1 to 50 carbon atoms, a substituted or unsubstituted aralkyl group having 7 to 50 carbon atoms, a substituted or unsubstituted aryloxy group having 6 to 50 carbon atoms for forming a ring, a substituted or unsubstituted arylthio group having 6 to 50 carbon atoms for forming a ring, a substituted or unsubstituted alkoxycarbonyl group having 2 to 50 carbon atoms, a substituted or unsubstituted aryl group having 6 to 50 carbon atoms for forming a ring, a substituted or unsubstituted heteroaryl group having 5 to 50 carbon atoms for forming a ring, a substituted or unsubstituted silyl group, a carboxyl group, a halogen atom, a cyano group, a nitro group, and a hydroxyl group, and n is an integer selected from 1 to 10.

* * * * *